(12) United States Patent
DeBaun et al.

(10) Patent No.: US 10,263,473 B2
(45) Date of Patent: Apr. 16, 2019

(54) CONTROLLING WIRELESS POWER TRANSFER SYSTEMS

(71) Applicant: WiTricity Corporation, Watertown, MA (US)

(72) Inventors: David R. DeBaun, Woburn, MA (US); Andre B. Kurs, Chestnut Hill, MA (US)

(73) Assignee: WiTricity Corporation, Watertown, MA (US)

( * ) Notice: Subject to any disclaimer, the term of this patent is extended or adjusted under 35 U.S.C. 154(b) by 164 days.

(21) Appl. No.: 15/422,554

(22) Filed: Feb. 2, 2017

(65) Prior Publication Data

US 2017/0217325 A1    Aug. 3, 2017

Related U.S. Application Data

(60) Provisional application No. 62/290,325, filed on Feb. 2, 2016, provisional application No. 62/379,618, filed on Aug. 25, 2016.

(51) Int. Cl.
*H02J 7/00* (2006.01)
*H02J 50/12* (2016.01)
(Continued)

(52) U.S. Cl.
CPC ............. *H02J 50/12* (2016.02); *B60L 11/182* (2013.01); *B60L 11/1831* (2013.01); *G05F 1/66* (2013.01);
(Continued)

(58) Field of Classification Search
CPC .................................. H02J 50/12; H02J 50/80
(Continued)

(56) References Cited

U.S. PATENT DOCUMENTS 645,576 A    3/1900 Tesla
649,621 A    5/1900 Tesla
(Continued)

FOREIGN PATENT DOCUMENTS

CA    142352    8/1912
CN    102239633    11/2011
(Continued)

OTHER PUBLICATIONS

"Intel CTO Says Gap between Humans, Machines Will Close by 2050", *Intel News Release*, (See Intel.com/ . . . /20080821comp. htm?iid=S . . . ) (Printed Nov. 6, 2009).
(Continued)

*Primary Examiner* — Suchin Parihar
(74) *Attorney, Agent, or Firm* — Fish & Richardson P.C.

(57) ABSTRACT

Methods, systems, and devices for operating wireless power transfer systems. One aspect features a wireless energy transfer system that includes a transmitter, and a receiver. The transmitter has a transmitter-IMN and is configured to perform operations including performing a first comparison between a characteristic of a power of the transmitter and a target power. Adjusting, based on the first comparison, a reactance of the transmitter-IMN to adjust the power of the transmitter. The receiver has a receiver-IMN and is configured to perform operations including determining an efficiency of the wireless energy transfer system at a second time based on power data from the transmitter. Performing a second comparison between the efficiency at the second time and an efficiency of the wireless energy transfer system at a first time, the first time being prior to the second time. Adjusting, based on the second comparison, a reactance of the receiver-IMN.

18 Claims, 10 Drawing Sheets

(51) Int. Cl.
  *H02J 50/80* (2016.01)
  *B60L 11/18* (2006.01)
  *H02M 3/24* (2006.01)
  *H03H 7/38* (2006.01)
  *H03H 7/40* (2006.01)
  *H04B 5/00* (2006.01)
  *G05F 1/66* (2006.01)

(52) U.S. Cl.
  CPC ............. *H02J 50/80* (2016.02); *H02M 3/24* (2013.01); *H03H 7/38* (2013.01); *H03H 7/40* (2013.01); *H04B 5/0037* (2013.01); *H04B 5/0075* (2013.01)

(58) Field of Classification Search
  USPC ........................................................ 320/108
  See application file for complete search history.

(56) References Cited

U.S. PATENT DOCUMENTS

| | | |
|---|---|---|
| 787,412 A | 4/1905 | Tesla |
| 1,119,732 A | 12/1914 | Tesla |
| 2,133,494 A | 10/1938 | Waters |
| 3,517,350 A | 6/1970 | Beaver |
| 3,535,543 A | 10/1970 | Dailey |
| 3,780,425 A | 12/1973 | Penn et al. |
| 3,871,176 A | 3/1975 | Schukei |
| 4,088,999 A | 5/1978 | Fletcher et al. |
| 4,095,998 A | 6/1978 | Hanson |
| 4,180,795 A | 12/1979 | Matsuda et al. |
| 4,280,129 A | 7/1981 | Wells |
| 4,450,431 A | 5/1984 | Hochstein |
| 4,588,978 A | 5/1986 | Allen |
| 5,027,709 A | 7/1991 | Slagle |
| 5,033,295 A | 7/1991 | Schmid et al. |
| 5,034,658 A | 7/1991 | Hiering et al. |
| 5,053,774 A | 10/1991 | Schuermann et al. |
| 5,070,293 A | 12/1991 | Ishii et al. |
| 5,118,997 A | 6/1992 | El-Hamamsy |
| 5,216,402 A | 6/1993 | Carosa |
| 5,229,652 A | 7/1993 | Hough |
| 5,287,112 A | 2/1994 | Schuermann |
| 5,341,083 A | 8/1994 | Klontz et al. |
| 5,367,242 A | 11/1994 | Hulman |
| 5,374,930 A | 12/1994 | Schuermann |
| 5,408,209 A | 4/1995 | Tanzer et al. |
| 5,437,057 A | 7/1995 | Richley et al. |
| 5,455,467 A | 10/1995 | Young et al. |
| 5,493,691 A | 2/1996 | Barrett |
| 5,522,856 A | 6/1996 | Reineman |
| 5,528,113 A | 6/1996 | Boys et al. |
| 5,541,604 A | 7/1996 | Meier |
| 5,550,452 A | 8/1996 | Shirai et al. |
| 5,565,763 A | 10/1996 | Arrendale et al. |
| 5,630,835 A | 5/1997 | Brownlee |
| 5,697,956 A | 12/1997 | Bornzin |
| 5,703,461 A | 12/1997 | Minoshima et al. |
| 5,703,573 A | 12/1997 | Fujimoto et al. |
| 5,710,413 A | 1/1998 | King et al. |
| 5,742,471 A | 4/1998 | Barbee, Jr. et al. |
| 5,821,728 A | 10/1998 | Sshwind |
| 5,821,731 A | 10/1998 | Kuki et al. |
| 5,864,323 A | 1/1999 | Berthon |
| 5,898,579 A | 4/1999 | Boys et al. |
| 5,903,134 A | 5/1999 | Takeuchi |
| 5,923,544 A | 7/1999 | Urano |
| 5,940,509 A | 8/1999 | Jovanovich et al. |
| 5,957,956 A | 9/1999 | Kroll et al. |
| 5,959,245 A | 9/1999 | Moe et al. |
| 5,986,895 A | 11/1999 | Stewart et al. |
| 5,993,996 A | 11/1999 | Firsich |
| 5,999,308 A | 12/1999 | Nelson et al. |
| 6,012,659 A | 1/2000 | Nakazawa et al. |
| 6,047,214 A | 4/2000 | Mueller et al. |
| 6,066,163 A | 5/2000 | John |
| 6,067,473 A | 5/2000 | Greeninger et al. |
| 6,108,579 A | 8/2000 | Snell et al. |
| 6,127,799 A | 10/2000 | Krishnan |
| 6,176,433 B1 | 1/2001 | Uesaka et al. |
| 6,184,651 B1 | 2/2001 | Fernandez et al. |
| 6,207,887 B1 | 3/2001 | Bass et al. |
| 6,232,841 B1 | 5/2001 | Bartlett et al. |
| 6,238,387 B1 | 5/2001 | Miller, III |
| 6,252,762 B1 | 6/2001 | Amatucci |
| 6,436,299 B1 | 8/2002 | Baarman et al. |
| 6,450,946 B1 | 9/2002 | Forsell |
| 6,452,465 B1 | 9/2002 | Brown et al. |
| 6,459,218 B2 | 10/2002 | Boys et al. |
| 6,473,028 B1 | 10/2002 | Luc |
| 6,483,202 B1 | 11/2002 | Boys |
| 6,515,878 B1 | 2/2003 | Meins et al. |
| 6,535,133 B2 | 3/2003 | Gohara |
| 6,561,975 B1 | 5/2003 | Pool et al. |
| 6,563,425 B2 | 5/2003 | Nicholson et al. |
| 6,597,076 B2 | 7/2003 | Scheible et al. |
| 6,609,023 B1 | 8/2003 | Fischell et al. |
| 6,631,072 B1 | 10/2003 | Paul et al. |
| 6,650,227 B1 | 11/2003 | Bradin |
| 6,664,770 B1 | 12/2003 | Bartels |
| 6,673,250 B2 | 1/2004 | Kuennen et al. |
| 6,683,256 B2 | 1/2004 | Kao |
| 6,696,647 B2 | 2/2004 | Ono et al. |
| 6,703,921 B1 | 3/2004 | Wuidart et al. |
| 6,731,071 B2 | 5/2004 | Baarman |
| 6,749,119 B2 | 6/2004 | Scheible et al. |
| 6,772,011 B2 | 8/2004 | Dolgin |
| 6,798,716 B1 | 9/2004 | Charych |
| 6,803,744 B1 | 10/2004 | Sabo |
| 6,806,649 B2 | 10/2004 | Mollema et al. |
| 6,812,645 B2 | 11/2004 | Baarman |
| 6,825,620 B2 | 11/2004 | Kuennen et al. |
| 6,831,417 B2 | 12/2004 | Baarman |
| 6,839,035 B1 | 1/2005 | Addonisio et al. |
| 6,844,702 B2 | 1/2005 | Giannopoulos et al. |
| 6,856,291 B2 | 2/2005 | Mickle et al. |
| 6,858,970 B2 | 2/2005 | Malkin et al. |
| 6,906,495 B2 | 6/2005 | Cheng et al. |
| 6,917,163 B2 | 7/2005 | Baarman |
| 6,917,431 B2 | 7/2005 | Soljacic et al. |
| 6,937,130 B2 | 8/2005 | Scheible et al. |
| 6,960,968 B2 | 11/2005 | Odendaal et al. |
| 6,961,619 B2 | 11/2005 | Casey |
| 6,967,462 B1 * | 11/2005 | Landis ................. H02J 17/00 320/101 |
| 6,975,198 B2 | 12/2005 | Baarman |
| 6,988,026 B2 | 1/2006 | Breed et al. |
| 7,027,311 B2 | 4/2006 | Vanderelli et al. |
| 7,035,076 B1 | 4/2006 | Stevenson |
| 7,042,196 B2 | 5/2006 | Ka-Lai et al. |
| 7,069,064 B2 | 6/2006 | Govorgian et al. |
| 7,084,605 B2 | 8/2006 | Mickle et al. |
| 7,116,200 B2 | 10/2006 | Baarman et al. |
| 7,118,240 B2 | 10/2006 | Baarman et al. |
| 7,126,450 B2 | 10/2006 | Baarman et al. |
| 7,127,293 B2 | 10/2006 | MacDonald |
| 7,132,918 B2 | 11/2006 | Baarman et al. |
| 7,147,604 B1 | 12/2006 | Allen et al. |
| 7,180,248 B2 | 2/2007 | Kuennen et al. |
| 7,191,007 B2 | 3/2007 | Desai et al. |
| 7,193,418 B2 | 3/2007 | Freytag |
| D541,322 S | 4/2007 | Garrett et al. |
| 7,212,414 B2 | 5/2007 | Baarman |
| 7,233,137 B2 | 6/2007 | Nakamura et al. |
| D545,855 S | 7/2007 | Garrett et al. |
| 7,239,110 B2 | 7/2007 | Cheng et al. |
| 7,248,017 B2 | 7/2007 | Cheng et al. |
| 7,251,527 B2 | 7/2007 | Lyden |
| 7,288,918 B2 | 10/2007 | DiStefano |
| 7,340,304 B2 | 3/2008 | MacDonald |
| 7,375,492 B2 | 5/2008 | Calhoon et al. |
| 7,375,493 B2 | 5/2008 | Calhoon et al. |
| 7,378,817 B2 | 5/2008 | Calhoon et al. |
| 7,382,636 B2 | 6/2008 | Baarman et al. |

(56) References Cited

U.S. PATENT DOCUMENTS

| | | |
|---|---|---|
| 7,385,357 B2 | 6/2008 | Kuennen et al. |
| 7,443,135 B2 | 10/2008 | Cho |
| 7,462,951 B1 | 12/2008 | Baarman |
| 7,466,213 B2 | 12/2008 | Lobl et al. |
| 7,471,062 B2 | 12/2008 | Bruning |
| 7,474,058 B2 | 1/2009 | Baarman |
| 7,492,247 B2 | 2/2009 | Schmidt et al. |
| 7,514,818 B2 | 4/2009 | Abe et al. |
| 7,518,267 B2 | 4/2009 | Baarman |
| 7,521,890 B2 | 4/2009 | Lee et al. |
| 7,525,283 B2 | 4/2009 | Cheng et al. |
| 7,545,337 B2 | 6/2009 | Guenther |
| 7,554,316 B2 | 6/2009 | Stevens et al. |
| 7,599,743 B2 | 10/2009 | Hassler, Jr. et al. |
| 7,615,936 B2 | 11/2009 | Baarman et al. |
| 7,639,514 B2 | 12/2009 | Baarman |
| 7,741,734 B2 | 6/2010 | Joannopoulos et al. |
| 7,795,708 B2 | 9/2010 | Katti |
| 7,825,543 B2 | 11/2010 | Karalis et al. |
| 7,825,544 B2 | 11/2010 | Jansen et al. |
| 7,835,417 B2 | 11/2010 | Heideman et al. |
| 7,843,288 B2 | 11/2010 | Lee et al. |
| 7,844,306 B2 | 11/2010 | Shearer et al. |
| 7,863,859 B2 | 1/2011 | Soar |
| 7,880,337 B2 | 2/2011 | Farkas |
| 7,884,697 B2 | 2/2011 | Wei et al. |
| 7,885,050 B2 | 2/2011 | Lee |
| 7,919,886 B2 | 4/2011 | Tanaka |
| 7,923,870 B2 | 4/2011 | Jin |
| 7,932,798 B2 | 4/2011 | Tolle et al. |
| 7,948,209 B2 | 5/2011 | Jung |
| 7,952,322 B2 | 5/2011 | Partovi et al. |
| 7,963,941 B2 | 6/2011 | Wilk |
| 7,969,045 B2 | 6/2011 | Schmidt et al. |
| 7,994,880 B2 | 8/2011 | Chen et al. |
| 7,999,506 B1 | 8/2011 | Hollar et al. |
| 8,022,576 B2 | 9/2011 | Joannopoulos et al. |
| 8,035,255 B2 | 10/2011 | Kurs et al. |
| 8,076,800 B2 | 12/2011 | Joannopoulos et al. |
| 8,076,801 B2 | 12/2011 | Karalis et al. |
| 8,084,889 B2 | 12/2011 | Joannopoulos et al. |
| 8,097,983 B2 | 1/2012 | Karalis et al. |
| 8,106,539 B2 | 1/2012 | Schatz et al. |
| 8,115,448 B2 | 2/2012 | John |
| 8,131,378 B2 | 3/2012 | Greenberg et al. |
| 8,178,995 B2 | 5/2012 | Amano et al. |
| 8,193,769 B2 | 6/2012 | Azancot et al. |
| 8,212,414 B2 | 7/2012 | Howard et al. |
| 8,260,200 B2 | 9/2012 | Shimizu et al. |
| 8,304,935 B2 | 11/2012 | Karalis et al. |
| 8,324,759 B2 | 12/2012 | Karalis et al. |
| 8,334,620 B2 | 12/2012 | Park et al. |
| 8,362,651 B2 | 1/2013 | Hamam et al. |
| 8,395,282 B2 | 3/2013 | Joannopoulos et al. |
| 8,395,283 B2 | 3/2013 | Joannopoulos et al. |
| 8,400,017 B2 | 3/2013 | Kurs et al. |
| 8,400,018 B2 | 3/2013 | Joannopoulos et al. |
| 8,400,019 B2 | 3/2013 | Joannopoulos et al. |
| 8,400,020 B2 | 3/2013 | Joannopoulos et al. |
| 8,400,021 B2 | 3/2013 | Joannopoulos et al. |
| 8,400,022 B2 | 3/2013 | Joannopoulos et al. |
| 8,400,023 B2 | 3/2013 | Joannopoulos et al. |
| 8,400,024 B2 | 3/2013 | Joannopoulos et al. |
| 8,410,636 B2 | 4/2013 | Kurs et al. |
| 8,441,154 B2 | 5/2013 | Karalis et al. |
| 8,457,547 B2 | 6/2013 | Meskens |
| 8,457,656 B2 * | 6/2013 | Perkins ............... G01S 5/0257 340/686.6 |
| 8,461,719 B2 | 6/2013 | Kesler et al. |
| 8,461,720 B2 | 6/2013 | Kurs et al. |
| 8,461,721 B2 | 6/2013 | Karalis et al. |
| 8,461,722 B2 | 6/2013 | Kurs et al. |
| 8,461,817 B2 | 6/2013 | Martin et al. |
| 8,466,583 B2 | 6/2013 | Karalis et al. |
| 8,471,410 B2 | 6/2013 | Karalis et al. |
| 8,476,788 B2 | 7/2013 | Karalis et al. |
| 8,482,157 B2 | 7/2013 | Cook et al. |
| 8,482,158 B2 | 7/2013 | Kurs et al. |
| 8,487,480 B1 | 7/2013 | Kesler et al. |
| 8,497,601 B2 | 7/2013 | Hall et al. |
| 8,552,592 B2 | 10/2013 | Schatz et al. |
| 8,569,914 B2 | 10/2013 | Karalis et al. |
| 8,587,153 B2 | 11/2013 | Schatz et al. |
| 8,587,155 B2 | 11/2013 | Giler et al. |
| 8,598,743 B2 | 12/2013 | Hall et al. |
| 8,618,696 B2 | 12/2013 | Karalis et al. |
| 8,629,578 B2 | 1/2014 | Kurs et al. |
| 8,643,326 B2 | 2/2014 | Campanella et al. |
| 9,124,125 B2 * | 9/2015 | Leabman ............... H02J 7/025 |
| 2002/0032471 A1 | 3/2002 | Loftin et al. |
| 2002/0105343 A1 | 8/2002 | Scheible et al. |
| 2002/0118004 A1 | 8/2002 | Scheible et al. |
| 2002/0130642 A1 | 9/2002 | Ettes et al. |
| 2002/0167294 A1 | 11/2002 | Odaohhara |
| 2003/0038641 A1 | 2/2003 | Scheible |
| 2003/0062794 A1 | 4/2003 | Scheible et al. |
| 2003/0062980 A1 | 4/2003 | Scheible et al. |
| 2003/0071034 A1 | 4/2003 | Thompson et al. |
| 2003/0124050 A1 | 7/2003 | Yadav et al. |
| 2003/0126948 A1 | 7/2003 | Yadav et al. |
| 2003/0160590 A1 | 8/2003 | Schaefer et al. |
| 2003/0199778 A1 | 10/2003 | Mickle et al. |
| 2003/0214255 A1 | 11/2003 | Baarman et al. |
| 2004/0000974 A1 | 1/2004 | Odenaal et al. |
| 2004/0026998 A1 | 2/2004 | Henriott et al. |
| 2004/0100338 A1 | 5/2004 | Clark |
| 2004/0113847 A1 | 6/2004 | Qi et al. |
| 2004/0130425 A1 | 7/2004 | Dayan et al. |
| 2004/0130915 A1 | 7/2004 | Baarman |
| 2004/0130916 A1 | 7/2004 | Baarman |
| 2004/0142733 A1 | 7/2004 | Parise |
| 2004/0150934 A1 | 8/2004 | Baarman |
| 2004/0189246 A1 | 9/2004 | Bulai et al. |
| 2004/0201361 A1 | 10/2004 | Koh et al. |
| 2004/0222751 A1 | 11/2004 | Mollema et al. |
| 2004/0227057 A1 | 11/2004 | Tuominen et al. |
| 2004/0232845 A1 | 11/2004 | Baarman |
| 2004/0233043 A1 | 11/2004 | Yazawa et al. |
| 2004/0267501 A1 | 12/2004 | Freed et al. |
| 2005/0007067 A1 | 1/2005 | Baarman et al. |
| 2005/0021134 A1 | 1/2005 | Opie |
| 2005/0027192 A1 | 2/2005 | Govari et al. |
| 2005/0033382 A1 | 2/2005 | Single |
| 2005/0085873 A1 | 4/2005 | Gord et al. |
| 2005/0093475 A1 | 5/2005 | Kuennen et al. |
| 2005/0104064 A1 | 5/2005 | Hegarty et al. |
| 2005/0104453 A1 | 5/2005 | Vanderelli et al. |
| 2005/0116650 A1 | 6/2005 | Baarman |
| 2005/0116683 A1 | 6/2005 | Cheng et al. |
| 2005/0122058 A1 | 6/2005 | Baarman et al. |
| 2005/0122059 A1 | 6/2005 | Baarman et al. |
| 2005/0125093 A1 | 6/2005 | Kikuchi et al. |
| 2005/0127849 A1 | 6/2005 | Baarman et al. |
| 2005/0127850 A1 | 6/2005 | Baarman et al. |
| 2005/0127866 A1 | 6/2005 | Hamilton et al. |
| 2005/0135122 A1 | 6/2005 | Cheng et al. |
| 2005/0140482 A1 | 6/2005 | Cheng et al. |
| 2005/0151511 A1 | 7/2005 | Chary |
| 2005/0156560 A1 | 7/2005 | Shimaoka et al. |
| 2005/0189945 A1 | 9/2005 | Reiderman |
| 2005/0194926 A1 | 9/2005 | DiStefano |
| 2005/0253152 A1 | 11/2005 | Klimov et al. |
| 2005/0288739 A1 | 12/2005 | Hassler, Jr. et al. |
| 2005/0288740 A1 | 12/2005 | Hassler, Jr. et al. |
| 2005/0288741 A1 | 12/2005 | Hassler, Jr. et al. |
| 2005/0288742 A1 | 12/2005 | Giordano et al. |
| 2006/0001509 A1 | 1/2006 | Gibbs |
| 2006/0010902 A1 | 1/2006 | Trinh et al. |
| 2006/0022636 A1 | 2/2006 | Xian et al. |
| 2006/0053296 A1 | 3/2006 | Busboom et al. |
| 2006/0061323 A1 | 3/2006 | Cheng et al. |
| 2006/0066443 A1 | 3/2006 | Hall |
| 2006/0090956 A1 | 5/2006 | Peshkovskiy et al. |
| 2006/0132045 A1 | 6/2006 | Baarman |

(56) References Cited

U.S. PATENT DOCUMENTS

| | | |
|---|---|---|
| 2006/0164866 A1 | 7/2006 | Vanderelli et al. |
| 2006/0181242 A1 | 8/2006 | Freed et al. |
| 2006/0184209 A1 | 8/2006 | John et al. |
| 2006/0184210 A1 | 8/2006 | Singhal et al. |
| 2006/0185809 A1 | 8/2006 | Elfrink et al. |
| 2006/0199620 A1 | 9/2006 | Greene et al. |
| 2006/0202665 A1 | 9/2006 | Hsu |
| 2006/0205381 A1 | 9/2006 | Beart et al. |
| 2006/0214626 A1 | 9/2006 | Nilson et al. |
| 2006/0219448 A1 | 10/2006 | Grieve et al. |
| 2006/0238365 A1 | 10/2006 | Vecchione et al. |
| 2006/0270440 A1 | 11/2006 | Shearer et al. |
| 2006/0281435 A1 | 12/2006 | Shearer et al. |
| 2007/0010295 A1 | 1/2007 | Greene et al. |
| 2007/0013483 A1 | 1/2007 | Stewart |
| 2007/0016089 A1 | 1/2007 | Fischell et al. |
| 2007/0021140 A1 | 1/2007 | Keyes, IV et al. |
| 2007/0024246 A1 | 2/2007 | Flaugher |
| 2007/0064406 A1 | 3/2007 | Heart |
| 2007/0069687 A1 | 3/2007 | Suzuki |
| 2007/0096875 A1 | 5/2007 | Waterhouse et al. |
| 2007/0105429 A1 | 5/2007 | Kohl et al. |
| 2007/0117596 A1 | 5/2007 | Greene et al. |
| 2007/0126650 A1 | 6/2007 | Guenther |
| 2007/0145830 A1 | 6/2007 | Lee et al. |
| 2007/0164839 A1 | 7/2007 | Naito |
| 2007/0171681 A1 | 7/2007 | Baarman |
| 2007/0176840 A1 | 8/2007 | Pristas et al. |
| 2007/0178945 A1 | 8/2007 | Cook et al. |
| 2007/0182367 A1 | 8/2007 | Partovi |
| 2007/0208263 A1 | 9/2007 | John et al. |
| 2007/0222542 A1 | 9/2007 | Joannopoulos et al. |
| 2007/0257636 A1 | 11/2007 | Phillips et al. |
| 2007/0267918 A1 | 11/2007 | Gyland |
| 2007/0276538 A1 | 11/2007 | Kjellsson et al. |
| 2008/0012569 A1 | 1/2008 | Hall et al. |
| 2008/0014897 A1 | 1/2008 | Cook et al. |
| 2008/0030415 A1 | 2/2008 | Homan et al. |
| 2008/0036588 A1 | 2/2008 | Iverson et al. |
| 2008/0047727 A1 | 2/2008 | Sexton et al. |
| 2008/0051854 A1 | 2/2008 | Bulkes et al. |
| 2008/0067874 A1 | 3/2008 | Tseng |
| 2008/0132909 A1 | 6/2008 | Jascob et al. |
| 2008/0154331 A1 | 6/2008 | John et al. |
| 2008/0176521 A1 | 7/2008 | Singh et al. |
| 2008/0191638 A1 | 8/2008 | Kuennen et al. |
| 2008/0197710 A1 | 8/2008 | Kreitz et al. |
| 2008/0197802 A1 | 8/2008 | Onishi et al. |
| 2008/0211320 A1 | 9/2008 | Cook et al. |
| 2008/0238364 A1 | 10/2008 | Weber et al. |
| 2008/0255901 A1 | 10/2008 | Carroll et al. |
| 2008/0265684 A1 | 10/2008 | Farkas |
| 2008/0266748 A1 | 10/2008 | Lee |
| 2008/0272860 A1 | 11/2008 | Pance |
| 2008/0273242 A1 | 11/2008 | Woodgate et al. |
| 2008/0278264 A1 | 11/2008 | Karalis et al. |
| 2008/0291277 A1 | 11/2008 | Jacobsen et al. |
| 2008/0300657 A1 | 12/2008 | Stultz |
| 2008/0300660 A1 | 12/2008 | John |
| 2009/0010028 A1 | 1/2009 | Baarmen et al. |
| 2009/0015075 A1 | 1/2009 | Cook et al. |
| 2009/0033280 A1 | 2/2009 | Choi et al. |
| 2009/0033564 A1 | 2/2009 | Cook et al. |
| 2009/0038623 A1 | 2/2009 | Farbarik et al. |
| 2009/0045772 A1 | 2/2009 | Cook et al. |
| 2009/0051224 A1 | 2/2009 | Cook et al. |
| 2009/0058189 A1 | 3/2009 | Cook et al. |
| 2009/0058361 A1 | 3/2009 | John |
| 2009/0067198 A1 | 3/2009 | Graham et al. |
| 2009/0072627 A1 | 3/2009 | Cook et al. |
| 2009/0072628 A1 | 3/2009 | Cook et al. |
| 2009/0072629 A1 | 3/2009 | Cook et al. |
| 2009/0072782 A1 | 3/2009 | Randall |
| 2009/0079268 A1 | 3/2009 | Cook et al. |
| 2009/0079387 A1 | 3/2009 | Jin et al. |
| 2009/0085408 A1 | 4/2009 | Bruhn |
| 2009/0085706 A1 | 4/2009 | Baarman et al. |
| 2009/0096413 A1 | 4/2009 | Patovi et al. |
| 2009/0102292 A1 | 4/2009 | Cook et al. |
| 2009/0108679 A1 | 4/2009 | Porwal |
| 2009/0108997 A1 | 4/2009 | Patterson et al. |
| 2009/0115628 A1 | 5/2009 | Dicks et al. |
| 2009/0127937 A1 | 5/2009 | Widmer et al. |
| 2009/0134712 A1 | 5/2009 | Cook et al. |
| 2009/0146892 A1 | 6/2009 | Shimizu et al. |
| 2009/0153273 A1 | 6/2009 | Chen |
| 2009/0160261 A1 | 6/2009 | Elo |
| 2009/0161078 A1 | 6/2009 | Wu et al. |
| 2009/0167449 A1 | 7/2009 | Cook et al. |
| 2009/0174263 A1 | 7/2009 | Baarman et al. |
| 2009/0179502 A1 | 7/2009 | Cook et al. |
| 2009/0188396 A1 | 7/2009 | Hofmann et al. |
| 2009/0189458 A1 | 7/2009 | Kawasaki |
| 2009/0195332 A1 | 8/2009 | Joannopoulos et al. |
| 2009/0195333 A1 | 8/2009 | Joannopoulos et al. |
| 2009/0212636 A1 | 8/2009 | Cook et al. |
| 2009/0213028 A1 | 8/2009 | Cook et al. |
| 2009/0218884 A1 | 9/2009 | Soar |
| 2009/0224608 A1 | 9/2009 | Cook et al. |
| 2009/0224609 A1 | 9/2009 | Cook et al. |
| 2009/0224723 A1 | 9/2009 | Tanabe |
| 2009/0224856 A1 | 9/2009 | Karalis et al. |
| 2009/0230777 A1 | 9/2009 | Baarman et al. |
| 2009/0237194 A1 | 9/2009 | Waffenschmidt et al. |
| 2009/0243394 A1 | 10/2009 | Levine |
| 2009/0243397 A1 | 10/2009 | Cook et al. |
| 2009/0251008 A1 | 10/2009 | Sugaya |
| 2009/0261778 A1 | 10/2009 | Kook |
| 2009/0267558 A1 | 10/2009 | Jung |
| 2009/0267709 A1 | 10/2009 | Joannopoulos et al. |
| 2009/0267710 A1 | 10/2009 | Joannopoulos et al. |
| 2009/0271047 A1 | 10/2009 | Wakamatsu |
| 2009/0271048 A1 | 10/2009 | Wakamatsu |
| 2009/0273242 A1 | 11/2009 | Cook |
| 2009/0273318 A1 | 11/2009 | Rondoni et al. |
| 2009/0281678 A1 | 11/2009 | Wakamatsu |
| 2009/0284082 A1 | 11/2009 | Mohammadian |
| 2009/0284083 A1 | 11/2009 | Karalis et al. |
| 2009/0284218 A1 | 11/2009 | Mohammadian et al. |
| 2009/0284220 A1 | 11/2009 | Toncich et al. |
| 2009/0284227 A1 | 11/2009 | Mohammadian et al. |
| 2009/0284245 A1 | 11/2009 | Kirby et al. |
| 2009/0284369 A1 | 11/2009 | Toncich et al. |
| 2009/0286470 A1 | 11/2009 | Mohammadian et al. |
| 2009/0286475 A1 | 11/2009 | Toncich et al. |
| 2009/0286476 A1 | 11/2009 | Toncich et al. |
| 2009/0289595 A1 | 11/2009 | Chen et al. |
| 2009/0299918 A1 | 12/2009 | Cook et al. |
| 2009/0308933 A1 | 12/2009 | Osada |
| 2009/0322158 A1 | 12/2009 | Stevens et al. |
| 2009/0322280 A1 | 12/2009 | Kamijo et al. |
| 2010/0015918 A1 | 1/2010 | Liu et al. |
| 2010/0017249 A1 | 1/2010 | Fincham et al. |
| 2010/0033021 A1 | 2/2010 | Bennett |
| 2010/0034238 A1 | 2/2010 | Bennett |
| 2010/0036773 A1 | 2/2010 | Bennett |
| 2010/0038970 A1 | 2/2010 | Cook et al. |
| 2010/0045114 A1 | 2/2010 | Sample et al. |
| 2010/0052431 A1 | 3/2010 | Mita |
| 2010/0052811 A1 | 3/2010 | Smith et al. |
| 2010/0060077 A1 | 3/2010 | Paulus et al. |
| 2010/0065352 A1 | 3/2010 | Ichikawa |
| 2010/0066349 A1 | 3/2010 | Lin et al. |
| 2010/0076524 A1 | 3/2010 | Forsberg et al. |
| 2010/0081379 A1 | 4/2010 | Cooper et al. |
| 2010/0094381 A1 | 4/2010 | Kim et al. |
| 2010/0096934 A1 | 4/2010 | Joannopoulos et al. |
| 2010/0102639 A1 | 4/2010 | Joannopoulos et al. |
| 2010/0102640 A1 | 4/2010 | Joannopoulos et al. |
| 2010/0102641 A1 | 4/2010 | Joannopoulos et al. |
| 2010/0104031 A1 | 4/2010 | Lacour |
| 2010/0109443 A1 | 5/2010 | Cook et al. |
| 2010/0109445 A1 | 5/2010 | Kurs et al. |
| 2010/0109604 A1 | 5/2010 | Boys et al. |

(56) References Cited

U.S. PATENT DOCUMENTS

| | | |
|---|---|---|
| 2010/0115474 A1 | 5/2010 | Takada et al. |
| 2010/0117454 A1 | 5/2010 | Cook et al. |
| 2010/0117455 A1 | 5/2010 | Joannopoulos et al. |
| 2010/0117456 A1 | 5/2010 | Karalis et al. |
| 2010/0117596 A1 | 5/2010 | Cook et al. |
| 2010/0123353 A1 | 5/2010 | Joannopoulos et al. |
| 2010/0123354 A1 | 5/2010 | Joannopoulos et al. |
| 2010/0123355 A1 | 5/2010 | Joannopoulos et al. |
| 2010/0123452 A1 | 5/2010 | Amano et al. |
| 2010/0123530 A1 | 5/2010 | Park et al. |
| 2010/0127573 A1 | 5/2010 | Joannopoulos et al. |
| 2010/0127574 A1 | 5/2010 | Joannopoulos et al. |
| 2010/0127575 A1 | 5/2010 | Joannopoulos et al. |
| 2010/0127660 A1 | 5/2010 | Cook et al. |
| 2010/0133918 A1 | 6/2010 | Joannopoulos et al. |
| 2010/0133919 A1 | 6/2010 | Joannopoulos et al. |
| 2010/0133920 A1 | 6/2010 | Joannopoulos et al. |
| 2010/0141042 A1 | 6/2010 | Kesler et al. |
| 2010/0148589 A1 | 6/2010 | Hamam et al. |
| 2010/0148723 A1 | 6/2010 | Cook et al. |
| 2010/0151808 A1 | 6/2010 | Toncich et al. |
| 2010/0156346 A1 | 6/2010 | Takada et al. |
| 2010/0156355 A1 | 6/2010 | Bauerle et al. |
| 2010/0156570 A1 | 6/2010 | Hong et al. |
| 2010/0164295 A1 | 7/2010 | Ichikawa et al. |
| 2010/0164296 A1 | 7/2010 | Kurs |
| 2010/0164297 A1 | 7/2010 | Kurs et al. |
| 2010/0164298 A1 | 7/2010 | Karalis et al. |
| 2010/0171368 A1 | 7/2010 | Schatz et al. |
| 2010/0171370 A1 | 7/2010 | Karalis et al. |
| 2010/0179384 A1 | 7/2010 | Hoeg et al. |
| 2010/0181843 A1 | 7/2010 | Schatz et al. |
| 2010/0181844 A1 | 7/2010 | Karalis et al. |
| 2010/0181845 A1 | 7/2010 | Fiorello et al. |
| 2010/0181961 A1 | 7/2010 | Novak et al. |
| 2010/0181964 A1 | 7/2010 | Huggins et al. |
| 2010/0184371 A1 | 7/2010 | Cook et al. |
| 2010/0187911 A1 | 7/2010 | Joannopoulos et al. |
| 2010/0187913 A1 | 7/2010 | Smith et al. |
| 2010/0188183 A1 | 7/2010 | Shpiro |
| 2010/0190435 A1 | 7/2010 | Cook et al. |
| 2010/0190436 A1 | 7/2010 | Cook et al. |
| 2010/0194206 A1 | 8/2010 | Burdo et al. |
| 2010/0194207 A1 | 8/2010 | Graham |
| 2010/0194334 A1 | 8/2010 | Kirby et al. |
| 2010/0194335 A1 | 8/2010 | Kirby et al. |
| 2010/0201189 A1 | 8/2010 | Kirby et al. |
| 2010/0201201 A1 | 8/2010 | Mobarhan et al. |
| 2010/0201202 A1 | 8/2010 | Kirby et al. |
| 2010/0201203 A1 | 8/2010 | Schatz et al. |
| 2010/0201204 A1 | 8/2010 | Sakoda et al. |
| 2010/0201205 A1 | 8/2010 | Karalis et al. |
| 2010/0201310 A1 | 8/2010 | Vorenkamp et al. |
| 2010/0201312 A1 | 8/2010 | Kirby et al. |
| 2010/0201313 A1 | 8/2010 | Vorenkamp et al. |
| 2010/0201316 A1 | 8/2010 | Takada et al. |
| 2010/0201513 A1 | 8/2010 | Vorenkamp et al. |
| 2010/0207458 A1 | 8/2010 | Joannopoulos et al. |
| 2010/0210233 A1 | 8/2010 | Cook et al. |
| 2010/0213770 A1 | 8/2010 | Kikuchi |
| 2010/0213895 A1 | 8/2010 | Keating et al. |
| 2010/0217553 A1 | 8/2010 | Von Novak et al. |
| 2010/0219694 A1 | 9/2010 | Kurs et al. |
| 2010/0219695 A1 | 9/2010 | Komiyama et al. |
| 2010/0219696 A1 | 9/2010 | Kojima |
| 2010/0222010 A1 | 9/2010 | Ozaki et al. |
| 2010/0225175 A1 | 9/2010 | Karalis et al. |
| 2010/0225270 A1 | 9/2010 | Jacobs et al. |
| 2010/0225271 A1 | 9/2010 | Oyobe et al. |
| 2010/0225272 A1 | 9/2010 | Kirby et al. |
| 2010/0231053 A1 | 9/2010 | Karalis et al. |
| 2010/0231163 A1 | 9/2010 | Mashinsky |
| 2010/0231340 A1 | 9/2010 | Fiorello et al. |
| 2010/0234922 A1 | 9/2010 | Forsell |
| 2010/0235006 A1 | 9/2010 | Brown |
| 2010/0237706 A1 | 9/2010 | Karalis et al. |
| 2010/0237707 A1 | 9/2010 | Karalis et al. |
| 2010/0237708 A1 | 9/2010 | Karalis et al. |
| 2010/0237709 A1 | 9/2010 | Hall et al. |
| 2010/0244576 A1 | 9/2010 | Hillan et al. |
| 2010/0244577 A1 | 9/2010 | Shimokawa |
| 2010/0244578 A1 | 9/2010 | Yoshikawa |
| 2010/0244579 A1 | 9/2010 | Sogabe et al. |
| 2010/0244580 A1 | 9/2010 | Uchida et al. |
| 2010/0244581 A1 | 9/2010 | Uchida |
| 2010/0244582 A1 | 9/2010 | Yoshikawa |
| 2010/0244583 A1 | 9/2010 | Shimokawa |
| 2010/0244767 A1 | 9/2010 | Turner et al. |
| 2010/0244839 A1 | 9/2010 | Yoshikawa |
| 2010/0248622 A1 | 9/2010 | Kirby et al. |
| 2010/0253152 A1 | 10/2010 | Karalis et al. |
| 2010/0253281 A1 | 10/2010 | Li |
| 2010/0256481 A1 | 10/2010 | Mareci et al. |
| 2010/0256831 A1 | 10/2010 | Abramo et al. |
| 2010/0259108 A1 | 10/2010 | Giler et al. |
| 2010/0259109 A1 | 10/2010 | Sato |
| 2010/0259110 A1 | 10/2010 | Kurs et al. |
| 2010/0264745 A1 | 10/2010 | Karalis et al. |
| 2010/0264746 A1 | 10/2010 | Kazama et al. |
| 2010/0264747 A1 | 10/2010 | Hall et al. |
| 2010/0276995 A1 | 11/2010 | Marzetta et al. |
| 2010/0277003 A1 | 11/2010 | Von Novak et al. |
| 2010/0277004 A1 | 11/2010 | Suzuki et al. |
| 2010/0277005 A1 | 11/2010 | Karalis et al. |
| 2010/0277120 A1 | 11/2010 | Cook et al. |
| 2010/0277121 A1 | 11/2010 | Hall et al. |
| 2010/0289341 A1 | 11/2010 | Ozaki et al. |
| 2010/0289449 A1 | 11/2010 | Elo |
| 2010/0295505 A1 | 11/2010 | Jung et al. |
| 2010/0295506 A1 | 11/2010 | Ichikawa |
| 2010/0308939 A1 | 12/2010 | Kurs |
| 2010/0314946 A1 | 12/2010 | Budde et al. |
| 2010/0327660 A1 | 12/2010 | Karalis et al. |
| 2010/0327661 A1 | 12/2010 | Karalis et al. |
| 2010/0328044 A1 | 12/2010 | Waffenschmidt et al. |
| 2011/0004269 A1 | 1/2011 | Strother et al. |
| 2011/0012431 A1 | 1/2011 | Karalis et al. |
| 2011/0018361 A1 | 1/2011 | Karalis et al. |
| 2011/0025131 A1 | 2/2011 | Karalis et al. |
| 2011/0031928 A1 | 2/2011 | Soar |
| 2011/0043046 A1 | 2/2011 | Joannopoulos et al. |
| 2011/0043047 A1 | 2/2011 | Karalis et al. |
| 2011/0043048 A1 | 2/2011 | Karalis et al. |
| 2011/0043049 A1 | 2/2011 | Karalis et al. |
| 2011/0049995 A1 | 3/2011 | Hashiguchi |
| 2011/0049996 A1 | 3/2011 | Karalis et al. |
| 2011/0049998 A1 | 3/2011 | Karalis et al. |
| 2011/0074218 A1 | 3/2011 | Karalis et al. |
| 2011/0074346 A1 | 3/2011 | Hall et al. |
| 2011/0074347 A1 | 3/2011 | Karalis et al. |
| 2011/0089895 A1 | 4/2011 | Karalis et al. |
| 2011/0095618 A1 | 4/2011 | Schatz et al. |
| 2011/0115303 A1 | 5/2011 | Baarman et al. |
| 2011/0115431 A1 | 5/2011 | Dunworth et al. |
| 2011/0121920 A1 | 5/2011 | Kurs et al. |
| 2011/0127843 A1 | 6/2011 | Karaoguz et al. |
| 2011/0128015 A1 | 6/2011 | Dorairaj et al. |
| 2011/0140544 A1 | 6/2011 | Karalis et al. |
| 2011/0148219 A1 | 6/2011 | Karalis et al. |
| 2011/0162895 A1 | 7/2011 | Karalis et al. |
| 2011/0169339 A1 | 7/2011 | Karalis et al. |
| 2011/0181122 A1 | 7/2011 | Karalis et al. |
| 2011/0193416 A1 | 8/2011 | Campanella et al. |
| 2011/0193419 A1 | 8/2011 | Karalis et al. |
| 2011/0198939 A1 | 8/2011 | Karalis et al. |
| 2011/0215086 A1 | 9/2011 | Yeh |
| 2011/0221278 A1 | 9/2011 | Karalis et al. |
| 2011/0227528 A1 | 9/2011 | Karalis et al. |
| 2011/0227530 A1 | 9/2011 | Karalis et al. |
| 2011/0241618 A1 | 10/2011 | Karalis et al. |
| 2011/0248573 A1 | 10/2011 | Kanno et al. |
| 2011/0254377 A1 | 10/2011 | Wildmer et al. |
| 2011/0254503 A1 | 10/2011 | Widmer et al. |
| 2011/0266878 A9 | 11/2011 | Cook et al. |

(56) References Cited

U.S. PATENT DOCUMENTS

| | | |
|---|---|---|
| 2011/0278943 A1 | 11/2011 | Eckhoff et al. |
| 2012/0001492 A9 | 1/2012 | Cook et al. |
| 2012/0001593 A1 | 1/2012 | DiGuardo |
| 2012/0007435 A1 | 1/2012 | Sada et al. |
| 2012/0007441 A1 | 1/2012 | John et al. |
| 2012/0025602 A1 | 2/2012 | Boys et al. |
| 2012/0032522 A1 | 2/2012 | Schatz et al. |
| 2012/0038525 A1 | 2/2012 | Monsalve Carcelen et al. |
| 2012/0062345 A1 | 3/2012 | Kurs et al. |
| 2012/0068549 A1 | 3/2012 | Karalis et al. |
| 2012/0086284 A1 | 4/2012 | Campanella et al. |
| 2012/0086867 A1 | 4/2012 | Kesler et al. |
| 2012/0091794 A1 | 4/2012 | Campanella et al. |
| 2012/0091795 A1 | 4/2012 | Fiorello et al. |
| 2012/0091796 A1 | 4/2012 | Kesler et al. |
| 2012/0091797 A1 | 4/2012 | Kesler et al. |
| 2012/0091819 A1 | 4/2012 | Kulikowski et al. |
| 2012/0091820 A1 | 4/2012 | Campanella et al. |
| 2012/0091949 A1 | 4/2012 | Campanella et al. |
| 2012/0091950 A1 | 4/2012 | Campanella et al. |
| 2012/0098350 A1 | 4/2012 | Campanella et al. |
| 2012/0112531 A1 | 5/2012 | Kesler et al. |
| 2012/0112532 A1 | 5/2012 | Kesler et al. |
| 2012/0112534 A1 | 5/2012 | Kesler et al. |
| 2012/0112535 A1 | 5/2012 | Karalis et al. |
| 2012/0112536 A1 | 5/2012 | Karalis et al. |
| 2012/0112538 A1 | 5/2012 | Kesler et al. |
| 2012/0112691 A1 | 5/2012 | Kurs et al. |
| 2012/0119569 A1 | 5/2012 | Karalis et al. |
| 2012/0119575 A1 | 5/2012 | Kurs et al. |
| 2012/0119576 A1 | 5/2012 | Kesler et al. |
| 2012/0119698 A1 | 5/2012 | Karalis et al. |
| 2012/0139355 A1 | 6/2012 | Ganem et al. |
| 2012/0146575 A1 | 6/2012 | Armstrong et al. |
| 2012/0153732 A1 | 6/2012 | Kurs et al. |
| 2012/0153733 A1 | 6/2012 | Schatz et al. |
| 2012/0153734 A1 | 6/2012 | Kurs et al. |
| 2012/0153735 A1 | 6/2012 | Karalis et al. |
| 2012/0153736 A1 | 6/2012 | Karalis et al. |
| 2012/0153737 A1 | 6/2012 | Karalis et al. |
| 2012/0153738 A1 | 6/2012 | Karalis et al. |
| 2012/0153893 A1 | 6/2012 | Schatz et al. |
| 2012/0184338 A1 | 7/2012 | Kesler et al. |
| 2012/0206096 A1 | 8/2012 | John |
| 2012/0223573 A1 | 9/2012 | Schatz et al. |
| 2012/0228952 A1 | 9/2012 | Hall et al. |
| 2012/0228953 A1 | 9/2012 | Kesler et al. |
| 2012/0228954 A1 | 9/2012 | Kesler et al. |
| 2012/0235500 A1 | 9/2012 | Ganem et al. |
| 2012/0235501 A1 | 9/2012 | Kesler et al. |
| 2012/0235502 A1 | 9/2012 | Kesler et al. |
| 2012/0235503 A1 | 9/2012 | Kesler et al. |
| 2012/0235504 A1 | 9/2012 | Kesler et al. |
| 2012/0235505 A1 | 9/2012 | Schatz et al. |
| 2012/0235566 A1 | 9/2012 | Karalis et al. |
| 2012/0235567 A1 | 9/2012 | Karalis et al. |
| 2012/0235633 A1 | 9/2012 | Kesler et al. |
| 2012/0235634 A1 | 9/2012 | Hall et al. |
| 2012/0239117 A1 | 9/2012 | Kesler et al. |
| 2012/0242159 A1 | 9/2012 | Lou et al. |
| 2012/0242225 A1 | 9/2012 | Karalis et al. |
| 2012/0248884 A1 | 10/2012 | Karalis et al. |
| 2012/0248886 A1 | 10/2012 | Kesler et al. |
| 2012/0248887 A1 | 10/2012 | Kesler et al. |
| 2012/0248888 A1 | 10/2012 | Kesler et al. |
| 2012/0248981 A1 | 10/2012 | Karalis et al. |
| 2012/0256494 A1 | 10/2012 | Kesler et al. |
| 2012/0267960 A1 | 10/2012 | Low et al. |
| 2012/0280765 A1 | 11/2012 | Kurs et al. |
| 2012/0313449 A1 | 12/2012 | Kurs et al. |
| 2012/0313742 A1 | 12/2012 | Kurs et al. |
| 2012/0326660 A1* | 12/2012 | Lu .................. H02J 17/00 320/108 |
| 2013/0007949 A1 | 1/2013 | Kurs et al. |
| 2013/0020878 A1 | 1/2013 | Karalis et al. |
| 2013/0033118 A1 | 2/2013 | Karalis et al. |
| 2013/0038402 A1 | 2/2013 | Karalis et al. |
| 2013/0057364 A1 | 3/2013 | Kesler et al. |
| 2013/0062966 A1 | 3/2013 | Verghese et al. |
| 2013/0069441 A1 | 3/2013 | Verghese et al. |
| 2013/0069753 A1 | 3/2013 | Kurs et al. |
| 2013/0099587 A1 | 4/2013 | Lou et al. |
| 2013/0154383 A1 | 6/2013 | Kasturi et al. |
| 2013/0154389 A1 | 6/2013 | Kurs et al. |
| 2013/0159956 A1 | 6/2013 | Verghese et al. |
| 2013/0175874 A1 | 7/2013 | Lou et al. |
| 2013/0175875 A1 | 7/2013 | Kurs et al. |
| 2013/0200716 A1 | 8/2013 | Kesler et al. |
| 2013/0200721 A1 | 8/2013 | Kurs et al. |
| 2013/0221744 A1 | 8/2013 | Hall et al. |
| 2013/0278073 A1 | 10/2013 | Kurs et al. |
| 2013/0278074 A1 | 10/2013 | Kurs et al. |
| 2013/0278075 A1 | 10/2013 | Kurs et al. |
| 2013/0300353 A1 | 11/2013 | Kurs et al. |
| 2013/0307349 A1 | 11/2013 | Hall et al. |
| 2013/0320773 A1 | 12/2013 | Schatz et al. |
| 2013/0334892 A1 | 12/2013 | Hall et al. |
| 2014/0002012 A1 | 1/2014 | McCauley et al. |
| 2014/0055098 A1* | 2/2014 | Lee .................. H04B 5/0037 320/137 |
| 2014/0062551 A1 | 3/2014 | Bhaumik et al. |
| 2014/0070764 A1 | 3/2014 | Keeling |
| 2014/0084858 A1 | 3/2014 | Kim et al. |
| 2014/0292090 A1* | 10/2014 | Cordeiro .............. H02J 17/00 307/104 |
| 2014/0333258 A1 | 11/2014 | Matsukura et al. |
| 2014/0372780 A1 | 12/2014 | Murai et al. |
| 2015/0349538 A1 | 12/2015 | Agostinelli et al. |
| 2015/0372493 A1* | 12/2015 | Sankar ................ H02J 7/025 307/104 |
| 2017/0066336 A1 | 3/2017 | Okamoto |
| 2017/0098991 A1* | 4/2017 | Takahashi ............ H02J 50/12 |
| 2017/0141584 A1* | 5/2017 | DeVaul ............... H04W 76/14 |

FOREIGN PATENT DOCUMENTS

| | | | |
|---|---|---|---|
| CN | 102439669 | 5/2012 | |
| CN | 103329397 | 9/2013 | |
| CN | 103855928 | 6/2014 | ............ H02M 1/08 |
| DE | 38 24 972 | 1/1989 | |
| DE | 100 29147 | 12/2001 | |
| DE | 200 16 655 | 3/2002 | |
| DE | 102 21 484 | 11/2003 | |
| DE | 103 04 584 | 8/2004 | |
| DE | 10 2005 036290 | 2/2007 | |
| DE | 10 2006 044057 | 4/2008 | |
| EP | 1 335 477 | 8/2003 | |
| EP | 1 521 206 | 4/2005 | |
| EP | 1 524 010 | 4/2005 | |
| EP | 2 357 716 | 8/2011 | |
| JP | 02-097005 | 4/1990 | |
| JP | 4-265875 | 9/1992 | |
| JP | 6-341410 | 12/1994 | |
| JP | 9-182323 | 7/1997 | |
| JP | 9-298847 | 11/1997 | |
| JP | 10-164837 | 6/1998 | |
| JP | 11-75329 | 3/1999 | |
| JP | 11-188113 | 7/1999 | |
| JP | 2001-309580 | 11/2001 | |
| JP | 2002-010535 | 1/2002 | |
| JP | 2003-179526 | 6/2003 | |
| JP | 2004-166459 | 6/2004 | |
| JP | 2004-201458 | 7/2004 | |
| JP | 2004-229144 | 8/2004 | |
| JP | 2005-57444 | 3/2005 | |
| JP | 2005-149238 | 6/2005 | |
| JP | 2006-074848 | 3/2006 | |
| JP | 2007-505480 | 3/2007 | |
| JP | 2007-266892 | 10/2007 | |
| JP | 2007-537637 | 12/2007 | |
| JP | 2008-508842 | 3/2008 | |
| JP | 2008-206231 | 9/2008 | |
| JP | 2008-206327 | 9/2008 | |
| JP | 2011-072074 | 4/2011 | |

(56) References Cited

FOREIGN PATENT DOCUMENTS

| | | | | |
|---|---|---|---|---|
| JP | 2012-504387 | 2/2012 | | |
| JP | 2013-543718 | 12/2013 | | |
| JP | 2014-003849 | 1/2014 | ............. | H02J 17/00 |
| JP | 2014-017893 | 1/2014 | ............. | H02J 17/00 |
| JP | 2014-110662 | 6/2014 | ............. | H02J 17/00 |
| JP | 2014-241698 | 12/2014 | | |
| KR | 10-2007-0017804 | 2/2007 | | |
| KR | 10-2008-0007635 | 1/2008 | | |
| KR | 10-2009-0122072 | 11/2009 | | |
| KR | 10-2011-0050920 | 5/2011 | | |
| SG | 112842 | 7/2005 | | |
| WO | WO 92/17929 | 10/1992 | | |
| WO | WO 93/23908 | 11/1993 | | |
| WO | WO 94/28560 | 12/1994 | | |
| WO | WO 95/11545 | 4/1995 | | |
| WO | WO 96/02970 | 2/1996 | | |
| WO | WO 98/50993 | 11/1998 | | |
| WO | WO 00/77910 | 12/2000 | | |
| WO | WO 03/092329 | 11/2003 | | |
| WO | WO 03/096361 | 11/2003 | | |
| WO | WO 03/096512 | 11/2003 | | |
| WO | WO 2004/015885 | 2/2004 | | |
| WO | WO 2004/038888 | 5/2004 | | |
| WO | WO 2004/055654 | 7/2004 | | |
| WO | WO 2004/073150 | 8/2004 | | |
| WO | WO 2004/073166 | 8/2004 | | |
| WO | WO 2004/073176 | 8/2004 | | |
| WO | WO 2004/073177 | 8/2004 | | |
| WO | WO 2004/112216 | 12/2004 | | |
| WO | WO 2005/024865 | 3/2005 | | |
| WO | WO 2005/060068 | 6/2005 | | |
| WO | WO 2005/109597 | 11/2005 | | |
| WO | WO 2005/109598 | 11/2005 | | |
| WO | WO 2006/011769 | 2/2006 | | |
| WO | WO 2007/008646 | 1/2007 | | |
| WO | WO 2007/020583 | 2/2007 | | |
| WO | WO 2007/042952 | 4/2007 | | |
| WO | WO 2007/084716 | 7/2007 | | |
| WO | WO 2007/084717 | 7/2007 | | |
| WO | WO 2008/109489 | 9/2008 | | |
| WO | WO 2008/118178 | 10/2008 | | |
| WO | WO 2009/009559 | 1/2009 | | |
| WO | WO 2009/018568 | 2/2009 | | |
| WO | WO 2009/023155 | 2/2009 | | |
| WO | WO 2009/023646 | 2/2009 | | |
| WO | WO 2009/033043 | 3/2009 | | |
| WO | WO 2009/062438 | 5/2009 | | |
| WO | WO 2009/070730 | 6/2009 | | |
| WO | WO 2009/126963 | 10/2009 | | |
| WO | WO 2009/140506 | 11/2009 | | |
| WO | WO 2009/149464 | 12/2009 | | |
| WO | WO 2009/155000 | 12/2009 | | |
| WO | WO 2010/030977 | 3/2010 | | |
| WO | WO 2010/036980 | 4/2010 | | |
| WO | WO 2010/039967 | 4/2010 | | |
| WO | WO 2010/090538 | 8/2010 | | |
| WO | WO 2010/090539 | 8/2010 | | |
| WO | WO 2010/093997 | 8/2010 | | |
| WO | WO 2010/104569 | 9/2010 | | |
| WO | WO 2011/061388 | 5/2011 | | |
| WO | WO 2011/061821 | 5/2011 | | |
| WO | WO 2011/062827 | 5/2011 | | |
| WO | WO 2011/112795 | 9/2011 | | |
| WO | WO 2012/037279 | 3/2012 | | |
| WO | WO 2012/170278 | 12/2012 | | |
| WO | WO 2013/013235 | 1/2013 | | |
| WO | WO 2013/020138 | 2/2013 | | |
| WO | WO 2013/036947 | 3/2013 | | |
| WO | WO 2013/059441 | 4/2013 | | |
| WO | WO 2013/067484 | 5/2013 | | |
| WO | WO 2013/113017 | 8/2013 | | |
| WO | WO 2013/142840 | 9/2013 | | |
| WO | WO 2014/004843 | 1/2014 | | |
| WO | WO 2015/128941 | 9/2015 | ............. | H02J 17/00 |
| WO | WO 2015/159962 | 10/2015 | | |

OTHER PUBLICATIONS

"Physics Update, Unwired Energy", *Physics Today*, pp. 26, (Jan. 2007) (See http://arxiv.org/abs/physics/0611063.).

"In pictures: A year in technology", *BBC News*, (Dec. 28, 2007).

"Next Little Thing 2010 Electricity without wires", CNN Money (See money.cnn.com/galleries/2009/smallbusiness/0911/gallery.next_little_thing_2010.smb/) (dated Nov. 30, 2009).

Abe et al. "A Noncontact Charger Using a Resonant Converter with Parallel Capacitor of the Secondary Coil". IEEE, 36(2):444-451, Mar./Apr. 2000.

Ahmadian, M. et al., "Miniature Transmitter for Implantable Micro Systems", *Proceedings of the 25th Annual International Conference of the IEEE EMBS Cancun, Mexico*, pp. 3028-3031 (Sep. 17-21, 2003).

Aoki, T. et al., "Observation of strong coupling between one atom and a monolithic microresonator", Nature, vol. 443:671-674 (2006).

Apneseth et al. "Introducing wireless proximity switches" ABB Review Apr. 2002.

Aristeidis Karalis et al., "Efficient Wireless *non-radiative mid-range* energy transfer", *Annals of Physics*, vol. 323, pp. 34-48 (2008).

Baker et al., "Feedback Analysis and Design of RF Power Links for Low-Power Bionic Systems," *IEEE Transactions on Biomedical Circuits and Systems*, vol. 1(1):28-38 (Mar. 2007).

Balanis, C.A., "Antenna Theory: Analysis and Design," 3rd Edition, Sections 4.2, 4.3, 5.2, 5.3 (Wiley, New Jersey, 2005).

Berardelli, P., "Outlets Are Out", ScienceNOW Daily News, Science Now, http://sciencenow.sciencemag.org/ cgi/content/full/2006/1114/2, (Nov. 14, 2006) 2 pages.

Biever, C., "Evanescent coupling' could power gadgets wirelessly", NewScientistsTech.com, http://www. newscientisttech.com/article.ns?id=dn1 0575&print=true, (Nov. 15, 2006) 2 pages.

Borenstein, S., "Man tries wirelessly boosting batteries", (The Associated Press), USA Today, (Nov. 16, 2006) 1 page.

Borenstein, S., "Man tries wirelessly boosting batteries", AP Science Writer, Boston.com, (See http://www.boston.com/business/technology/articles/2006/11/15/man_tries_wirelessly_b . . . ) (Nov. 15, 2006).

Boyle, A., "Electro-nirvana? Not so fast", MSNBC, http:/lcosmiclog.msnbc.msn.com/_news/2007/06/08/4350760- electro-nirvana-not-so-fast, (Jun. 8, 2007) 1 page.

Budhia, M. et al., "A New IPT Magnetic Coupler for Electric Vehicle Charging Systems", IECON 2010—36th Annual Conference on IEEE Industrial Electronics Society, Glendale, AZ, pp. 2487-2492 (Nov. 7-10, 2010).

Budhia, M. et al., "Development and evaluation of single sided flux couplers for contactless electric vehicle charging", 2011 IEEE Energy Conversion Congress and Exposition (ECCE), Phoenix, AZ, pp. 614-621 (Sep. 17-22, 2011).

Budhia, M. et al.,"Development of a Single-Sided Flux Magnetic Coupler for Electric Vehicle IPT", *IEEE Transactions on Industrial Electronics*, vol. 60:318-328 (Jan. 2013).

Bulkeley, W. M., "MIT Scientists Pave the Way for Wireless Battery Charging", The Wall Street Journal (See http://online.wsj.com/article/SB118123955549228045.html?mod=googlenews_wsj), (Jun. 8, 2007) 2 pages.

Burri et al., "Invention Description", (Feb. 5, 2008).

Cass, S., "Air Power—Wireless data connections are common—now scientists are working on wireless power", Sponsored by IEEE Spectrum, http://spectrum.ieee.org/computing/hardware/air-power, (Nov. 2006) 2 pages.

Castelvecchi, Davide, "The Power of Induction—Cutting the last cord could resonate with our increasingly gadget dependent lives", *Science News Online*, vol. 172, No. 3, Jul. 21, 2007, 6 pages.

Chang, A., "Recharging the Wireless Way—Even physicists forget to recharge their cell phones sometimes.", PC Magazine, ABC News Internet Ventures, (Dec. 12, 2006) 1 page.

Chinaview"Scientists light bulb with 'wireless electricity'",www.Chinaview.cn, http://news.xinhuanet.com/english/2007-06/08/content_6215681.htm,Jun. 2007,1 page.

Cooks, G., "The vision of an MIT physicist: Getting rid of pesky rechargers", Boston.com, (Dec. 11, 2006) 1 page.

(56) References Cited

OTHER PUBLICATIONS

Derbyshire, D., "The end of the plug? Scientists invent wireless device that beams electricity through your home", Daily Mail, http://www.dailymail.co.uk/pages/live/articles/technology/technology.html?in_article_id=4 . . . ), (Jun.7, 2007) 3 pages.

Eisenberg, Anne, "Automatic Recharging, From a Distance", The New York Times, (see www.nytimes.com/2012/03/11/business/built-in-wireless-chargeing-for-electronic-devices.html?_r=0) (published on Mar. 10, 2012).

Esser et al., "A New Approach to Power Supplies for Robots", IEEE, vol. 27(5):872-875, (Sep./Oct. 1991).

Fan, Shanhui et al., "Rate-Equation Analysis of Output Efficiency and Modulation Rate of Photomic-Crystal Light-Emitting Diodes", IEEE Journal of Quantum Electronics, vol. 36(10):1123-1130 (Oct. 2000).

Fenske et al., "Dielectric Materials at Microwave Frequencies", Applied Microwave & Wireless, pp. 92-100 (2000).

Fernandez, C. et al., "A simple dc-dc converter for the power supply of a cochlear implant", *IEEE*, pp. 1965-1970 (2003).

Ferris, David, "How Wireless Charging Will Make Life Simpler (and Greener)", Forbes (See forbes.com/sites/davidferris/2012/07/24/how-wireless-charging-will-make-life-simpler-and-greener/print/) (dated Jul. 24, 2012).

Fildes, J., "Physics Promises Wireless Power", (Science and Technology Reporter), BBC News, (Nov. 15, 2006) 3 pages.

Fildes, J., "The technology with impact 2007", BBC News, (Dec. 27, 2007) 3 pages.

Fildes, J., "Wireless energy promise powers up", BBC News, http://news.bbc.co.uk/2/hi/technology/6725955.stm, (Jun. 7, 2007) 3 pages.

Finkenzeller, Klaus, "RFID Handbook—Fundamentals and Applications in Contactless Smart Cards", Nikkan Kohgyo-sya, Kanno Taihei, first version, pp. 32-37, 253 (Aug. 21, 2001).

Finkenzeller, Klaus, "RFID Handbook (2nd Edition)", The Nikkan Kogyo Shimbun, Ltd., pp. 19, 20, 38, 39, 43, 44, 62, 63, 67, 68, 87, 88, 291, 292 (Published on May 31, 2004).

Freedman, D.H., "Power on a Chip", MIT Technology Review, (Nov. 2004).

Gary Peterson, "Mit WiTricity Not So Original After All", *Feed Line No. 9*, (See http://www.tfcbooks.com/articles/witricity.htm) printed Nov. 12, 2009.

Geyi, Wen, "A Method for the Evaluation of Small Antenna Q", IEEE Transactions on Antennas and Propagation, vol. 51(8):2124-2129 (Aug. 2003).

Hadley, F., "Goodbye Wires—MIT Team Experimentally Demonstrates Wireless Power Transfer, Potentially Useful for Power Laptops, Cell-Phones Without Cords", Massachusetts Institute of Technology, Institute for Soldier D Nanotechnologies, http://web.mit.edu/newsoffice/2007/wireless-0607.html, (Jun. 7, 2007) 3 pages.

Haus, H.A., "Waves and Fields in Optoelectronics," Chapter 7 "Coupling of Modes—Reasonators and Couplers" (Prentice-Hall, New Jersey, 1984).

Heikkinen et al., "Performance and Efficiency of Planar Rectennas for Short-Range Wireless Power Transfer at 2.45 GHz", Microwave and Optical Technology Letters, vol. 31(2):86-91, (Oct. 20, 2001).

Highfield, R., "Wireless revolution could spell end of plugs",(Science Editor), Telegraph.co.uk, http://www. telegraph.co.uk/news/main.jhtml?xml=/news/2007/06/07/nwireless1 07.xml, (Jun. 7, 2007) 3 pages.

Hirai et al., "Integral Motor with Driver and Wireless Transmission of Power and Information for Autonomous Subspindle Drive", IEEE, vol. 15(1):13-20, (Jan. 2000).

Hirai et al., "Practical Study on Wireless Transmission of Power and Information for Autonomous Decentralized Manufacturing System", IEEE, vol. 46(2):349-359, Apr. 1999.

Hirai et al., "Study on Intelligent Battery Charging Using Inductive Transmission of Power and Information", IEEE, vol. 15(2):335-345, (Mar. 2000).

Hirai et al., "Wireless Transmission of Power and Information and Information for Cableless Linear Motor Drive", IEEE, vol. 15(1):21-27, (Jan. 2000).

Hirayama, M., "Splashpower—World Leaders in Wireless Power", PowerPoint presentation, Splashpower Japan, (Sep. 3, 2007) 30 pages.

Ho, S. L. et al., "A Comparative Study Between Novel Witricity and Traditional Inductive Magnetic Coupling in Wireless Charging", IEEE Transactions on Magnetics, vol. 47(5):1522-1525 (May 2011).

Infotech Online, "Recharging gadgets without cables", infotech.indiatimes.com, (Nov. 17, 2006) 1 page.

Jackson, J. D., "Classical Electrodynamics", 3rd Edition, Wiley, New York, 1999, pp. 201-203.

Jackson, J.D., "Classical Electrodynamics," 3rd Edition, Sections 1.11, 5.5, 5.17, 6.9, 8.1, 8.8, 9.2, 9.3 (Wiley, New York, 1999).

Jacob, M. V. et al., "Lithium Tantalate—A High Permittivity Dielectric Material for Microwave Communication Systems", *Proceedings of IEEE TENCON—Poster Papers*, pp. 1362-1366, 2003.

Karalis, Aristeidis, "Electricity Unplugged", Feature: Wireless Energy Physics World, physicsworld.com, pp. 23-25 (Feb. 2009).

Kawamura et al., "Wireless Transmission of Power and Information Through One High-Frequency Resonant AC Link Inverter for Robot Manipulator Applications", IEEE, vol. 32(3):503-508, (May/Jun. 1996).

Kurs, A. et al., "Wireless Power Transfer via Strongly Coupled Magnetic Resonances", *Science* vol. 317, pp. 83-86 (Jul. 6, 2007).

Kurs, A. et al., "Simultaneous mid-range power transfer to multiple devices", *Applied Physics Letters*, vol. 96, No. 044102 (2010).

Kurs, A. et al.,"Optimized design of a low-resistance electrical conductor for the multimegahertz range", *Applied Physics Letters*, vol. 98:172504-172504-3 (Apr. 2011).

Lamb, Gregory M. ,"Look Ma—no wires!—Electricity broadcast through the air may someday run your home",The Christian Science Monitor,http://www.csmonitor.com/2006/1116/p14s01-stct.html,Nov. 15, 2006,2 pages.

Lee, "Antenna Circuit Design for RFID Applications," Microchip Technology Inc., AN710, 50 pages (2003).

Lee, "RFID Coil Design," Microchip Technology Inc., AN678, 21 pages (1998).

Liang et al., "Silicon waveguide two-photon absorption detector at 1.5 μm wavelength for autocorrelation measurements," Applied Physics Letters, 81(7):1323-1325 (Aug. 12, 2002).

Markoff, J. ,"Intel Moves to Free Gadgets of Their Recharging Cords", The New York Times—nytimes.com, Aug. 21, 2008, 2 pages.

Mediano, A. et al. "Design of class E amplifier with nonlinear and linear shunt capacitances for any duty cycle", IEEE Trans. Microwave Theor. Tech., vol. 55, No. 3, pp. 484-492, (2007).

Microchip Technology Inc., "microID 13.56 MHz Design Guide—MCRF355/360 Reader Reference Design," 24 pages (2001).

Minkel, J R. ,"Wireless Energy Lights Bulb from Seven Feet Away—Physicists vow to cut the cord between your laptop battery and the wall socket—with just a simple loop of wire",Scientific American,http://www.scientificamerican.com/article.cfm?id=wireless-energy-lights-bulb-from-seven-feet-away,Jun. 7, 2007,1 page.

Minkel, J R. ,"Wireless Energy Transfer May Power Devices at a Distance",Scientific American,Nov. 14, 2006,1 page.

Morgan, J., "Lab report: Pull the plug for a positive charge", The Herald, Web Issue 2680, (Nov. 16, 2006) 3 pages.

Moskvitch, Katia, "Wireless charging—the future for electric cars?", BBC News Technology (See www.bbc.co.uldnews/technology-14183409) (dated Jul. 21, 2011).

O'Brien et al., "Analysis of Wireless Power Supplies for Industrial Automation Systems", IEEE, pp. 367-372 (Nov. 2-6, 2003).

O'Brien et al., "Design of Large Air-Gap Transformers for Wireless Power Supplies", IEEE, pp. 1557-1562 (Jun. 15-19, 2003).

Pendry, J. B., "A Chiral Route to Negative Refraction", Science, vol. 306:1353-1355 (2004).

Physics Today, "Unwired energy questions asked answered", Sep. 2007, pp. 16-17.

Powercast LLC. "White Paper" Powercast simply wire free, 2003.

(56) References Cited

OTHER PUBLICATIONS

PR News Wire, "The Big Story for CES 2007: The public debut of eCoupled Intelligent Wireless Power", Press Release, Fulton Innovation LLC, Las Vegas, NV, (Dec. 27, 2006) 3 pages.
Press Release, "The world's first sheet-type wireless power transmission system: Will a socket be replaced by e-wall?",Public Relations Office, School of Engineering, University of Tokyo, Japan,Dec. 12, 2006,4 pages.
Presstv, "Wireless power transfer possible", http://edition.presstv.ir/detail/12754.html, Jun. 11, 2007, 1 page.
Reidy, C. (Globe Staff), "MIT discovery could unplug your iPod forever", Boston.com, http://www.boston.com/business/ficker/2007/06/mit_discovery_c.html, (Jun. 7, 2007) 3 pages.
Risen, C., "Wireless Energy", The New York Times, (Dec. 9, 2007) 1 page.
Sakamoto et al., "A Novel Circuit for Non-Contact Charging Through Electro-Magnetic Coupling", IEEE, pp. 168-174 (1992).
Scheible, G. et al., "Novel Wireless Power Supply System for Wireless Communication Devices in Industrial Automation Systems", IEEE, pp. 1358-1363, (Nov. 5-8, 2002).
Schneider, D. "A Critical Look at Wireless Power", *IEEE Spectrum*, pp. 35-39 (May 2010).
Schneider, David, "Electrons Unplugged. Wireless power at a distance is still far away", *IEEE Spectrum*, pp. 35-39 (May 2010).
Schuder, J. C. et al., "An Inductively Coupled RF System for the Transmission of 1 kW of Power Through the Skin", *IEEE Transactions on Bio-Medical Engineering*, vol. BME-18, No. 4, pp. 265-273 (Jul. 1971).
Schuder, J. C., "Powering an Artificial Heart: Birth of the Inductively Coupled-Radio Frequency System in 1960", *Artificial Organs*, vol. 26:909-915 (2002).
Schuder, J.C. et al., "Energy Transport Into the Closed Chest From a Set of Very-Large Mutually Orthogonal Coils", Communication Electronics, vol. 64:527-534 (Jan. 1963).
Schutz, J. et al., "Load Adaptive Medium Frequency Resonant Power Supply", IEEE, pp. 282-287 (Nov. 2002).
Sekitani et al. "A large-area wireless power-transmission sheet using printed organic transistors and plastic MEMS switches" www.nature.com/naturematerials. Published online Apr. 29, 2007.
Sekitani et al., "A large-area flexible wireless power transmission sheet using printed plastic MEMS switches and organic field-effect transistors", IEDM '06, International Electron Devices Meeting, (Dec. 11-13, 2006) 4 pages.
Sekiya, H. et al., "FM/PWM control scheme in class DE inverter", IEEE Trans. Circuits Syst. I, vol. 51(7) (Jul. 2004).
Senge, M., "MIT's wireless electricity for mobile phones", Vanguard, http://www.vanguardngr.com/articles/2002/features/gsm/gsm211062007.htm, (Jun. 11, 2007) 1 page.
Sensiper, S., "Electromagnetic wave propogation on helical conductors", Technical Report No. 194 (based on PhD Thesis), Massachusetts Institute of Technology, (May 16, 1951) 126 pages.
Soljacic, M. , "Wireless Non-Radiative Energy Transfer—PowerPoint presentation". Massachusetts Institute of Technology, (Oct. 6, 2005).
Soljacic, M. et al., "Wireless Energy Transfer Can Potentially Recharge Laptops Cell Phones Without Cords", (Nov. 14, 2006) 3 pages.
Soljacic, M. et al., "Photonic-crystal slow-light enhancement of nonlinear phase sensitivity", *J. Opt. Soc. Am B*, vol. 19, No. 9, pp. 2052-2059 (Sep. 2002).
Soljacic, M., "Wireless nonradiative energy transfer", *Visions of Discovery New Light on Physics*, Cosmology, and Consciousness, Cambridge University Press, New York, NY pp. 530-542 (2011).
Someya, Takao. "The world's first sheet-type wireless power transmission system". University of Tokyo, (Dec. 12, 2006).

Staelin, David H. et al., Electromagnetic Waves, Chapters 2, 3, 4, and 8, pp. 46-176 and 336-405 (Prentice Hall Upper Saddle River, New Jersey 1998).
Stark III, Joseph C., "Wireless Power Transmission Utilizing a Phased Array of Tesla Coils", Master Thesis, Massachusetts Institute of Technology (2004).
Stewart, W., "The Power to Set you Free", Science, vol. 317:55-56 (Jul. 6, 2007).
Tang, S.C. et al., "Evaluation of the Shielding Effects on Printed-Circuit-Board Transformers Using Ferrite Plates and Copper Sheets", *IEEE Transactions on Power Electronics*, vol. 17:1080-1088 (Nov. 2002).
Tesla, Nikola, "High Frequency Oscillators for Electro-Therapeutic and Other Purposes", *Proceedings of the IEEE*, vol. 87:1282-1292 (Jul. 1999).
Tesla, Nikola, "High Frequency Oscillators for Electro-Therapeutic and Other Purposes", *The Electrical Engineer*, vol. XXVI, No. 50 (Nov. 17, 1898).
Texas Instruments, "HF Antenna Design Notes—Technical Application Report," Literature No. 11-08-26-003, 47 pages (Sep. 2003).
Thomsen et al., "Ultrahigh speed all-optical demultiplexing based on two-photon absorption in a laser diode," Electronics Letters, 34(19):1871-1872 (Sep. 17, 1998).
UPM Rafsec, "Tutorial overview of inductively coupled RFID Systems," 7 pages (May 2003).
Valtchev et al. "Efficient Resonant Inductive Coupling Energy Transfer Using New Magnetic and Design Criteria". IEEE, pp. 1293-1298, 2005.
Vandevoorde et al., "Wireless energy transfer for stand-alone systems: a comparison between low and high power applicability", Sensors and Actuators, vol. 92:305-311 (2001).
Vilkomerson, David et al., "Implantable Doppler System for Self-Monitoring Vascular Grafts", *IEEE Ultrasonics Symposium*, pp. 461-465 (2004).
Villeneuve, Pierre R. et al., "Microcavities in photonic crystals: Mode symmetry, tunability, and coupling efficiency", *Physical Review B*, vol. 54:7837-7842 (Sep. 15, 1996).
Yariv, Amnon et al., "Coupled-resonator optical waveguide: a proposal and analysis", *Optics Letters*, vol. 24(11):711-713 (Jun. 1, 1999).
Yates, David C. et al., "Optimal Transmission Frequency for Ultralow-Power Short-Range Radio Links", IEEE Transactions on Circuits and Systems—1, Regular Papers, vol. 51:1405-1413 (Jul. 2004).
Yoshihiro Konishi, *Microwave Electronic Circuit Technology*, Chapter 4, pp. 145-197 (Marcel Dekker, Inc., New York, NY 1998).
Ziaie, Babak et al., "A Low-Power Miniature Transmitter Using A Low-Loss Silicon Platform for Biotelemetry", *Proceedings—19th International Conference IEEE/EMBS*, pp. 2221-2224, (Oct. 30-Nov. 2, 1997) 4 pages.
Zierhofer, Clemens M. et al., "High-Efficiency Coupling-Insensitive Transcutaneous Power and Data Transmission Via an Inductive Link", *IEEE Transactions on Biomedical Engineering*, vol. 37, No. 7, pp. 716-722 (Jul. 1990).
Transmittal of International Preliminary Report on Patentability for International Application No. PCT/US2017/016119 by Examiner Agnes Wittmann-Regis dated Aug. 16, 2018 (14 pages).
International Search Report and Written Opinion of the International Searching Authority for International Application No. PCT/US2017/016119 by Examiner Kim Hyeon Jin dated Apr. 18, 2017 (18 pages).
European Search Report for European Application No. 17 15 4475 by Examiner Bernard Chaumeron dated Jun. 8, 2017 (7 pages).
Extended European Search Report for European Patent Application No. EP 18 20 5934 by Examiner Bernard Chaumeron dated Feb. 14, 2019.

* cited by examiner

CONTROLLING WIRELESS POWER TRANSFER SYSTEMS

CROSS-REFERENCE TO RELATED APPLICATION

This application claims priority to U.S. Provisional Patent Application Nos. 62/290,325, filed on Feb. 2, 2016, and 62/379,618 filed on Aug. 25, 2016, the entire contents of which are incorporated herein by reference.

BACKGROUND

Wireless power transfer systems operate over a wide range of coupling factors k, load conditions, and environmental conditions. Variations in these parameters affect the efficiencies of wireless power transfer systems. Wireless power transfer systems can include impedance matching networks to improve power transfer capability and efficiency. Obtaining good performance in a wireless power transfer system over such a wide range of conditions is challenging for traditional impedance matching networks.

SUMMARY

In general, the disclosure features wireless power transmission control systems that synchronously tune a wireless power transmitter and receiver to adapt to changing system, parameters, environmental parameters, or both. The wireless power transmission control systems described herein can be used in a variety of contexts, including implantable devices, cell phone and other mobile computing device chargers, and chargers for electric vehicles.

In a first aspect, the disclosure features a wireless energy transmitter that has a transmitter-impedance matching network (IMN). The transmitter is configured to perform operations including performing a first comparison between a characteristic of a power of the transmitter and a target power. Adjusting, based on the first comparison, a reactance of the transmitter-IMN to adjust the power of the transmitter. Transmitting power data that indicates the power of the transmitter to a wireless energy receiver.

In a second aspect, the disclosure features a wireless energy receiver that has a receiver-IMN. The receiver is configured to perform operations including determining an efficiency of a wireless energy transfer system at a second time based on power data from a wireless energy transmitter. Performing a second comparison between the efficiency at the second time and an efficiency of the wireless energy transfer system at a first time, the first time being prior to the second time. Adjusting, based on the second comparison, a reactance of the receiver-IMN.

In a third aspect, the disclosure features a wireless energy transfer system that includes an energy transmitter, and an energy receiver. The transmitter has a transmitter-IMN. The transmitter is configured to perform operations including performing a first comparison between a characteristic of a power of the transmitter and a target power. Adjusting, based on the first comparison, a reactance of the transmitter-IMN to adjust the power of the transmitter. The receiver has a receiver-IMN. The receiver is configured to perform operations including determining an efficiency of the wireless energy transfer system at a second time based on power data from the transmitter. Performing a second comparison between the efficiency at the second time and an efficiency of the wireless energy transfer system at a first time, the first time being prior to the second time. Adjusting, based on the second comparison, a reactance of the receiver-IMN.

The first aspect and the second aspect can operate together in a system such as the system of the third aspect. Furthermore, these and the fourth through sevenths aspects can each optionally include one or more of the following features.

In some implementations, adjusting the reactance of the receiver-IMN includes adjusting the reactance of the receiver-IMN by a variable reactance adjustment value.

In some implementations, the first comparison and adjustment to the reactance of the transmitter-IMN occur iteratively until the characteristic of the power is within a threshold value of the target power.

In some implementations, adjusting the reactance of the receiver-IMN includes, in response to the efficiency at the second time being less than the efficiency at the first time, negating a reactance adjustment value. Adjusting the reactance of the receiver-IMN includes adjusting the reactance of the receiver-IMN by the negated reactance adjustment value.

In some implementations, adjusting the reactance of the transmitter-IMN includes, in response to the power being less than the target power, adjusting the reactance of the transmitter-IMN by a first reactance adjustment value. In response to the power being greater than the target power, adjusting the reactance of the transmitter-IMN by a second, different reactance adjustment value.

In some implementations, the first reactance adjustment value is equal in magnitude and opposite in sign to the second reactance adjustment value In some implementations, the first comparison is between a power factor of the power of the transmitter and a target power factor. The operations of the transmitter can include a third comparison between a magnitude of the power and a target power magnitude, wherein the third comparison follows the first comparison, and adjusting, based on the third comparison, a bus voltage of the transmitter to adjust the power of the transmitter.

In some implementations, the power factor is represented by a phase relationship between a transmitter voltage and a transmitter current.

In some implementations, the first comparison and adjustment of the reactance of the transmitter-IMN based on the first comparison occur iteratively until the power factor of the power is within a threshold value of the target power factor.

In some implementations, the steps of performing the first comparison and adjusting the reactance of the transmitter-IMN are iterated at a faster rate than the steps of performing the third comparison and adjusting the bus voltage.

In some implementations, the transmitter is an electric vehicle charger and wherein the receiver is a coupled to a power system of an electric vehicle.

In some implementations, the operations of the transmitter include shutting down the wireless energy transfer system by reducing the target power to zero.

In some implementations, the operations of the transmitter include shutting down a power inverter in the transmitter.

In some implementations, the operations of the transmitter include starting up the transmitter by adjusting the reactance of the transmitter-IMN to a maximum value.

In some implementations, the operations of the transmitter include starting up the transmitter by adjusting a frequency of an inverter to a target frequency.

In some implementations, the operations of the receiver include starting up the receiver by adjusting the reactance of the receiver-IMN to a minimum value.

In some implementations, the operations of the receiver include starting up the receiver by adjusting the reactance of the receiver-IMN from a maximum value to a minimum value.

In some implementations, the transmitter-IMN includes a tunable reactive element electrically connected between an inverter and at least one fixed reactive element, and adjusting the reactance of the transmitter-IMN includes adjusting the tunable reactive element.

In some implementations, the receiver-IMN includes a tunable reactive element electrically connected between a rectifier and at least one fixed reactive element, and adjusting the reactance of the receiver-IMN includes adjusting the tunable reactive element.

In some implementations, the steps of performing the first comparison and adjusting the reactance of the transmitter-IMN are iterated at a faster rate than the steps of performing the second comparison and adjusting the reactance of the receiver-IMN.

In some implementations, determining the efficiency of the wireless energy transfer system includes receiving power data from the transmitter, determining an output power of the receiver, and calculating the efficiency of the wireless energy transfer system based on the power data from the transmitter and the output power of the receiver.

In some implementations, the operations of the transmitter include performing a plurality of checks that can include a check of a magnitude of the power, a check of a power factor of the power, and a check of a frequency of an inverter in the transmitter, and in response to the plurality checks, selectively adjusting the frequency of the inverter to adjust the power of the transmitter.

In some implementations, the operations of the transmitter include performing a plurality of checks that can include a check of a magnitude of the power and a check of a phase shift of an inverter of the transmitter, in response to the plurality checks, selectively adjusting the phase shift of the inverter to adjust the power of the transmitter.

In some implementations, the operations of the transmitter include, before adjusting the bus voltage, verifying that the bus voltage is greater than a minimum bus voltage.

In some implementations, the first comparison is between a power factor of the power of the transmitter and a target power factor. The operations of the transmitter can include performing a third comparison between a magnitude of the power and a target power magnitude, adjusting, based on the third comparison, the reactance of the transmitter-IMN to reduce the power of the transmitter.

In some implementations, the first comparison is between a power factor of the power of the transmitter and a target power factor. The operations of the transmitter can include performing a third comparison between a magnitude of the power and a target power magnitude, and adjusting, based on the third comparison, a frequency of an inverter of the transmitter to reduce the power of the transmitter.

In some implementations, the first comparison is between a power factor of the power of the transmitter and a target power factor. The operations of the can include performing a third comparison between a magnitude of the power and a target power magnitude, and adjusting, based on the third comparison, a phase shift of an inverter of the transmitter to reduce the power of the transmitter.

In some implementations, the transmitter includes an inductive coil coupled to at least portion of the transmitter-impedance matching network to form a transmitter resonator.

In some implementations, the receiver includes an inductive coil coupled to at least portion of the receiver-impedance matching network to form a receiver resonator.

In a fourth aspect, the disclosure features the subject matter described in this specification can be embodied in methods that include the actions of tuning, by a wireless energy transmitter, a transmitter-IMN of the wireless energy transmitter to achieve a target transmitter power characteristic. Sending, by the wireless energy transmitter, power data that indicates the power of the transmitter to a wireless energy receiver. Tuning, by the wireless energy receiver and based on the power data, the receiver-IMN to improve an efficiency of the wireless energy transfer system.

In a fifth aspect, the disclosure features a wireless energy transmitter that has a transmitter-IMN. The transmitter is configured to perform operations including tuning the transmitter-IMN to achieve a target transmitter power characteristic and sending power data that indicates the power of the transmitter to a wireless energy receiver.

In a sixth aspect, the disclosure features a features a wireless energy receiver that has a receiver-IMN. The receiver is configured to perform operations including tuning the receiver-IMN to improve an efficiency of the wireless energy transfer system based on power data received from a wireless energy transmitter.

In a seventh aspect, the disclosure features a wireless energy transfer system that includes an energy transmitter, and an energy receiver. The transmitter is configured to perform operations including tuning the transmitter-IMN to achieve a target transmitter power characteristic and sending power data that indicates the power of the transmitter to the wireless energy receiver. The receiver has a receiver-IMN. The receiver is configured to perform operations including tuning the receiver-IMN to improve an efficiency of the wireless energy transfer system based on power data received from the wireless energy transmitter.

The fifth aspect and the sixth aspect can operate together in a system such as the system of the seventh aspect. Furthermore, these and the first through third aspects can each optionally include one or more of the following features.

In some implementations, the target transmitter power characteristic is a target power factor and the target transmitter power characteristic is a target power factor.

In some implementations, the power factor is represented by a phase difference between a transmitter voltage and a transmitter current, and the target power factor is a target phase difference.

In some implementations, the operations include adjusting, by the transmitter, an inverter bus voltage to achieve a target power magnitude.

In some implementations, the operations include adjusting, by the transmitter, an inverter bus voltage to achieve a target power magnitude.

In some implementations, the operations include performing a safety check prior to adjusting the transmitter-IMN. In some implementations, the safety check is an over-voltage check or an over-current check.

In some implementations, the operations include performing, by the transmitter, a plurality of checks that can include a check of a magnitude of a transmitter power, a check of a transmitter power factor, and a check of a frequency of an inverter in the transmitter; and in response to the plurality checks, selectively adjusting the frequency of the inverter to adjust the power of the transmitter.

In some implementations, the operations include performing a plurality of checks that can include a check of a magnitude of a transmitter power and a check of a phase shift of an inverter of the transmitter; and in response to the plurality checks, selectively adjusting the phase shift of the inverter to adjust the power of the transmitter.

In some implementations, the transmitter is an electric vehicle charger and the receiver is a coupled to a power system of an electric vehicle.

In some implementations, the operations include adjusting, while starting up the transmitter, the reactance of the transmitter-IMN to a maximum value.

In some implementations, the operations include adjusting, while starting up the receiver, the reactance of the receiver-IMN to a minimum value.

In some implementations, the transmitter includes an inductive coil coupled to at least portion of the transmitter-impedance matching network to form a transmitter resonator.

In some implementations, the receiver includes an inductive coil coupled to at least portion of the receiver-impedance matching network to form a receiver resonator.

In an eighth aspect, the disclosure features a wireless power transmission system without bus voltage control configured to implement a control loop for tuning power transmission, where the control loop includes: a first sub-loop to control output power of a transmitter of the wireless power transmission system, and a second sub-loop to tune a combined reactance of an inductor and a capacitor that couple a tank circuit to a rectifier in a receiver of the wireless power transmission system, where the second sub-loop tunes the combined reactance by monitoring efficiency of wireless power transmission. Furthermore, this and other implementations can each optionally include one or more of the following features.

In some implementations, the second sub-loop employs a perturb-and-observe strategy to improve efficiency based on a previous point by tuning the combined reactance of an inductor and a capacitor that couple a tank circuit to a rectifier in a receiver of the wireless power transmission system.

In some implementations, the second sub-loop is dependent on a power comparison where output power is compared to target power at a start of the control loop.

In some implementations, the second sub-loop operates at the rate of communication, for example, 40 Hz.

In some implementations, the control loop is characterized by:

$$P_{inv} = \frac{\frac{8}{\pi^2} V_{bus}^2}{R_{inv}^2 + X_{inv}^2} R_{inv}$$

where $P_{inv}$ is power out of an inverter of the transmitter of the wireless power transmission system, $V_{bus}$ is bus voltage, $R_{inv}$ is resistance seen by the inverter, and $X_{inv}$ is reactance seen by the inverter, and where the tuning occurs at $X_{inv}$=the combined reactance of the inductor and the capacitor.

In some implementations, the first sub-loop is a local loop that does not communicate with another part of the wireless power transmission system.

In some implementations, the first sub-loop is faster than the second sub-loop where the first sub-loop is on order of 1 to 10 kHz.

In some implementations, the control loop includes preparing inputs, including: setting transmitter reactance to a maximum value, setting receiver reactance to a minimum value, and where the efficiency of wireless power transmission at time zero=0 and receiver reactance is to be changed by a constant or variable value.

In some implementations, the control loop starts by comparing output power to target power. In some implementations, if the output power equals the target power within a tolerance, then: efficiency is measured at a time n, the efficiency at time n is compared to efficiency at a previous time n−1, if the efficiency at time n is greater than the efficiency at the previous time n−1, then a change in receiver reactance is added to the receiver reactance and the output power is compared to the target power; whereas if efficiency at time n is equal to or less than the efficiency at the previous time n−1, then a change in receiver reactance is negated, the negated change is added to the receiver reactance, and the output power is compared to the target power.

In some implementations, if the output power does not equal the target power within a tolerance, then: it is determined whether the output power is less than the target power, if the output power is less than the target power, then a change in transmitter reactance is set to −δ, the change in transmitter reactance is added to the transmitter reactance, and the output power is compared to the target power; if the output power is greater than the target power, then the change in transmitter reactance is set to δ, the change in transmitter reactance is added to the transmitter reactance, and the output power is compared to the target power.

In a ninth aspect, the disclosure features a wireless power transmission system with bus voltage control configured to implement a control loop for tuning power transmission, where the control loop includes: a first sub-loop to control phase as defined: $\varphi=\arctan(X_{inverter}/R_{inverter})$, a second sub-loop to control output power, and a third sub-loop to tune a combined reactance of an inductor and a capacitor that couple a tank circuit to a rectifier in a receiver of the wireless power transmission system by monitoring efficiency. Furthermore, this and other implementations can each optionally include one or more of the following features.

In some implementations, the third sub-loop employs a perturb-and-observe strategy to improve efficiency based on a previous point by tuning the combined reactance of an inductor and a capacitor.

In some implementations, the third sub-loop is dependent on a power comparison and thus on the second sub-loop.

In some implementations, the third sub-loop operates at a rate of communication, for example, 40 Hz (speed of WiFi).

In some implementations, the control loop can be characterized by:

$$P_{inv} = \frac{\frac{8}{\pi^2} V_{bus}^2}{R_{inv}^2 + X_{inv}^2} R_{inv}$$

where $P_{inv}$ is power output from an inverter of the transmitter of the wireless power transmission system, $V_{bus}$ is bus voltage, $R_{inv}$ is resistance seen by the inverter, and $X_{inv}$ is the reactance seen by the inverter, and where tuning occurs at both $V_{bus}$ and $X3=X_{inv}$.

In some implementations, the first sub-loop is adjusted first, the second sub-loop is then adjusted, and the third sub-loop is then adjusted.

In some implementations, the first sub-loop runs on the order of 1 to 10 kHz.

In some implementations, the first sub-loop is a local loop and does not communicate with another part of the wireless power transmission system.

In some implementations, the second sub-loop is a local loop and does not communicate with another part of the wireless power transmission system.

In some implementations, the second sub-loop runs on the order of 1 to 10 kHz.

In some implementations, the control loop includes preparing inputs, including: setting transmitter reactance to a maximum value, setting receiver reactance to a minimum value, where the efficiency of wireless power transmission at time zero=0, the receiver reactance is to be increased, the transmitter reactance is to be increased, the bus voltage is to be increased, and phase is to be increased.

In some implementations, the control loop includes: comparing a phase measured at the inverter to a target phase, and if the phase measured at the inverter equals the target phase, then output power is compared to target power.

In some implementations, the third sub-loop occurs if the output power equals the target power and includes: measuring efficiency at a time n, comparing efficiency at the time n to efficiency at a previous time n−1, if the efficiency at the time n is greater than the efficiency at the previous time n−1 then receiver reactance is incremented; whereas if the efficiency at the time n is less than or equal to the efficiency at the previous time n−1, then change in the receiver reactance is negated and the negated value is added to the receiver reactance.

In some implementations, the second sub-loop occurs if the output power does not equal the target power and includes: if the output power is less than the target power, increasing the bus voltage, and if the output power is greater than the target power, reducing the bus voltage.

In some implementations, the first sub-loop occurs if a phase measured at inverter is not equal to a target phase and includes: if the phase measured at inverter is greater than a target phase, comparing receiver reactance to a minimum receiver reactance and if the receiver reactance equals the minimum receiver reactance, then comparing the output power to the target power; whereas if the receiver reactance does not equal the minimum receiver reactance, decreasing the transmitter reactance; and if the phase measured at the inverter is less than the target phase, then comparing the receiver reactance to a maximum receiver reactance and if the receiver reactance equals maximum receiver reactance then comparing the output power to the target power whereas if the receiver reactance does not equal the maximum receiver reactance then increasing the transmitter reactance.

Particular implementations of the subject matter described in this specification can be implemented so as to realize one or more of the following advantages. Implementations may improve the efficiency of operating wireless power transfer systems. Implementations may improve the dependability of wireless power transfer systems. Implementations may improve robustness of wireless power transfer systems to operate over many conditions. Implementations may improve ability to achieve higher levels of power transfer over many conditions.

Embodiments of the devices, circuits, and systems disclosed can also include any of the other features disclosed herein, including features disclosed in combination with different embodiments, and in any combination as appropriate.

The details of one or more implementations of the subject matter described in this specification are set forth in the accompanying drawings and the description below. Other features, aspects, and advantages of the subject matter will be apparent from the description, the drawings, and the claims.

BRIEF DESCRIPTION OF THE DRAWINGS

Like reference numbers and designations in the various drawings indicate like elements.

DETAILED DESCRIPTION

Wireless energy transfer systems described herein can be implemented using a wide variety of resonators and resonant objects. As those skilled in the art will recognize, important considerations for resonator-based power transfer include resonator quality factor and resonator coupling. Extensive discussion of such issues, e.g., coupled mode theory (CMT), coupling coefficients and factors, quality factors (also referred to as Q-factors), and impedance matching is provided, for example, in U.S. patent application Ser. No. 13/428,142, published on Jul. 19, 2012 as US 2012/0184338, in U.S. patent application Ser. No. 13/567,893, published on Feb. 7, 2013 as US 2013/0033118, and in U.S. patent application Ser. No. 14/059,094, published on Apr. 24, 2014 as US 2014/0111019. The entire contents of each of these applications are incorporated by reference herein.

In some applications such as wireless power transfer, impedances seen by the wireless power supply source and device may vary dynamically. In such applications, impedance matching between a device resonator coil and a load, and a source resonator coil and the power supply, may be required to prevent unnecessary energy losses and excess heat. The impedance experienced by a resonator coil may be dynamic, in which case, a dynamic impedance matching network can be provided to match the varying impedance to improve the performance of the system. In the case of the power supply in a wireless power system, the impedances seen by the power supply may be highly variable because of changes in the load receiving power (e.g., battery or battery charging circuitry) and changes in the coupling between the source and device (caused, for example, by changes in the relative position of the source and device resonators). Similarly, the impedance experienced by the device resonator may also change dynamically because of changes in the load receiving power. In addition, the desired impedance matching for the device resonator may be different for different coupling conditions and/or power supply conditions. Accordingly, power transfer systems transferring and/or receiving power via highly resonant wireless power transfer, for example, may be required to configure or modify impedance matching networks to maintain efficient power transfer. Implementations of the present disclosure provide startup, shutdown, and steady state operation processes that allow for efficient operation over the entire range of conditions encountered in highly-resonant wireless power transfer systems (HRWPT) system such as high-power vehicle charging systems, for example.

Figure 1A:
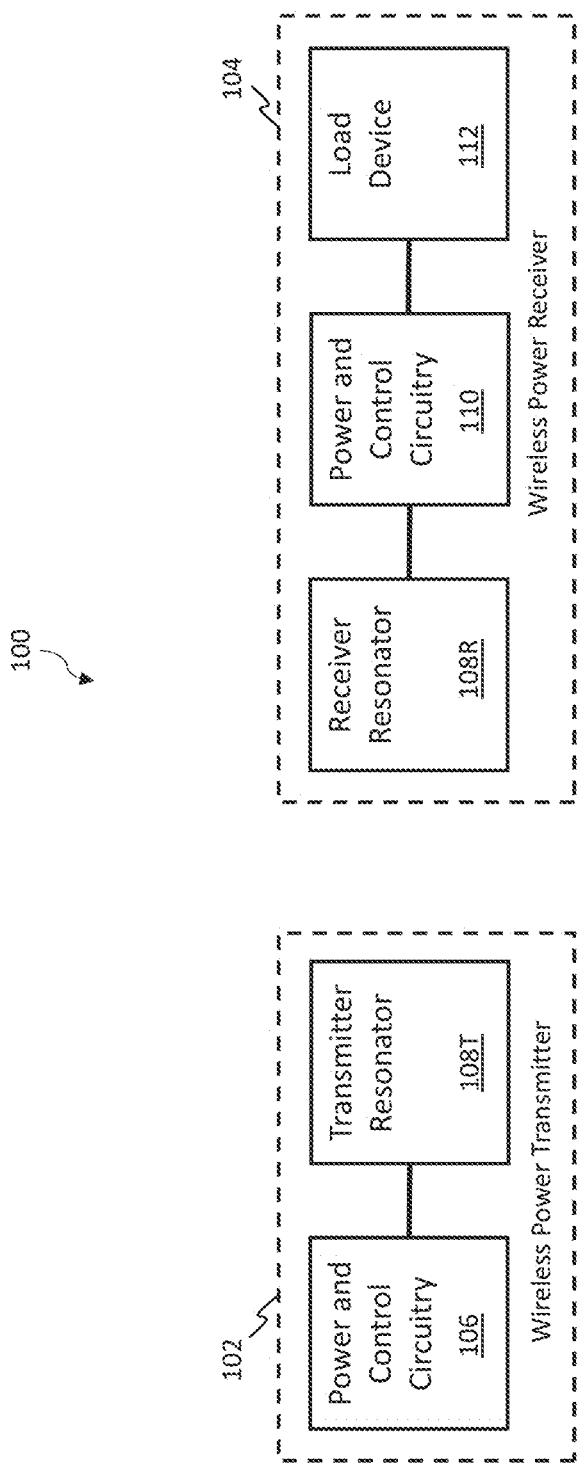
FIGS. 1A and 1B depict diagrams of an exemplary wireless power transmission system.
Figure 1B:
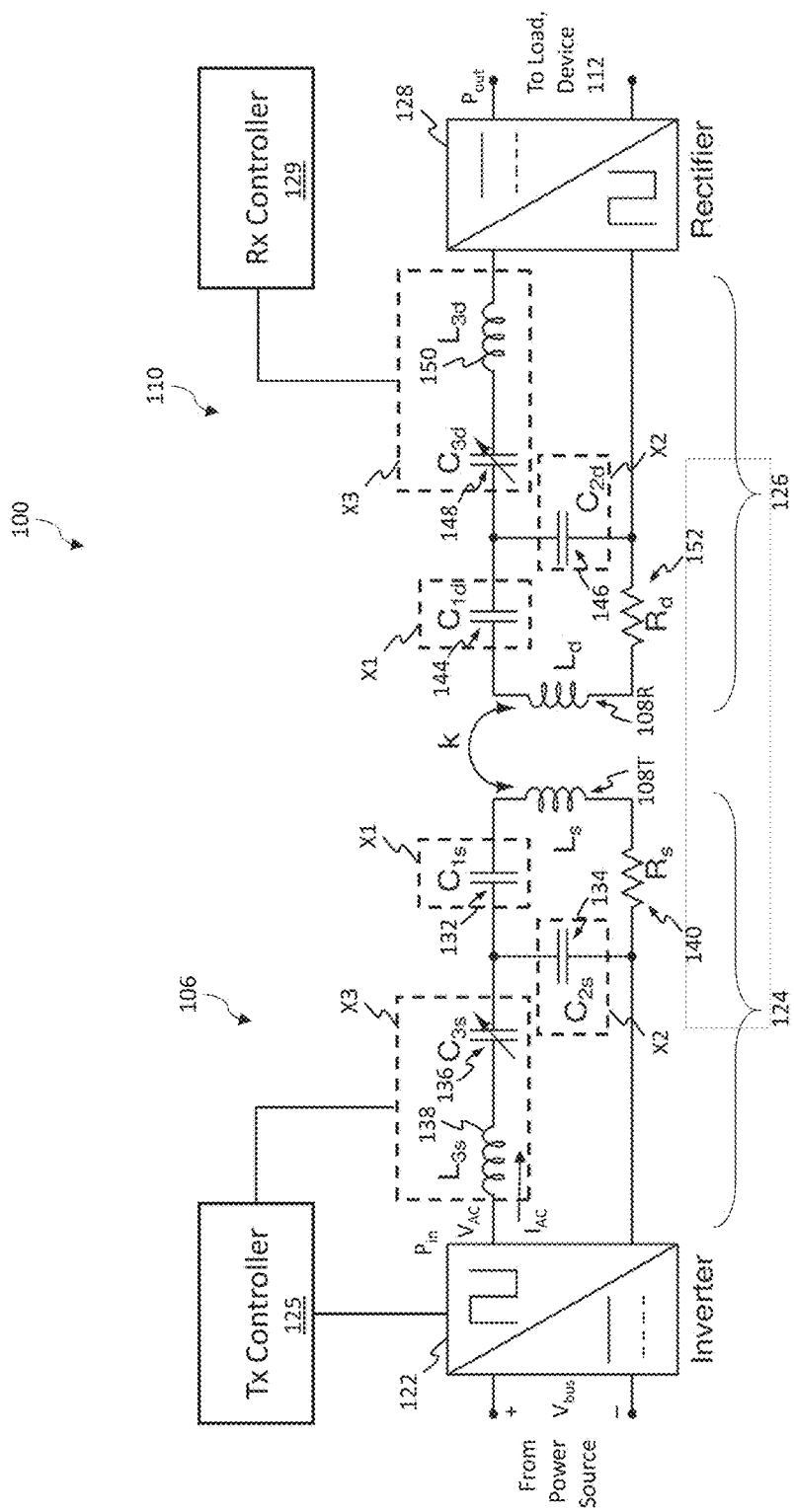

FIGS. 1A and 1B depict diagrams of an exemplary a wireless power transfer system 100. Referring first to FIG. 1A, the system 100 includes a wireless power transmitter 102 and a wireless power receiver 104. A wirelessly powered or wirelessly charged device 112 is coupled to receiver 104. Wirelessly powered or wirelessly charged devices 112 can include, for example, high-power devices such as electric vehicles or electronic devices such as laptops, smartphones, tablets, and other mobile electronic devices that are commonly placed on desktops, tabletops, bar tops, and other types of surfaces.

For purposes of illustration, wireless power transfer system 100 will be discussed in the context of a wireless charging system for an electric vehicle. For example, system 100 can be a HRWPT system which is required to operate over a wide range of coupling factors k, load conditions (such as a battery voltage), and environmental conditions that detune the inductances of the resonators (e.g., due to spatial variations and interfering objects). Furthermore, in order to perform wireless charging of electric vehicles, system 100 may be required to operate with high voltages (e.g., between 360V and 800V) and high currents (e.g., between 26 A and 40 A) to achieve a suitable range of power (e.g., 0 to 3.7 kW, 0 to 7.7 kW, 0 to 11 kW, or 0 to 22 kW).

Wireless power transmitter 102 converts power from an external power source (e.g., power grid or generator) to electromagnetic energy which is transmitted between resonators 108T and 108R to wireless power receiver 104. Receiver 104 converts the oscillating energy received by resonator 108R to an appropriate form for use by device 112 (e.g., charging an electric vehicle battery). More specifically, the receiver power and control circuitry 110 can convert AC voltage and current from resonator 108R to DC power within appropriate voltage and current parameters for device 112.

The transmitter power and control circuitry 106 can include circuits and components to isolate the source electronics from the power supply, so that any reflected power or signals are not coupled out through the source input terminals. The source power and control circuitry 106 can drive the source resonator 108S with alternating current, such as with a frequency greater than 10 kHz and less than 100 MHz (e.g., 85 kHz). The source power and control circuitry 106 can include, for example, power factor correction (PFC) circuitry, a transmitter controller, impedance matching circuitry, a power inverter, a DC-to-DC converter, an AC-to-DC converter, a power amplifier, or any combination thereof.

The receiver power and control circuitry 110 can be designed to transform alternating current power from the receiver resonator 108R to stable direct current power suitable for powering or charging one or more devices 112. For example, the receiver power and control circuitry 110 can be designed to transform an alternating current power at one frequency (e.g., 85 kHz) from resonator 108R to alternating current power at a different frequency suitable for powering or charging one or more devices 112. The receiver power and control circuitry 110 can include, for example, a receiver controller, impedance matching circuitry, rectification circuitry, voltage limiting circuitry, current limiting circuitry, AC-to-DC converter circuitry, DC-to-DC converter circuitry, DC-to-AC circuitry, AC-to-AC converter circuitry, and battery charge control circuitry.

Transmitter 102 and receiver 104 can have tuning capabilities, for example, dynamic impedance matching circuits, that allow adjustment of operating points to compensate for changing environmental conditions, perturbations, and loading conditions that can affect the operation of the source and device resonators and the efficiency of the energy transfer. The tuning capability can be controlled automatically, and may be performed continuously, periodically, intermittently or at scheduled times or intervals. In some implementations, tuning is performed synchronously between the transmitter 102 and the receiver 104 as described in more detail below.

FIG. 1B shows the power and control circuitry 106 and 110 of transmitter 102 and receiver 104 in more detail. Referring to both FIGS. 1A and 1B, transmitter 102 includes an inverter 122 powering a transmitter impedance matching network (IMN) 124 and a controller 125 that controls the operation of inverter 122 and tunes transmitter IMN 124. Transmitter IMN 124 is coupled to resonator coil 108T. Receiver 104 includes a receiver IMN 126 coupled to resonator 108R, a rectifier 128 and a controller 129 that can tune the receiver IMN 126. In operation, inverter 122 provides power through transmitter IMN 124 to resonator 108T. Resonator 108T couples oscillating electromagnetic energy to resonator 108R, with a coupling constant k. The energy received by resonator 108R is transferred through receiver IMN 126 to rectifier 108 which converts the energy into an appropriate form for use by device 112.

Transmitter controller 125 and receiver controller 129 can be implemented as processors or microcontrollers. In some implementations, transmitter controller 125 and receiver controller 129 can be implemented as ASIC or FPGA controllers. Transmitter controller 125 and receiver controller 129 need not be implemented in the same form. For example, transmitter controller 125 can be implemented as a microcontroller and receiver controller 129 can be implemented as an ASIC controller.

Transmitter 102 also includes a plurality of sensors such as voltage, current, and power sensors to measure transmitter operating parameters. Transmitter controller 125 can use measurements from the sensors to control the operation of the transmitter 102 and to tune the transmitter IMN 124. Transmitter operating parameters measured by the sensors can include, but is not limited to, inverter bus voltage ($V_{bus}$), transmitter input power, inverter AC voltage ($V_{AC}$), inverter AC current ($I_{AC}$), transmitter power factor (pf), and other voltages and currents as needed for safety checks. In some implementations, the transmitter input power is measured at an AC input to a transmitter PFC circuit. In some implementations, the transmitter input power is measured as an inverter power ($P_{in}$), as shown in FIG. 1B. In some implementations, the inverter power ($P_{in}$) is measured at the DC input of inverter 122. In some implementations, inverter power ($P_{in}$) is measured at the AC output of inverter 122. Transmitter power factor can be measured as the phase difference ($\varphi$) between the inverter AC voltage ($V_{AC}$) and inverter AC current ($I_{AC}$), where the power factor is the cosine of the phase difference ($\varphi$). In some implementations, the phase difference ($\varphi$) can be used as a proxy for power factor. That is, transmitter controller 125 can perform operations based on the phase difference ($\varphi$) instead of calculating an actual power factor value. In some implementations, transmitter power factor (pf) can be calculated based on equivalent resistance and reactance values as seen at the output of the inverter. For example, the phase difference ($\varphi$) can be represented by:

$$\varphi = \arctan(X_{inverter}/R_{inverter}).$$

Receiver 104 also includes a plurality of sensors such as voltage, current, and power sensors to measure receiver operating parameters. Receiver controller 129 can use measurements from the sensors to control the operation of the receiver 104 and to tune the receiver IMN 126. Receiver operating parameters measured by the sensors can include, but is not limited to, receiver output power ($P_{out}$), rectifier AC voltage, rectifier AC current, rectifier DC voltage, rectifier DC current, and other voltages and currents as needed for safety checks.

Transmitter IMN 124 and receiver IMN 126 can each include a plurality of fixed and variable impedance matching components such as resistors, capacitors, inductors, or combinations thereof. Variable impedance components can be tunable reactive impedance components including, but not limited to, PWM-switched capacitors, radio frequency (RF) controlled capacitors whose effective capacitance at RF is controlled by a DC bias field, temperature-controlled capacitors, PWM-switched inductors, DC controlled inductors whose effective inductance is controlled by a bias DC field (e.g., a saturable core), temperature-controlled inductors, arrays of reactive elements switched in and out of the circuit by switches, or a combination thereof.

In the illustrated example, transmitter IMN 124 includes series capacitor 132, parallel capacitor 134, and the combination of capacitor 136 and inductor 138 at the output of inverter 122. Capacitor 136 is a variable capacitor and can include one or more variable capacitors. A resistive component of the transistor resonator coil 108T is represented by resistor 140.

Receiver IMN 126 includes series capacitor 144, parallel capacitor 146, and the combination of capacitor 148 and inductor 150 at the input to rectifier 128. Capacitor 148 is a variable capacitor and can include one or more variable capacitors. A resistive component of the receiver resonator coil 108R is represented by resistor 152.

IMNs 124 and 126 can have a wide range of circuit implementations with various components having impedances to meet the needs of a particular application. For example, U.S. Pat. No. 8,461,719 to Kesler et al., which is incorporated herein by reference in its entirety, discloses a variety of tunable impedance network configurations, such as in FIGS. 28a-37b. In some implementations, each of the components shown in FIG. 1B may represent networks or groups of components.

Each of the IMNs 124 and 126 include three reactances: series reactance X1 (e.g., capacitor 132 or 144), parallel reactance X2 (e.g., capacitor 134 or 146), and inverter output/rectifier input reactance X3 (combined reactance of inductor 138 or 150 with capacitor 136 or 148, respectively). The reactances X1-X3 of receiver IMN 126 mirror the corresponding reactances X1-X3 of transmitter IMN 124. Although reactance X3 is the only reactance illustrated as including a tunable reactance component, namely, capacitors 136 and 148, in other implementations, reactances X1 and X2 can include tunable reactance components in addition to or in place of the tunable reactance component in reactance X3. In other words, IMNs 124 and 126 can be tuned by tuning any one or more of reactances X1-X3. In some implementations, components that make up reactances X1 and X3 can be balanced.

While any of reactances X1, X2, X3, or combinations thereof can be tuned, in some implementations, it can be advantageous to tune reactance X3. For example, by tuning reactance X3, it may be possible to reduce system complexity and cost if tuning a single component in IMN is sufficient. By tuning reactance X3, the current through the X3 elements can be significantly lower than that through the tank circuit formed by X1, X2, and the resonator coil. This lower current may make implementation of tunable components more cost-effective by, for example, reducing current ratings that may be required for such components. Additionally, lower currents may reduce losses by tuning elements at X3.

In some implementations, tunable reactive elements (e.g., PWM controlled capacitors) can inject harmonic noise into a HRWPT system. To help with EMI compliance, may be preferable to keep this harmonic noise away from the main HRWPT resonator coils (e.g., 108T and 108R). Higher-harmonics injected by a tunable element at X3 may be more suppressed than those that can be generated by the inverter and rectifier and may be significantly suppressed by the rest of the HRWPT circuit before reaching the resonator coil 108T or 108R.

In some implementations with tunable elements at X3 (e.g., PWM controlled capacitors), the tunable element dissipates the least amount of power (theoretically zero) when the overall efficiency of the rest of the system is lowest, and the highest amount of power when the overall efficiency of the rest of system is highest. This has the desirable effect of optimizing the minimum and average efficiencies of the system while only slightly affecting the maximum efficiency. However, tuning elements at X1 or X2 can have the opposite, less desirable, effect.

Fixed reactances of X1 and X2, and the base reactance value of X3 can be selected to achieve the results shown in FIGS. 2A-2D and discussed below. For example, values for X1 and X2 can be determined by: 1) Determining the maximum range of reactive tuning that can be achieved based on the maximum current that flows through the circuit branches containing X3 and the current and voltage ratings of the components used in the implementation of the tunable reactive elements. For example, one may conclude that a single-stage reactive element can affect 20Ω of reactive tuning. 2) Optimizing, for the receiver-side IMN, X1, X2, and the base value of X3 so as to optimize the coil-to-coil efficiency over the range of relative positions of the resonators (and of load conditions) and/or ensure that the amount of power dissipated in the resonators stays below a specified limit based on the range of reactive determined in step 1. 3) Optimizing, for the transmitter-side IMN, X1, X2, and the base value of X3 so as to present a desirable effective impedance to the inverter (e.g., sufficiently inductive to achieve zero-voltage-switching in a Class D inverter, but not too inductive that there's excessive reactive current, and with a magnitude that falls within the range of bus voltages that can be practically achieved).

Figures 2A, 2B:
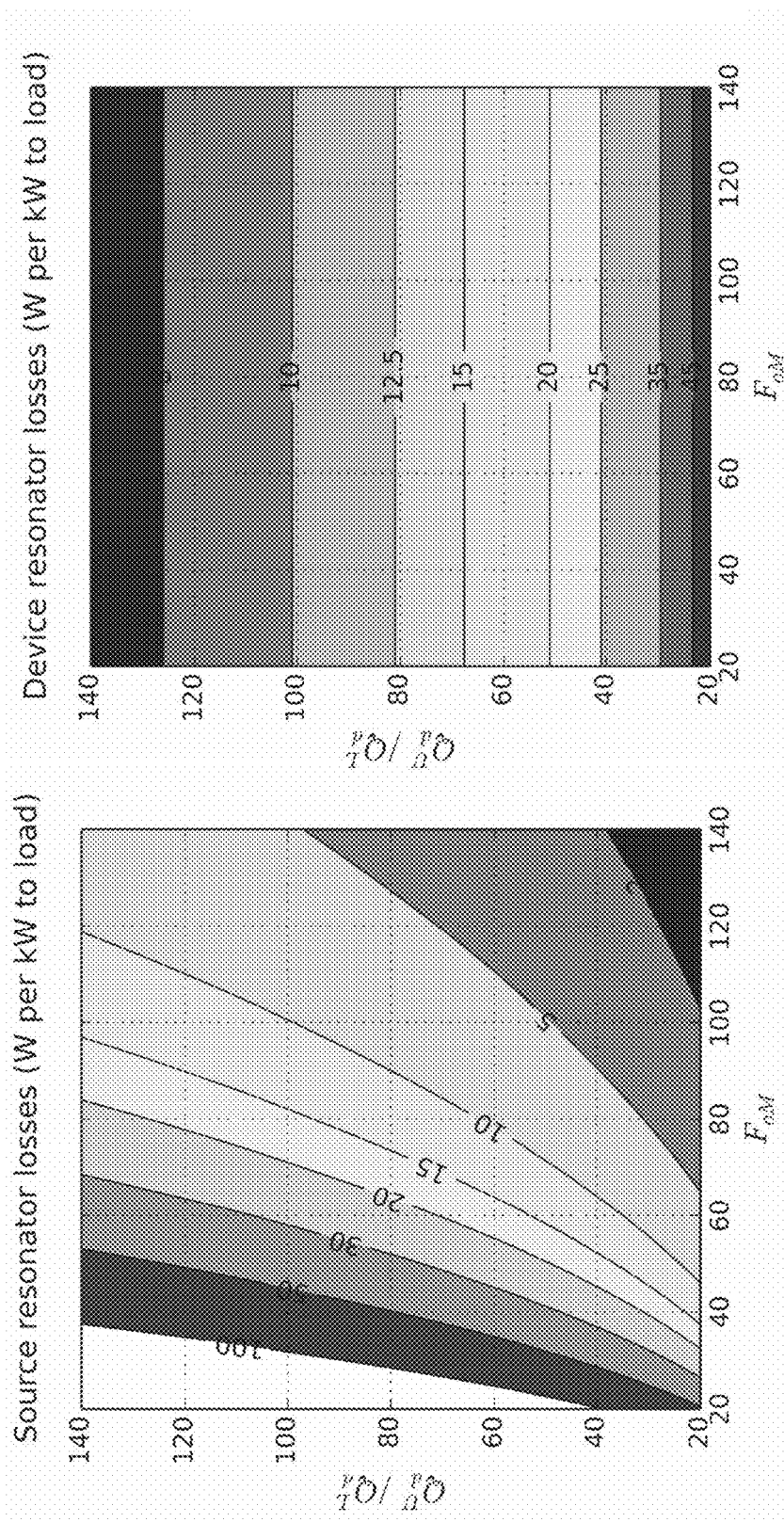
FIGS. 2A-2D depict plots related to the effects of receiver X3 tuning in an exemplary wireless power transmission system.

FIGS. 2A-2D illustrate plots related to the effects of tuning receiver X3. FIG. 2A shows source (transmitter) resonator power losses (in W per kW to the load) as a function of quality factor ratio $Q_d^U/Q_d^L$, where $Q_d^U$ is the quality factor of the unloaded device (receiver) resonator and $Q_d^L$ is the quality factor of the loaded device resonator (loading includes the loading of the remaining device circuitry and load) and figure of merit $F_{oM} = U = k\sqrt{Q_sQ_d}$. FIG. 2A illustrates that figure of merit plays a dominate role in losses at the transmitter resonator.

FIG. 2B shows device resonator power losses (in W per kW to the load) as a function of quality factor ratio $Q_d^U/Q_d^L$ where $Q_d^U$ is the quality factor of the unloaded device resonator and $Q_d^L$ is the quality factor of the loaded device resonator (loading includes the remaining device circuitry and load) and figure of merit $F_{oM}=U=k\sqrt{Q_sQ_d}$. FIG. 2B illustrates that quality factor ratio plays a dominate role in losses at the receiver resonator.

Figure 2D:
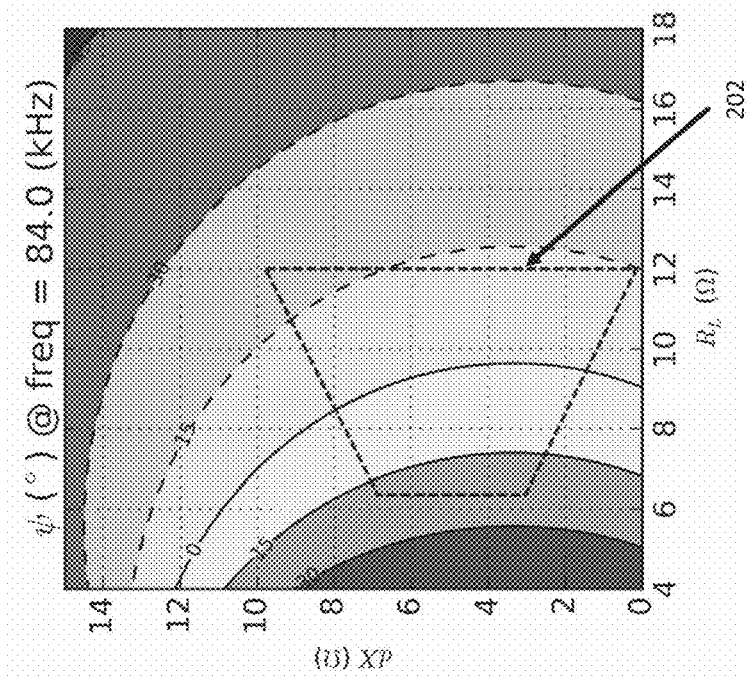
Figure 2C:
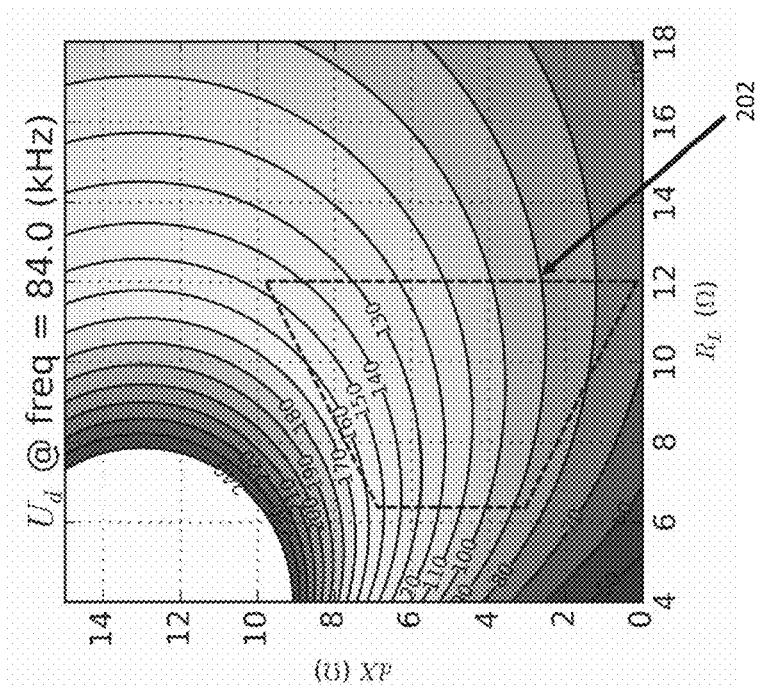

FIG. 2C shows device figure of merit $U_d$ at an operating frequency of 84 kHz as a function of the change in reactance dX (in ohms) at position X3 and load resistance $R_L$ (in ohms). Figure of merit $U_d$ is defined through:

$$\frac{R_{L,eq}}{R_d} = \sqrt{1+U_d^2}$$

where $R_{L,eq}$ is the loaded equivalent series resistance (ESR) (due to device electronics, such as the rectifier, and battery) of the device resonator and $R_d$ is the unloaded ESR of the device resonator. When $U_d$ is set to equal figure of merit U of the system, then the coil-to-coil efficiency can be maximized.

FIG. 2D shows phase ψ (in degrees) at an operating frequency of 84 kHz as a function of the change in reactance (in ohms) and load resistance (in ohms). Phase ψ is defined by:

$$\psi = \arctan\left(\frac{\Delta X_L}{R_{L,eq}}\right)$$

where $\Delta X_L$ is the residual reactance of the loaded device resonator at the operating frequency. A phase ψ=0 means the loaded device resonator is at resonance.

The trapezoidal dotted outline 202 in FIGS. 2C and 2D shows an operating range for a wireless power transfer receiver. Outline 202 in FIG. 2D shows a range of $R_L$ that would be seen for a wireless power transmission system operating at 11 kW output. For example, for $R_L=10\Omega$, there is a significant ability to tune X3, as shown in FIG. 2C by range of dX at $R_L=10\Omega$, while maintaining near resonance (or avoiding detuning the resonator), as shown in FIG. 2D by the proximity of ψ=0 curve to $R_L=10\Omega$.

Referring again to FIG. 1B, controllers 125 and 129 can synchronously tune the IMNs 124 and 126, respectively, to maintain system 100 operations within desired operating ranges such as outline 202. In the illustrated implementations, controllers 125 and 129 perform the processes described below to synchronously tune reactance X3 of the transmitter and receiver IMNs 124 and 126 in order to safely and efficiently transfer power to a device 112 such as an electric vehicle. In order to synchronously control the IMNs 124 and 126, transmitter 102 and receiver 104 can communicate control data between each other. For example, controllers 125 and 129 can include wireless communication interfaces to conduct electronic communications in an out-of-band communications channel. Communications between controllers 125 and 129 can include, but are not limited to, RF communications (e.g., WiFi, Bluetooth, Zigbee), optical communication, infrared communications, ultrasonic communications, or a combination thereof.

For example, as described in more detail below in reference to FIGS. 3-5C, controller 125 can tune transmitter IMN 124 to achieve a target power characteristics of transmitter 102, while controller 129 can tune receiver IMN 126 to achieve a target system efficiency. Transmitter controller 125 adjusts IMN 124 to achieve and maintain target power characteristics of the transmitter 102. Transmitter controller 125 sends input power data to receiver controller 129. Receiver controller 129 measures output power of the receiver 104 and, together with the input power data, calculates the efficiency of the system 100. Receiver controller 129 tunes the receiver IMN 126 to maximize the system efficiency. For example, receiver controller 129 can determine appropriate adjustments to receiver IMN 126 based on comparing a calculated efficiency values at two different times.

In some implementations, transmitter controller 125 operates at a faster rate than receiver controller 129. That is, transmitter controller 125 can tune the transmitter IMN 124 at a faster rate than receiver controller 129 can tune the receiver IMN 126. For example, receiver controller 129 may only be permitted to tune receiver IMN 126 as fast as it receives new input power data from transmitter controller 125.

Figure 3:
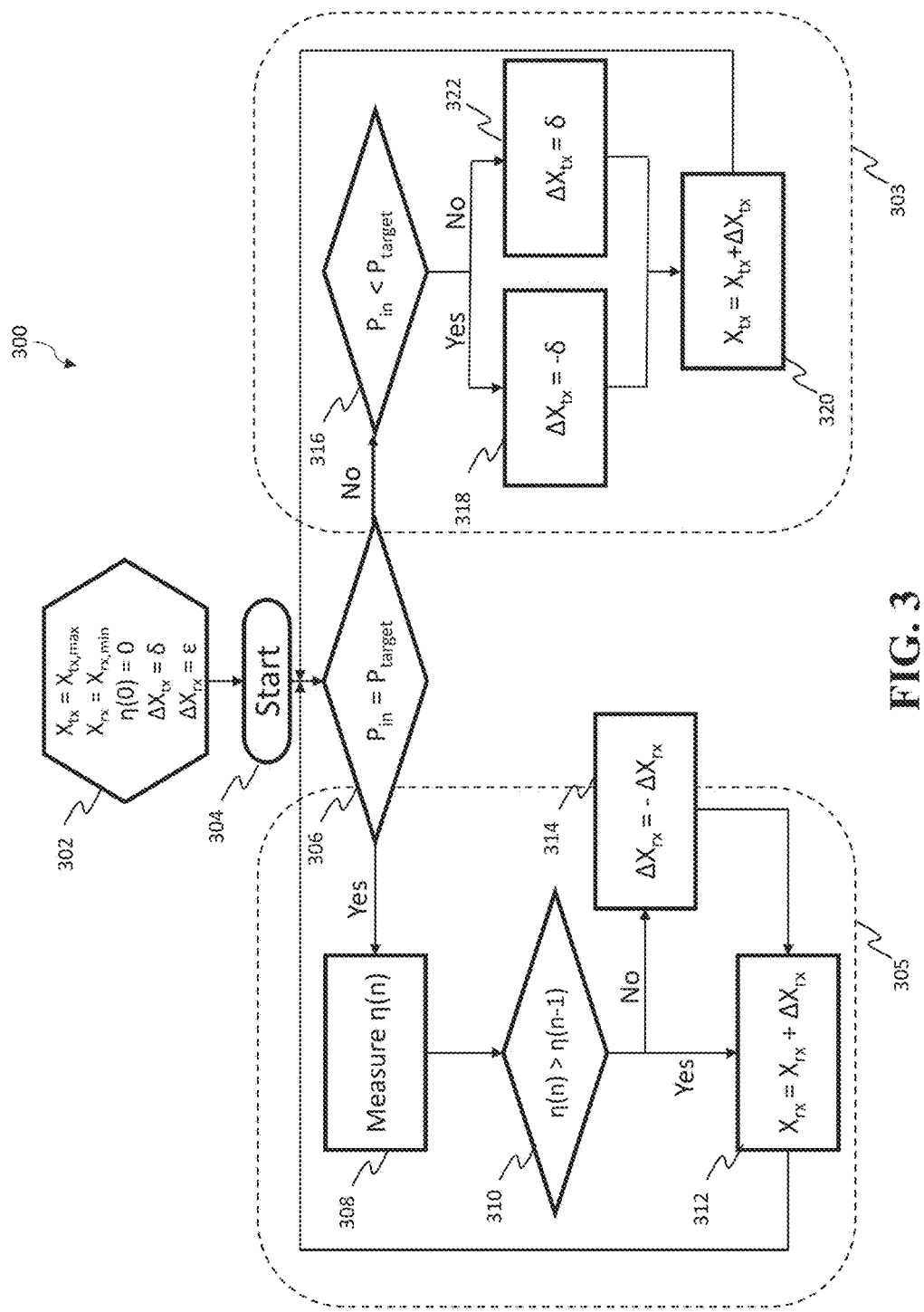
FIG. 3 depicts a flowchart of an exemplary control process for operating a wireless power transmission system.

FIG. 3 depicts a flowchart of an exemplary control process 300 for operating a wireless power transmission system. In some examples, the example process 300 can be provided as computer-executable instructions executed using one or more processing devices (e.g., processors or microcontrollers) or computing devices. In some examples, the process 300 may be executed by hardwired electrical circuitry, for example, as an ASIC or an FPGA controller.

Portions of process 300 are be performed by a wireless power transmitter 102 (e.g., transmitter controller 125) and portions of process 300 are performed by a wireless power receiver 104 (e.g., receiver controller 129). Process 300 includes two control loops 303 and 305. Loop 303 is performed by a transmitter 102 to tune a transmitter IMN 124 by adjusting reactance X3 to control the transmitter power. In some implementations, loop 303 is a local loop that does not require communication with other devices (e.g., receiver 104) to be performed. In some implementations, loop 303 is executed by a transmitter at between 1-10 kHz. Loop 303 can be characterized by:

$$P_{in} = \frac{\frac{8}{\pi^2}V_{bus}^2}{R_{inv}^2 + X_{inv}^2}R_{inv}$$

where $P_{in}$ is the power of the inverter, $V_{bus}$ is the DC bus voltage of the inverter 122, $R_{inv}$ is the effective resistance as seen by the inverter, and $X_{inv}$ is the effective reactance as seen by the inverter.

Loop 305 is performed by a receiver 104 to tune a receiver IMN 126 based on system efficiency. For example, loop 305 can employ a "perturb-and-observe" strategy to improve efficiency by adjusting reactance X3 of a receiver IMN 126 to continually improve efficiency over consecutive iterations. Loop 305 depends on input power data from transmitter 102 to calculate system efficiency at each iteration. In some implementations, loop 305 operates at the rate of communication between transmitter 102 and receiver 104, for example, 40 Hz.

Block 302 lists the inputs and initial conditions for process 300 which include a variable transmitter reactance $X_{tx}$ (e.g., X3 of transmitter IMN 124), set to a maximum reactance value $X_{tx,max}$; a variable receiver reactance $X_{rx}$ (e.g., X3 of receiver IMN 126), set to a minimum reactance value $X_{rx,min}$; a system efficiency η, initially set to zero; a transmitter reactance step size $\Delta X_{tx}$, set to an adjustment value of δ; and a receiver reactance step size $\Delta X_{rx}$, set to an adjustment value of ε. In some implementations, the reactance step sizes $\Delta X_{tx}$ and $\Delta X_{rx}$ are constant values. In some implementations, the reactance step sizes $\Delta X_{tx}$ and $\Delta X_{rx}$ can be variable. For example, controller 125 or controller 129 can increase or decrease the magnitude of the respective step sizes dynamically during process 300.

Process 300 starts at step 304. At step 306 the power of the transmitter 102 is measured. Transmitter controller 125 measures the input power $P_{in}$, and, at step 306, compares the input power $P_{in}$ to a target power level $P_{target}$. If $P_{in}$ equals $P_{target}$ the process 300 proceeds to step 308 of loop 305. If $P_{in}$ does not equal $P_{target}$, process 300 proceeds to step 316 of loop 303. In some implementations or some operation modes, the target power level is set by the transmitter 102. In some implementations or some operation modes, the target power level is set by the receiver 104. For example, when in steady-state operations (e.g., normal operations apart from startup or shutdown sequences), system 100 can operate as a demand based system. For example, receiver 104 can request power levels from the transmitter 102. Transmitter controller 125 can calculate a target input power level based on the demanded power level from the receiver 104. For example, transmitter controller 125 can convert the demanded power to a target input power level that would be required to transmit the demanded power level by accounting for expected losses in the transmitter (e.g., IMN losses and inverter losses).

Referring first to the transmitter-side loop, loop 303, if the input power of the transmitter (e.g., the inverter power) is not equal to the target power, at step 316 transmitter controller 125 compares the input power to the target power level to determine whether the input power is less than the target power level. If $P_{in}$ is less than $P_{target}$, then, at step 318, transmitter controller 125 sets the transmitter reactance step size $\Delta X_{tx}$, to a negative adjustment value to decrease the variable transmitter reactance $X_{tx}$, in step 320. If $P_{in}$ is not less than $P_{target}$, then, at step 322, transmitter controller 125 sets the transmitter reactance step size $\Delta X_{tx}$, to a positive adjustment value to increase the variable transmitter reactance $X_{tx}$ in step 320. In some implementations, the magnitude of the reactance adjustment value δ can be varied. For example, if the difference between $P_{in}$ and $P_{target}$ is large, for example, greater than a coarse adjustment threshold value, then the transmitter controller 125 can increase the magnitude of the reactance adjustment value δ. Correspondingly, if the difference between $P_{in}$ and $P_{target}$ is small, for example, less than a fine adjustment threshold value, then the transmitter controller 125 can decrease the magnitude of the reactance adjustment value δ. After the variable transmitter reactance $X_{tx}$ is adjusted in step 320, loop 303 returns to step 306, where the input power is again compared to the target power level.

Referring to the receiver-side loop, loop 305, if the input power of the transmitter is equal to the target power, at step 308, the receiver controller 129 measures the efficiency of the system 100. For example, when $P_{in}$ is equal to $P_{target}$, the transmitter can send data indicating the measured value of $P_{in}$ to the receiver 104. (It should be noted that measured transmitter power can be represented by a floating point number and, thus, may not exactly equal the target power, but may be equivalent within a predetermined tolerance.) Receiver controller 129 measures the output power of the receiver, and calculates the system efficiency η(n) at time n based on the received transmitter power data and the measured receiver output power value.

At step 310, receiver controller 129 compares the system efficiency calculated at time n, to the system efficiency calculated at a previous time n−1. If the efficiency at time n is greater than the efficiency at time n−1, then, at step 312, the variable receiver reactance $X_{rx}$ is adjusted by the receiver reactance step size $\Delta X_{rx}$. For example, the change in receiver reactance $\Delta X_{rx}$ is added to the variable receiver reactance X. If the efficiency at time n is not greater than the efficiency at time n−1, then, at step 314, receiver controller 129 changes the sign of the receiver reactance step size $\Delta X_{rx}$ before adjusting the variable receiver reactance $X_{rx}$ at step 312. For example, the value of the change in receiver reactance ε can be negated. For example, the direction of adjustments for the variable receiver reactance $X_{rx}$ is swapped when the efficiency is no longer increasing between subsequent iterations of loop 305. As illustrated in by loop 305, direction of adjustments for the variable receiver reactance $X_{rx}$ will then be retained in subsequent iterations of loop 305 until efficiency decreases again, thereby, maintaining a near-maximum system efficiency.

In some implementations, the magnitude of the reactance adjustment value ε can be varied. For example, if the efficiency at time n is less than a coarse adjustment threshold value (e.g., soon after system startup), then the receiver controller 129 can increase the magnitude of the reactance adjustment value ε. Correspondingly, if the efficiency at time n is near an estimated maximum value for example, within a fine adjustment threshold of the estimated maximum value, then the receiver controller 129 can decrease the magnitude of the reactance adjustment value ε.

Figure 4:
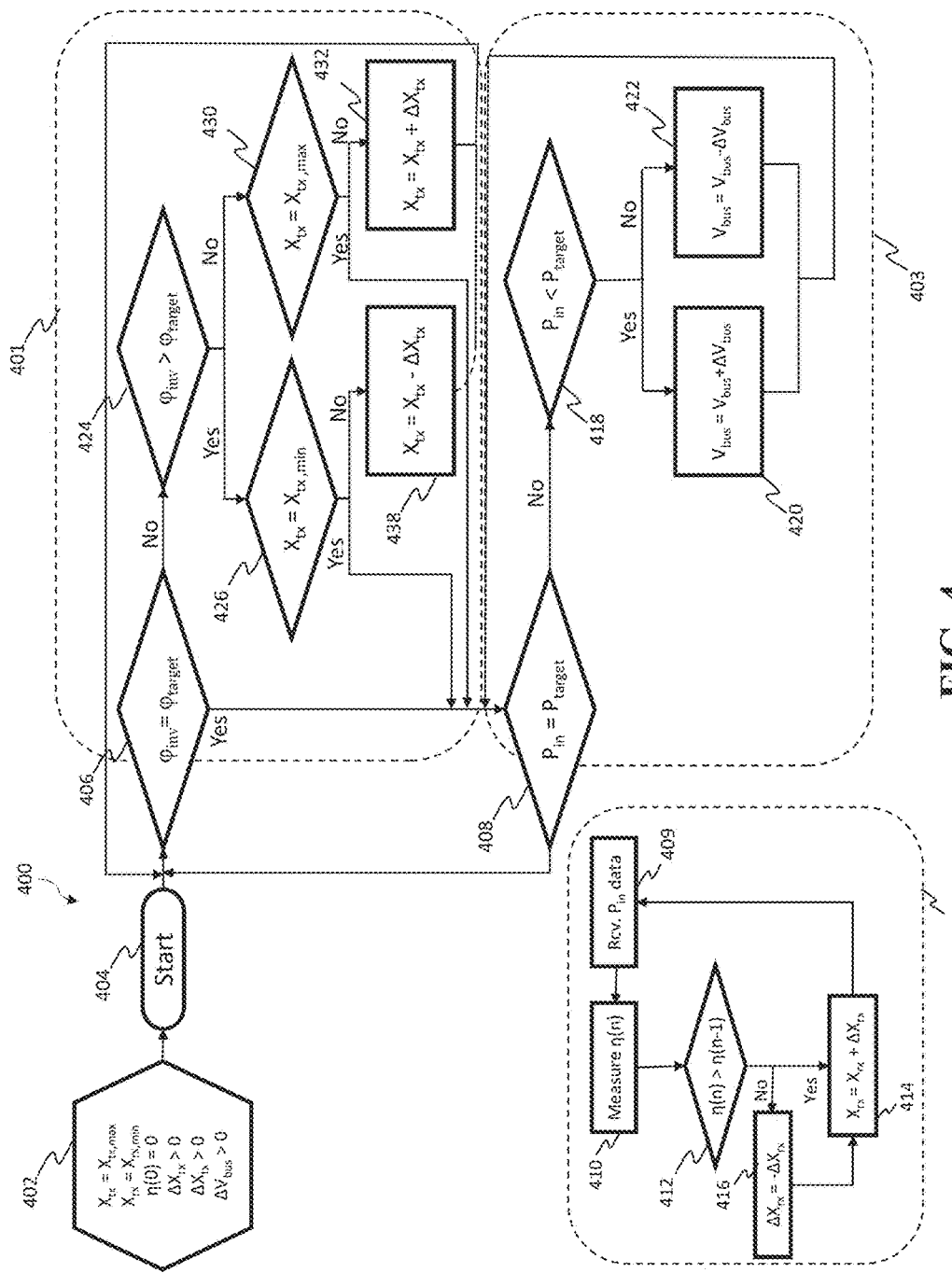
FIG. 4 depicts a flowchart of another exemplary control process for operating a wireless power transmission system.

FIG. 4 depicts a flowchart of an exemplary control process 400 for operating a wireless power transmission system. In some examples, the example process 400 can be provided as computer-executable instructions executed using one or more processing devices (e.g., processors or microcontrollers) or computing devices. In some examples, the process 400 may be executed by hardwired electrical circuitry, for example, as an ASIC or an FPGA controller.

Process 400 is similar to process 300, but includes control of inverter bus voltage $V_{bus}$ to adjust transmitter power $P_{in}$, and measurements of and the use of inverter power factor (e.g., inverter AC voltage $V_{AC}$ and inverter AC current $I_{AC}$ phase difference φ) to tune the transmitter IMN 124.

Portions of process 400 are be performed by a wireless power transmitter 102 (e.g., transmitter controller 125) and portions of process 400 are performed by a wireless power receiver 104 (e.g., receiver controller 129). Process 400 includes three control loops 401, 403, and 405. Loops 401 and 403 are performed by a transmitter 102 to tune a transmitter IMN 124 and to control the transmitter power. Loop 401 is a phase loop that tunes the transmitter IMN 124 by adjusting reactance X3 to achieve a target phase φ relationship between the inverter AC output voltage and inverter AC output current (e.g., inverter power factor), hereinafter referred to as "inverter output phase $φ_{in}$," and "target inverter output phase $φ_{target}$." Loop 403 is a power control loop that controls and maintains the transmitter power magnitude $P_{in}$ at or near the target power $P_{target}$ by adjusting the inverter bus voltage $V_{bus}$. In some implementations, loops 401 and 403 are local loops that do not require communication with other devices (e.g., receiver 104) to be performed. In some implementations, loops 401 and 403 are executed by a transmitter at between 1-10 kHz. Loops 401 and 403 can be characterized by:

$$P_{in} = \frac{\frac{8}{\pi^2} V_{bus}^2}{R_{inv}^2 + X_{inv}^2} R_{inv}$$

where $P_{in}$ is the power of the inverter, $V_{bus}$ is the DC bus voltage of the inverter 122, $R_{inv}$ is the effective resistance as seen by the inverter, and $X_{inv}$ is the effective reactance as seen by the inverter.

Loop 405 is performed by a receiver 104 to tune a receiver IMN 126 based on system efficiency. Loop 405 is similar to loop 305 of process 300. For example, loop 405 can employ a "perturb-and-observe" strategy to improve efficiency by adjusting reactance X3 of a receiver IMN 126 to continually improve efficiency over consecutive iterations. Loop 405 depends on input power data from transmitter 102 to calculate system efficiency at each iteration. In some implementations, loop 405 operates at the rate of communication between transmitter 102 and receiver 104, for example, 40 Hz.

Block 402 lists the inputs and initial conditions for process 400 which include a variable transmitter reactance $X_{tx}$ (e.g., X3 of transmitter IMN 124), set to a maximum reactance value $X_{tx,max}$; a variable receiver reactance $X_{rx}$ (e.g., X3 of receiver IMN 126), set to a minimum reactance value $X_{rx,min}$; a system efficiency η, initially set to zero; a transmitter reactance step size $\Delta X_{tx}$, set to an adjustment value greater than zero; a receiver reactance step size $\Delta X_{rx}$, set to an adjustment value greater than zero; and a bus voltage step size $\Delta V_{bus}$ set to an adjustment value greater than zero. In some implementations, the reactance step sizes $\Delta X_{tx}$ and $\Delta X_{rx}$ and bus voltage step size $\Delta V_{bus}$ are constant values. In some implementations, the reactance step sizes $\Delta X_{tx}$ and $\Delta X_{rx}$ and bus voltage step size $\Delta V_{bus}$ can be variable. For example, controller 125 or controller 129 can increase or decrease the magnitude of the respective step sizes dynamically during process 400.

Process 400 starts at step 404. At step 406, transmitter controller 125 measures the inverter output phase $\varphi_{inv}$, and compares the measured inverter output phase $\varphi_{inv}$ to a target inverter output phase $\varphi_{target}$. If $\varphi_{inv}$ equals $\varphi_{target}$ the process 400 proceeds to step 408 of loop 403. If $\varphi_{inv}$ does not equal $\varphi_{target}$ the process 400 proceeds to step 424 of loop 401. In some implementations, $\varphi_{target}$ is slightly greater than 0 so the inverter still sees a slightly inductive load.

Referring first to phase loop, loop 401, if the inverter output phase is not equal to the target inverter output phase, at step 406 transmitter controller 125 compares the inverter output phase to the target inverter output phase, at step 424, to determine whether the inverter output phase is greater than the target inverter output phase. If $\varphi_{inv}$ is greater than $\varphi_{target}$, then, at step 426, transmitter controller 125 checks whether the variable transmitter reactance $X_{tx}$ is already at a minimum value $X_{tx,min}$. If the variable transmitter reactance $X_{tx}$ is already at a minimum value $X_{tx,min}$, then loop 401 proceeds to step 408 with no adjustment to the variable transmitter reactance $X_{tx}$. If the variable transmitter reactance $X_{tx}$ is not at a minimum value $X_{tx,min}$, then, at step 332, transmitter controller 125 decrements the variable transmitter reactance $X_{tx}$ by the transmitter reactance step size $\Delta X_{tx}$, and loop 401 reverts back to step 406 to reevaluate the inverter output phase.

If, at step 424, $\varphi_{inv}$ is not greater than $\varphi_{target}$, then, at step 430, transmitter controller 125 checks whether the variable transmitter reactance $X_{tx}$ is already at a maximum value $X_{tx,max}$. If the variable transmitter reactance $X_{tx}$ is already at a maximum value $X_{tx,max}$, then loop 401 proceeds to step 408 with no adjustment to the variable transmitter reactance X. If the variable transmitter reactance $X_{tx}$ is not at a maximum value $X_{tx,max}$, then, at step 420, transmitter controller 125 increments the variable transmitter reactance $X_{tx}$ by the transmitter reactance step size $\Delta X_{tx}$, and loop 401 reverts back to step 406 to reevaluate the inverter output phase.

Referring to the power loop, loop 403, at step 408 transmitter controller 125 measures the input power $P_{in}$, and compares the measured input power $P_{in}$ to a target power level $P_{target}$. If $P_{in}$ equals $P_{target}$ the process 400 reverts to step 406 of loop 401. In addition, transmitter controller 125 can send data indicating the measured value of $P_{in}$ to the receiver 104. If $P_{in}$ does not equal $P_{target}$, process 400 proceeds to step 418. In some implementations or some operation modes, the target power level is set by the transmitter 102. In some implementations or some operation modes, the target power level is set by the receiver 104. For example, when in steady-state operations (e.g., normal operations apart from startup or shutdown sequences), system 100 can operate as a demand based system. For example, receiver 104 can request power levels from the transmitter 102. Transmitter controller 125 can calculate a target input power level based on the demanded power level from the receiver 104. For example, transmitter controller 125 can convert the demanded power to a target input power level that would be required to transmit the demanded power level by accounting for expected losses in the transmitter (e.g., IMN losses and inverter losses).

If the power of the transmitter is not equal to the target power, at step 418 transmitter controller 125 compares the input power to the target power level to determine whether the input power is less than the target power level. If $P_{in}$ is less than $P_{target}$, then, at step 420, transmitter controller 125 increments the inverter bus voltage $V_{bus}$ by the bus voltage step size $\Delta V_{bus}$, and loop 403 reverts back to step 408 to reevaluate the power of the transmitter. If $P_{in}$ is not less than $P_{target}$, then, at step 422, transmitter controller 125 decrements the inverter bus voltage $V_{bus}$ by the bus voltage step size $\Delta V_{bus}$, and loop 403 reverts back to step 408 to reevaluate the power of the transmitter.

In some implementations, the magnitude of the transmitter reactance step size $\Delta X_{tx}$ can be varied. For example, if the difference between $\varphi_{inv}$ and $\varphi_{target}$ is large, for example, greater than a coarse adjustment threshold value, then the transmitter controller 125 can increase the transmitter reactance step size $\Delta X_{tx}$. Correspondingly, if the difference between $\varphi_{inv}$ and $\varphi_{target}$ is small, for example, less than a fine adjustment threshold value, then the transmitter controller 125 can decrease the magnitude of the transmitter reactance step size $\Delta X_{tx}$.

In some implementations, the magnitude of the bus voltage step size $\Delta V_{bus}$ can be varied. For example, if the difference between $P_{in}$ and $P_{target}$ is large, for example, greater than a coarse adjustment threshold value, then the transmitter controller 125 can increase the bus voltage step size $\Delta V_{bus}$. Correspondingly, if the difference between $P_{in}$ and $P_{target}$ is small, for example, less than a fine adjustment threshold value, then the transmitter controller 125 can decrease the magnitude of the bus voltage step size $\Delta V_{bus}$.

Referring to the receiver-side loop, loop 405, at step 409 receiver 104 receives transmitter power data. For example, when $P_{in}$ is equal to $P_{target}$ at step 408, the transmitter 102 can send data indicating the measured value of $P_{in}$ to the receiver 104. At step 410, the receiver controller 129 measures the efficiency of the system 100. Receiver controller 129 measures the output power of the receiver 104, and calculates the system efficiency η(n) at time n based on the received transmitter power data and the measured receiver output power value.

At step 412, receiver controller 129 compares the system efficiency calculated at time n, to the system efficiency calculated at a previous time n−1. If the efficiency at time n is greater than the efficiency at time n−1, then, at step 414, the variable receiver reactance $X_{rx}$ is adjusted by the receiver reactance step size $\Delta X_{rx}$. For example, the change in receiver reactance $\Delta X_{rx}$ is added to the variable receiver reactance $X_{rx}$. If the efficiency at time n is not greater than the efficiency at time n−1, then, at step 416, receiver controller 129 changes the sign of the receiver reactance step size $\Delta X_{rx}$ before adjusting the variable receiver reactance $X_{rx}$ at step 414. For example, the value of the receiver reactance step size $\Delta X_{rx}$ can be negated. For example, the direction of adjustments for the variable receiver reactance $X_{rx}$ is swapped when the efficiency is no longer increasing between subsequent iterations of loop 405. As illustrated in by loop 405, direction of adjustments for the variable receiver reactance $X_{rx}$ will then be retained in subsequent iterations of loop 405 until efficiency decreases again, thereby, maintaining a near-maximum system efficiency.

In some implementations, the magnitude of the receiver reactance step size $\Delta X_{rx}$ can be varied. For example, if the efficiency at time n is less than a coarse adjustment threshold value (e.g., soon after system startup), then the receiver controller 129 can increase the magnitude of the receiver reactance step size $\Delta X_{rx}$. Correspondingly, if the efficiency at time n is near an estimated maximum value for example, within a fine adjustment threshold of the estimated maximum value, then the receiver controller 129 can decrease the magnitude of the receiver reactance step size $\Delta X_{rx}$.

Figure 5A:
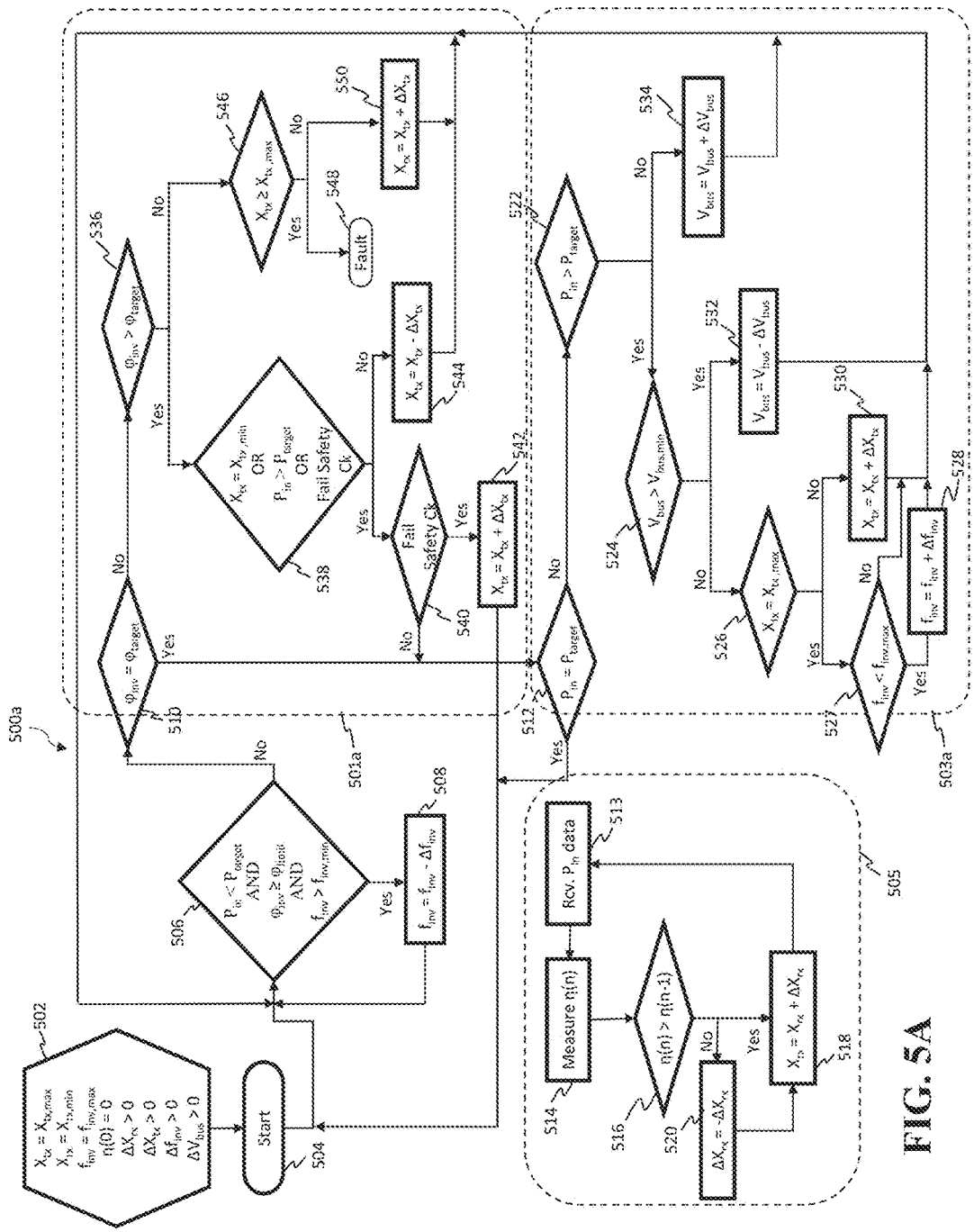
FIGS. 5A-5C depict more detailed flowcharts of exemplary control processes for operating control loop for tuning a wireless power transmission system.
Figure 5B:
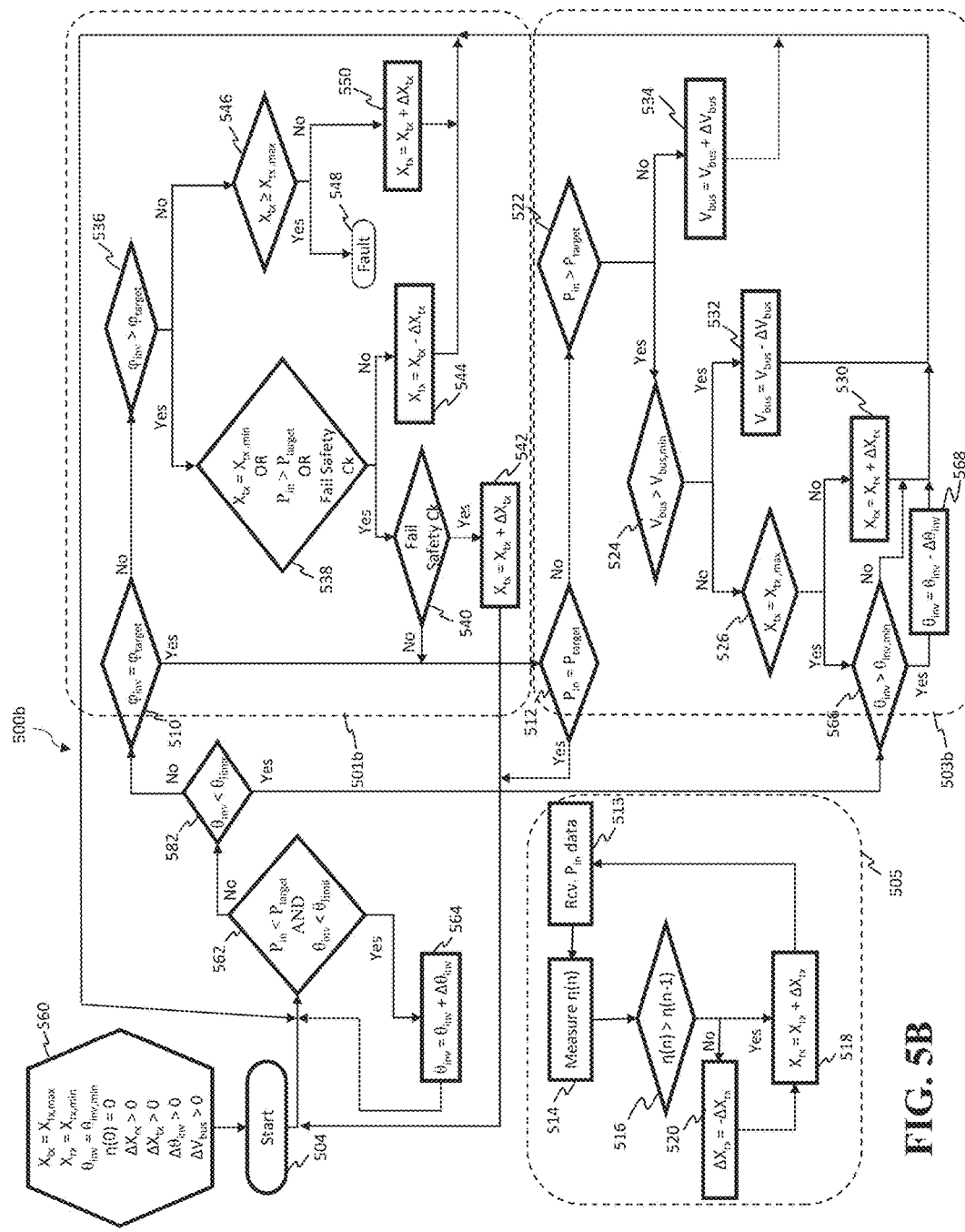
Figure 5C:
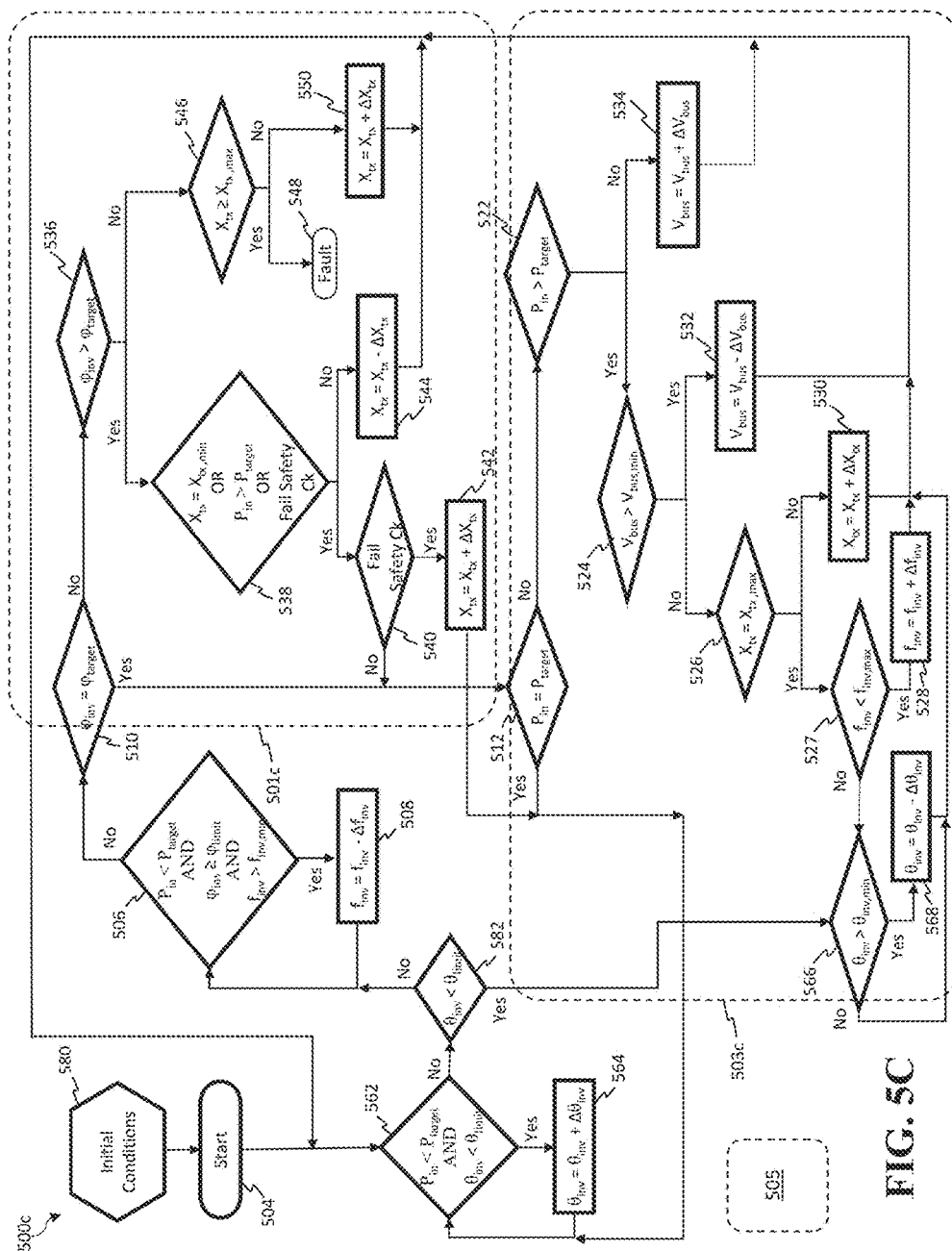

FIGS. 5A-5C depicts a flowchart of an exemplary control processes 500a, 500b, and 500c for operating a wireless power transmission system. In some examples, the processes 500a, 500b, and 500c can be provided as computer-executable instructions executed using one or more processing devices (e.g., processors or microcontrollers) or computing devices. In some examples, the processes 500a, 500b, and 500c may be executed by hardwired electrical circuitry, for example, as an ASIC or an FPGA controller. Processes 500a, 500b, and 500c are related to processes 300 and 400, but include additional steps that evaluate and control additional system parameters to operate a wireless power transmission system.

Referring to FIG. 5A, process 500a includes portions that are be performed by a wireless power transmitter 102 (e.g., transmitter controller 125) and portions that are performed by a wireless power receiver 104 (e.g., receiver controller 129). Process 500a includes three control loops 501a, 503a, and 505. Loops 501a and 503a are performed by a transmitter 102 to tune a transmitter IMN 124 and to control the transmitter power. Loop 501a is a phase loop that tunes the transmitter IMN 124 by adjusting reactance X3 to achieve a target inverter output phase $\varphi_{target}$. Loop 501a also includes safety checks to ensure that current, voltage, or other device limitations are not exceeded. Loop 503a is a power control loop that controls and maintains the transmitter power magnitude $P_{in}$ at or near the target power $P_{target}$ by adjusting the inverter bus voltage $V_{bus}$. Loop 503a also incorporates adjustments to inverter frequency $f_{inv}$ to control transmitter power. In some implementations, loops 501a and 503a are local loops that do not require communication with other devices (e.g., receiver 104) to be performed. In some implementations, loops 501a and 503a are executed by a transmitter at between 1-10 kHz.

Loop 505 is performed by a receiver 104 to tune a receiver IMN 126 based on system efficiency. Loop 505 is the same as loop 405 of process 400 the operation of which is described above.

Block 502 lists the inputs and initial conditions for process 500a which include a variable transmitter reactance $X_{tx}$ (e.g., X3 of transmitter IMN 124), set to a maximum reactance value $X_{tx,max}$; a variable receiver reactance $X_{rx}$ (e.g., X3 of receiver IMN 126), set to a minimum reactance value $X_{rx,min}$; an inverter frequency $f_{inv}$, set to a maximum frequency $f_{inv,max}$; a system efficiency η, initially set to zero; a transmitter reactance step size $\Delta X_{tx}$, set to an adjustment value greater than zero; a receiver reactance step size $\Delta X_{rx}$, set to an adjustment value greater than zero; an inverter frequency step size $\Delta f_{inv}$ set to an adjustment value greater than zero; and a bus voltage step size $\Delta V_{bus}$ set to an adjustment value greater than zero. In some implementations, the reactance step sizes $\Delta X_{tx}$ and $\Delta X_{rx}$, bus voltage step size $\Delta V_{bus}$, and inverter frequency step size $\Delta f_{inv}$ are constant values. In some implementations, the reactance step sizes $\Delta X_{tx}$ and $\Delta X_{rx}$, bus voltage step size $\Delta V_{bus}$, and inverter frequency step size $\Delta f_{inv}$ can be variable. For example, controller 125 or controller 129 can increase or decrease the magnitude of the respective step sizes dynamically during process 500a.

Process 500a starts at step 504. At step 506, transmitter controller 125 performs several checks while tuning the inverter frequency in step 508. Transmitter controller 125 compares the measured input power $P_{in}$ to a target power level $P_{target}$, the measured inverter output phase $\varphi_{inv}$ to an inverter output phase limit $\varphi_{limit}$ (e.g., 45 degrees), and the inverter frequency $f_{inv}$ to the minimum inverter frequency $f_{inv,min}$. When all of the comparisons in step 506 are true, then transmitter controller 125 decrements the inverter frequency $f_{inv}$ by inverter frequency step size $\Delta f_{inv}$ at step 508. If any of the comparisons are false, the process 500a proceeds to step 510 of loop 501a.

Referring to phase loop, loop 501a, if the inverter output phase is not equal to the target inverter output phase, at step 510 transmitter controller 125 compares the inverter output phase to the target inverter output phase, at step 536, to determine whether the inverter output phase is greater than the target inverter output phase. If $\varphi_{inv}$ is greater than $\varphi_{target}$, then, at step 538, transmitter controller 125 performs several additional checks. At step 538, transmitter controller 125 checks whether the variable transmitter reactance $X_{tx}$ is already at a minimum value $X_{tx,min}$; whether $P_{in}$ is greater than $P_{target}$, or whether a safety check has failed. The safety check can be, for example, an over voltage or over current check. If any of the checks are true, then loop 501a proceeds to an additional safety check at step 540. The safety check at step 540 can be the same safety check as performed at step 538, for example, to determine whether the safety check at step 538 was the check that caused the transmitter controller 125 to proceed to step 540. If so, then transmitter controller 125 increments the variable transmitter reactance $X_{tx}$ by the transmitter reactance step size $\Delta X_{tx}$, and loop 501a reverts back to step 506. If not, then loop 501a proceeds to step 512 of loop 503a to adjust the transmitter power. If all of the checks at step 538 are false, then transmitter controller 125 decrements the variable transmitter reactance $X_{tx}$ by the transmitter reactance step size $\Delta X_{tx}$ and loop 501a reverts back to step 506.

Referring back to step 536, if $\varphi_{inv}$ is not greater than $\varphi_{target}$, then, at step 546, transmitter controller 125 checks whether the variable transmitter reactance $X_{tx}$ is already at a maximum value $X_{tx,max}$. If the variable transmitter reactance $X_{tx}$ is already at a maximum value $X_{tx,max}$, then loop 501a issue a fault condition 548. If the variable transmitter reactance $X_{tx}$ is not at a maximum value $X_{tx,max}$, then, at step 550, transmitter controller 125 increments the variable transmitter reactance $X_{tx}$ by the transmitter reactance step size $\Delta X_{tx}$, and loop 501a reverts back to step 506.

Referring to the power loop, loop 503a, at step 512 transmitter controller 125 measures the input power $P_{in}$, and compares the measured input power $P_{in}$ to a target power level $P_{target}$. If $P_{in}$ equals $P_{target}$ the process 500a reverts to step 506. In addition, transmitter controller 125 can send data indicating the measured value of $P_{in}$ to the receiver 104. If $P_{in}$ does not equal $P_{target}$ process 500a proceeds to step 522. At step 522, transmitter controller 125 compares the input power to the target power level to determine whether the input power is greater than the target power level. If $P_{in}$ is not greater than $P_{target}$, then, at step 534, transmitter controller 125 increments the inverter bus voltage $V_{bus}$ by the bus voltage step size $\Delta V_{bus}$, and loop 503a reverts back to step 506. If $P_{in}$ is greater than $P_{target}$, then, at step 524, transmitter controller 125 checks the bus voltage. If the bus voltage $V_{bus}$ is greater than a minimum bus voltage $V_{bus,min}$, then, at step 532, transmitter controller 125 decrements the inverter bus voltage $V_{bus}$ by the bus voltage step size $\Delta V_{bus}$, and loop 503a reverts back to step 506.

If, at step 524, the bus voltage $V_{bus}$ is at a minimum bus voltage $V_{bus,min}$, then the transmitter controller 125 reduces the transmitter power by adjusting either the variable transmitter reactance $X_{tx}$ or the inverter frequency $f_{inv}$. At step 526, transmitter controller 125 checks whether the variable transmitter reactance $X_{tx}$ is already at a maximum value $X_{tx,max}$. If the variable transmitter reactance $X_{tx}$ is not at a maximum value $X_{tx,max}$, then, at step 530, transmitter controller 125 increments the variable transmitter reactance $X_{tx}$ by the transmitter reactance step size $\Delta X_{tx}$, and loop 501 reverts back to step 506. If the variable transmitter reactance $X_{tx}$ is already at a maximum value $X_{tx,max}$, then the transmitter controller 125 checks whether the inverter frequency $f_{inv}$ is less than a maximum inverter frequency $f_{inv,max}$ at step 527. If the inverter frequency $f_{inv}$ is already at a maximum value $f_{inv,max}$, then loop 503a reverts to step 506 with no adjustments to the bus voltage $V_{bus}$, the variable transmitter reactance $X_{tx}$, or the inverter frequency $f_{inv}$. If the inverter frequency $f_{inv}$ is not already at a maximum value $f_{inv,max}$, then, at step 528, transmitter controller 125 increments the inverter frequency $f_{inv}$ by the frequency step size $\Delta f_{inv}$, and loop 503a reverts back to step 506.

Referring to FIG. 5B, process 500b differs from process 500a by monitoring and controlling inverter phase shift $\theta_{inv}$ instead of inverter frequency $f_{inv}$. For example, in some implementations, inverter power can be controlled by adjusting the internal phase shift $\theta_{inv}$ between bridge circuits in the inverter. In such implementations, a phase shift $\theta_{inv}$ of zero degrees may produce a minimum (e.g., zero) inverter power, and a phase shift $\theta_{inv}$ of 180 degrees may produce a maximum inverter power for a given bus voltage $V_{bus}$. More specifically, in process 500b steps 560, 562, 564, 566, and 568 replace steps 502, 506, 508, 527, and 528 of process 500a, respectively.

Process 500b includes portions that are be performed by a wireless power transmitter 102 (e.g., transmitter controller 125) and portions that are performed by a wireless power receiver 104 (e.g., receiver controller 129). Process 500b includes three control loops 501b, 503b, and 505. Loops 501b and 503b are performed by a transmitter 102 to tune a transmitter IMN 124 and to control the transmitter power. Loop 501b is a phase loop that tunes the transmitter IMN 124 by adjusting reactance X3 to achieve a target inverter output phase $\varphi_{target}$. Loop 501b also includes safety checks to ensure that current, voltage, or other device limitations are not exceeded. Loop 503b is a power control loop that controls and maintains the transmitter power magnitude $P_{in}$ at or near the target power $P_{target}$ by adjusting the inverter bus voltage $V_{bus}$. Loop 503b also incorporates adjustments to inverter phase shift $\theta_{inv}$ to control transmitter power. In some implementations, loops 501b and 503b are local loops that do not require communication with other devices (e.g., receiver 104) to be performed. In some implementations, loops 501b and 503b are executed by a transmitter at between 1-10 kHz.

Loop 505 is performed by a receiver 104 to tune a receiver IMN 126 based on system efficiency. Loop 505 is the same as loop 405 of process 400 the operation of which is described above.

Block 560 lists the inputs and initial conditions for process 500b which include a variable transmitter reactance $X_{tx}$ (e.g., X3 of transmitter IMN 124), set to a maximum reactance value $X_{tx,max}$; a variable receiver reactance $X_{rx}$ (e.g., X3 of receiver IMN 126), set to a minimum reactance value $X_{rx,min}$; an inverter phase shift $\theta_{inv}$, set to a minimum phase shift $\theta_{inv,min}$; a system efficiency $\eta$, initially set to zero; a transmitter reactance step size $\Delta X_{tx}$, set to an adjustment value greater than zero; a receiver reactance step size $\Delta X_{rx}$, set to an adjustment value greater than zero; an inverter phase shift step size $\Delta \theta_{inv}$ set to an adjustment value greater than zero; and a bus voltage step size $\Delta V_{bus}$ set to an adjustment value greater than zero. In some implementations, the reactance step sizes $\Delta X_{tx}$ and $\Delta X_{rx}$, bus voltage step size $\Delta V_{bus}$, and inverter phase shift step size $\Delta \theta_{inv}$ are constant values. In some implementations, the reactance step sizes $\Delta X_{tx}$ and $\Delta X_{rx}$, bus voltage step size $\Delta V_{bus}$, and inverter phase shift step size $\Delta \theta_{inv}$ can be variable. For example, controller 125 or controller 129 can increase or decrease the magnitude of the respective step sizes dynamically during process 500b.

Process 500b starts at step 504. At step 562, transmitter controller 125 performs several checks while tuning the inverter phase shift in step 564. Transmitter controller 125 compares the measured input power $P_{in}$ to a target power level $P_{target}$ and the inverter phase shift $\theta_{inv}$ to a phase shift limit $\theta_{limit}$ (e.g., 180 degrees). When all of the comparisons in step 564 are true, then transmitter controller 125 increments the inverter phase shift $\theta_{inv}$ by inverter phase shift step size $\Delta \theta_{inv}$ at step 564. If any of the comparisons are false, at step 582, transmitter controller 125 checks whether the inverter phase shift $\theta_{inv}$ is less than the phase shift limit $\theta_{limit}$. If so, process 500b proceeds to step 566. If not, process 500b proceeds to step 510 of loop 501b.

Referring to phase loop, loop 501b, if the inverter output phase is not equal to the target inverter output phase, at step 510 transmitter controller 125 compares the inverter output phase to the target inverter output phase, at step 536, to determine whether the inverter output phase is greater than the target inverter output phase. If $\varphi_{inv}$ is greater than $\varphi_{target}$, then, at step 538, transmitter controller 125 performs several additional checks. At step 538, transmitter controller 125 checks whether the variable transmitter reactance $X_{tx}$ is already at a minimum value $X_{tx,min}$; whether $P_{in}$ is greater than $P_{target}$, or whether a safety check has failed. The safety check can be, for example, an over voltage or over current check. If any of the checks are true, then loop 501b proceeds to an additional safety check at step 540. The safety check at step 540 can be the same safety check as performed at step 538, for example, to determine whether the safety check at step 538 was the check that caused the transmitter controller 125 to proceed to step 540. If so, then transmitter controller 125 increments the variable transmitter reactance $X_{tx}$ by the transmitter reactance step size $\Delta X_{tx}$, and loop 501b reverts back to step 562. If not, then loop 501b proceeds to step 512 of loop 503b to adjust the transmitter power. If all of the checks at step 538 are false, then transmitter controller 125 decrements the variable transmitter reactance $X_{tx}$ by the transmitter reactance step size $\Delta X_{tx}$, and loop 501b reverts back to step 562.

Referring back to step 536, if $\theta_{inv}$ is not greater than $\varphi_{target}$, then, at step 546, transmitter controller 125 checks whether the variable transmitter reactance $X_{tx}$ is already at a maximum value $X_{tx,max}$. If the variable transmitter reactance $X_{tx}$ is already at a maximum value $X_{tx,max}$, then loop 501b issue a fault condition 548. If the variable transmitter reactance $X_{tx}$ is not at a maximum value $X_{tx,max}$, then, at step 550, transmitter controller 125 increments the variable transmitter reactance $X_{tx}$ by the transmitter reactance step size $\Delta X_{tx}$, and loop 501b reverts back to step 562.

Referring to the power loop, loop 503b, at step 512 transmitter controller 125 measures the input power $P_{in}$, and compares the measured input power $P_{in}$ to a target power level $P_{target}$. If $P_{in}$ equals $P_{target}$ the process 500b reverts to step 562. In addition, transmitter controller 125 can send data indicating the measured value of $P_{in}$ to the receiver 104. If $P_{in}$ does not equal $P_{target}$, process 500b proceeds to step 522. At step 522, transmitter controller 125 compares the input power to the target power level to determine whether the input power is greater than the target power level. If $P_{in}$ is not greater than $P_{target}$, then, at step 534, transmitter controller 125 increments the inverter bus voltage $V_{bus}$ by the bus voltage step size $\Delta V_{bus}$, and loop 503b reverts back to step 562. If $P_{in}$ is greater than $P_{target}$, then, at step 524, transmitter controller 125 checks the bus voltage. If the bus voltage $V_{bus}$ is greater than a minimum bus voltage $V_{bus,min}$, then, at step 532, transmitter controller 125 decrements the inverter bus voltage $V_{bus}$ by the bus voltage step size $\Delta V_{bus}$, and loop 503b reverts back to step 562.

If, at step 524, the bus voltage $V_{bus}$ is at a minimum bus voltage $V_{bus,min}$, then the transmitter controller 125 reduces the transmitter power by adjusting either the variable transmitter reactance $X_{tx}$ or the inverter phase shift $\theta_{inv}$. At step 526, transmitter controller 125 checks whether the variable transmitter reactance $X_{tx}$ is already at a maximum value $X_{tx,max}$. If the variable transmitter reactance $X_{tx}$ is not at a maximum value $X_{tx,max}$, then, at step 530, transmitter controller 125 increments the variable transmitter reactance $X_{tx}$ by the transmitter reactance step size $\Delta X_{tx}$, and loop 501b reverts back to step 562. If the variable transmitter reactance $X_{tx}$ is already at a maximum value $X_{tx,max}$, then the transmitter controller 125 checks whether the inverter phase shift $\theta_{inv}$ is greater than a minimum inverter phase shift $\theta_{inv,min}$ at step 566. If the inverter phase shift $\theta_{inv}$ is already at a minimum value $\theta_{inv,min}$, then loop 503b reverts to step 562 with no adjustments to the bus voltage $V_{bus}$, the variable transmitter reactance $X_{tx}$, or the inverter phase shift $\theta_{inv}$. If the inverter phase shift $\theta_{inv}$ is not already at a minimum value $\theta_{inv,min}$, then, at step 568, transmitter controller 125 decrements the inverter phase shift $\theta_{inv}$ by the phase shift step size $\Delta \theta_{inv}$, and loop 503b reverts back to step 562.

Referring to FIG. 5C, process 500c combines aspects of processes 500a and 500b. Process 500c includes portions that are be performed by a wireless power transmitter 102 (e.g., transmitter controller 125) and portions that are performed by a wireless power receiver 104 (e.g., receiver controller 129). Process 500c includes three control loops 501c, 503c, and 505. Loops 501c and 503c are performed by a transmitter 102 to tune a transmitter IMN 124 and to control the transmitter power. Loop 501c is a phase loop that tunes the transmitter IMN 124 by adjusting reactance X3 to achieve a target inverter output phase $\varphi_{target}$. Loop 501b also includes safety checks to ensure that current, voltage, or other device limitations are not exceeded. Loop 503c is a power control loop that controls and maintains the transmitter power magnitude $P_{in}$ at or near the target power $P_{target}$ by adjusting the inverter bus voltage $V_{bus}$. Loop 503c also incorporates adjustments to both inverter frequency $f_{inv}$ and inverter phase shift $\theta_{inv}$ to control transmitter power. In some implementations, loops 501c and 503c are local loops that do not require communication with other devices (e.g., receiver 104) to be performed. In some implementations, loops 501c and 503c are executed by a transmitter at between 1-10 kHz.

Loop 505 is performed by a receiver 104 to tune a receiver IMN 126 based on system efficiency. Loop 505 is the same as loop 405 of process 400 the operation of which is described above.

Block 580 represents the inputs and initial conditions for process 500c which include a variable transmitter reactance $X_{tx}$ (e.g., X3 of transmitter IMN 124), set to a maximum reactance value $X_{tx,max}$; a variable receiver reactance $X_{rx}$ (e.g., X3 of receiver IMN 126), set to a minimum reactance value $X_{rx,min}$; an inverter frequency $f_{inv}$, set to a maximum frequency $f_{inv,max}$; an inverter phase shift $\theta_{inv}$, set to a minimum phase shift $\theta_{inv,min}$; a system efficiency η, initially set to zero; a transmitter reactance step size $\Delta X_{tx}$, set to an adjustment value greater than zero; a receiver reactance step size $\Delta X_{rx}$, set to an adjustment value greater than zero; an inverter frequency step size $\Delta f_{inv}$ set to an adjustment value greater than zero; an inverter phase shift step size $\Delta \theta_{inv}$ set to an adjustment value greater than zero; and a bus voltage step size $\Delta V_{bus}$ set to an adjustment value greater than zero. In some implementations, the reactance step sizes $\Delta X_{tx}$ and $\Delta X_{rx}$, bus voltage step size $\Delta V_{bus}$, inverter frequency step size $\Delta f_{inv}$, and inverter phase shift step size $\Delta \theta_{inv}$ are constant values. In some implementations, the reactance step sizes $\Delta X_{tx}$ and $\Delta X_{rx}$, bus voltage step size $\Delta V_{bus}$, inverter frequency step size $\Delta f_{inv}$, and inverter phase shift step size $\Delta \theta_{inv}$ can be variable. For example, controller 125 or controller 129 can increase or decrease the magnitude of the respective step sizes dynamically during process 500c.

Process 500c starts at step 504. At step 562, transmitter controller 125 performs several checks while tuning the inverter phase shift in step 564. Transmitter controller 125 compares the measured input power $P_{in}$ to a target power level $P_{target}$ and the inverter phase shift $\theta_{inv}$ to a phase shift limit $\theta_{limit}$ (e.g., 180 degrees). When all of the comparisons in step 564 are true, then transmitter controller 125 increments the inverter phase shift θinv by inverter phase shift step size Δθinv at step 564. If any of the comparisons are false, at step 582, transmitter controller 125 checks whether the inverter phase shift $\theta_{inv}$ is less than the phase shift limit $\theta_{limit}$. If so, process 500c proceeds to step 566. If not, process 500c proceeds to step 506.

At step 506, transmitter controller 125 performs several checks while tuning the inverter frequency in step 508. Transmitter controller 125 compares the measured input power $P_{in}$ to a target power level $P_{target}$, the measured inverter output phase $\varphi_{inv}$ to an inverter output phase limit $\varphi_{limit}$ (e.g., 45 degrees), and the inverter frequency $f_{inv}$ to the minimum inverter frequency $f_{inv,min}$. When all of the comparisons in step 506 are true, then transmitter controller 125 decrements the inverter frequency $f_{inv}$ by inverter frequency step size $\Delta f_{inv}$ at step 508. If any of the comparisons are false, the process 500*a* proceeds to step 510 of loop 501*c*.

Referring to phase loop, loop 501*c*, if the inverter output phase is not equal to the target inverter output phase, at step 510 transmitter controller 125 compares the inverter output phase to the target inverter output phase, at step 536, to determine whether the inverter output phase is greater than the target inverter output phase. If $\varphi_{inv}$ is greater than $\varphi_{target}$, then, at step 538, transmitter controller 125 performs several additional checks. At step 538, transmitter controller 125 checks whether the variable transmitter reactance $X_{tx}$ is already at a minimum value $X_{tx,min}$; whether $P_{in}$ is greater than $P_{target}$, or whether a safety check has failed. The safety check can be, for example, an over voltage or over current check. If any of the checks are true, then loop 501*c* proceeds to an additional safety check at step 540. The safety check at step 540 can be the same safety check as performed at step 538, for example, to determine whether the safety check at step 538 was the check that caused the transmitter controller 125 to proceed to step 540. If so, then transmitter controller 125 increments the variable transmitter reactance $X_{tx}$ by the transmitter reactance step size $\Delta X_{tx}$, and loop 501*c* reverts back to step 562. If not, then loop 501*c* proceeds to step 512 of loop 503*c* to adjust the transmitter power. If all of the checks at step 538 are false, then transmitter controller 125 decrements the variable transmitter reactance $X_{tx}$ by the transmitter reactance step size $\Delta X_{tx}$, and loop 501*c* reverts back to step 562.

Referring back to step 536, if $\varphi_{inv}$ is not greater than $\varphi_{target}$, then, at step 546, transmitter controller 125 checks whether the variable transmitter reactance $X_{tx}$ is already at a maximum value $X_{tx,max}$. If the variable transmitter reactance $X_{tx}$ is already at a maximum value $X_{tx,max}$, then loop 501*c* issue a fault condition 548. If the variable transmitter reactance $X_{tx}$ is not at a maximum value $X_{tx,max}$, then, at step 550, transmitter controller 125 increments the variable transmitter reactance $X_{tx}$ by the transmitter reactance step size $\Delta X_{tx}$, and loop 501*c* reverts back to step 562.

Referring to the power loop, loop 503*b*, at step 512 transmitter controller 125 measures the input power $P_{in}$, and compares the measured input power $P_{in}$ to a target power level $P_{target}$. If $P_{in}$ equals $P_{target}$ the process 500*c* reverts to step 562. In addition, transmitter controller 125 can send data indicating the measured value of $P_{in}$ to the receiver 104. If $P_{in}$ does not equal $P_{target}$ process 500*c* proceeds to step 522. At step 522, transmitter controller 125 compares the input power to the target power level to determine whether the input power is greater than the target power level. If $P_{in}$ is not greater than $P_{target}$, then, at step 534, transmitter controller 125 increments the inverter bus voltage $V_{bus}$ by the bus voltage step size $\Delta V_{bus}$, and loop 503*c* reverts back to step 562. If $P_{in}$ is greater than $P_{target}$, then, at step 524, transmitter controller 125 checks the bus voltage. If the bus voltage $V_{bus}$ is greater than a minimum bus voltage $V_{bus,min}$, then, at step 532, transmitter controller 125 decrements the inverter bus voltage $V_{bus}$ by the bus voltage step size $\Delta V_{bus}$, and loop 503*c* reverts back to step 562.

If, at step 524, the bus voltage $V_{bus}$ is at a minimum bus voltage $V_{bus,min}$, then the transmitter controller 125 reduces the transmitter power by adjusting either the variable transmitter reactance $X_{tx}$, the inverter frequency $f_{inv}$, or the inverter phase shift $\theta_{inv}$. At step 526, transmitter controller 125 checks whether the variable transmitter reactance $X_{tx}$ is already at a maximum value $X_{tx,max}$. If the variable transmitter reactance $X_{tx}$ is not at a maximum value $X_{tx,max}$, then, at step 530, transmitter controller 125 increments the variable transmitter reactance $X_{tx}$ by the transmitter reactance step size $\Delta X_{tx}$, and loop 501*c* reverts back to step 562.

If the variable transmitter reactance $X_{tx}$ is already at a maximum value $X_{tx,max}$, then the transmitter controller 125 checks whether the inverter frequency $f_{inv}$ is less than a maximum inverter frequency $f_{inv,max}$ at step 527. If the inverter frequency $f_{inv}$ is not already at a maximum value $f_{inv,max}$, then, at step 528, transmitter controller 125 increments the inverter frequency $f_{inv}$ by the frequency step size $\Delta f_{inv}$, and loop 503*c* reverts back to step 562. If the inverter frequency $f_{inv}$ is already at a maximum value $f_{inv,max}$, then the transmitter controller 125 checks whether the inverter phase shift $\theta_{inv}$ is greater than a minimum inverter phase shift $\theta_{inv,min}$ at step 566. If the inverter phase shift $\theta_{inv}$ is already at a minimum value $\theta_{inv,min}$, then loop 503*c* reverts to step 562 with no adjustments to the bus voltage $V_{bus}$, the variable transmitter reactance $X_{tx}$, or the inverter phase shift $\theta_{inv}$. If the inverter phase shift $\theta_{inv,min}$ is not already at a minimum value $\theta_{inv,min}$, then, at step 568, transmitter controller 125 decrements the inverter phase shift $\theta_{inv}$ by the phase shift step size $\Delta \theta_{inv}$, and loop 503*c* reverts back to step 562.

In some implementations, the magnitude of the transmitter reactance step size $\Delta X_{tx}$ can be varied. For example, if the difference between $\varphi_{inv}$ and $\varphi_{target}$ is large, for example, greater than a coarse adjustment threshold value, then the transmitter controller 125 can increase the transmitter reactance step size $\Delta X_{tx}$. Correspondingly, if the difference between $\varphi_{inv}$ and $\varphi_{target}$ is small, for example, less than a fine adjustment threshold value, then the transmitter controller 125 can decrease the magnitude of the transmitter reactance step size $\Delta X_{tx}$.

In some implementations, the magnitude of the bus voltage step size $\Delta V_{bus}$ can be varied. For example, if the difference between $P_{in}$ and $P_{target}$ is large, for example, greater than a coarse adjustment threshold value, then the transmitter controller 125 can increase the bus voltage step size $\Delta V_{bus}$. Correspondingly, if the difference between $P_{in}$ and $P_{target}$ is small, for example, less than a fine adjustment threshold value, then the transmitter controller 125 can decrease the magnitude of the bus voltage step size $\Delta V_{bus}$.

In some implementations, the magnitude of the inverter frequency step size $\Delta f_{inv}$ can be varied. For example, if the difference between $P_{in}$ and $P_{target}$, in step 506, is large, for example, greater than a coarse adjustment threshold value, then the transmitter controller 125 can increase the inverter frequency step size $\Delta f_{inv}$. Correspondingly, if the difference between $P_{in}$ and $P_{target}$ is small, for example, less than a fine adjustment threshold value, then the transmitter controller 125 can decrease the magnitude of inverter frequency step size $\Delta f_{inv}$.

In some implementations, the magnitude of the inverter phase shift step size $\Delta \theta_{inv}$ can be varied. For example, if the difference between $P_{in}$ and $P_{target}$, in step 562, is large, for example, greater than a coarse adjustment threshold value, then the transmitter controller 125 can increase the inverter phase shift step size $\Delta \theta_{inv}$. Correspondingly, if the difference between $P_{in}$ and $P_{target}$ is small, for example, less than a fine adjustment threshold value, then the transmitter controller 125 can decrease the magnitude of inverter phase shift step size $\Delta \theta_{inv}$.

The following table (Table 1) shows experimental measurements of output voltage and efficiency (Eff.) for variations between relative positions of a wireless power transmitter and receiver for charging an electric vehicle operating according to processes described herein. Position X is the position of the receiver resonator coil relative to the transmitter resonator coil along the X-axis, where the X-axis runs along a width of the vehicle (e.g., driver door to passenger door), and where X=0 is the center of transmitter resonator coil. Position Y is the position of the receiver resonator coil relative to the transmitter resonator coil along the Y-axis, where the Y-axis runs along a length of the vehicle (e.g., front of the vehicle to the rear of the vehicle), and where Y=0 is the center of the transmitter resonator coil. Position Z is the separation distance between the receiver resonator coil and the transmitter resonator coil along the vertical Z-axis.

TABLE 1

| Z (mm) | X (mm) | Y (mm) | Vout (V) | Eff (%) |
|---|---|---|---|---|
| 160 | 0 | 0 | 280 | 94.01 |
| 160 | 0 | 0 | 350 | 94.46 |
| 160 | 0 | 0 | 420 | 94.42 |
| 160 | 100 | 75 | 280 | 94.03 |
| 160 | 100 | 75 | 350 | 94.32 |
| 160 | 100 | 75 | 420 | 93.84 |
| 160 | 150 | 75 | 280 | 93.74 |
| 160 | 150 | 75 | 350 | 94.08 |
| 160 | 150 | 75 | 420 | 93.56 |
| 190 | 0 | 0 | 280 | 94.14 |
| 190 | 0 | 0 | 350 | 94.50 |
| 190 | 0 | 0 | 420 | 94.19 |
| 190 | 100 | 75 | 280 | 93.81 |
| 190 | 100 | 75 | 350 | 93.75 |
| 190 | 100 | 75 | 420 | 93.11 |
| 190 | 150 | 75 | 280 | 93.10 |
| 190 | 150 | 75 | 350 | 93.10 |
| 190 | 150 | 75 | 420 | 91.86 |
| 220 | 0 | 0 | 280 | 93.97 |
| 220 | 0 | 0 | 350 | 94.03 |
| 220 | 0 | 0 | 420 | 93.27 |
| 220 | 100 | 75 | 280 | 92.82 |
| 220 | 100 | 75 | 350 | 92.52 |

Figures 6A, 6B:
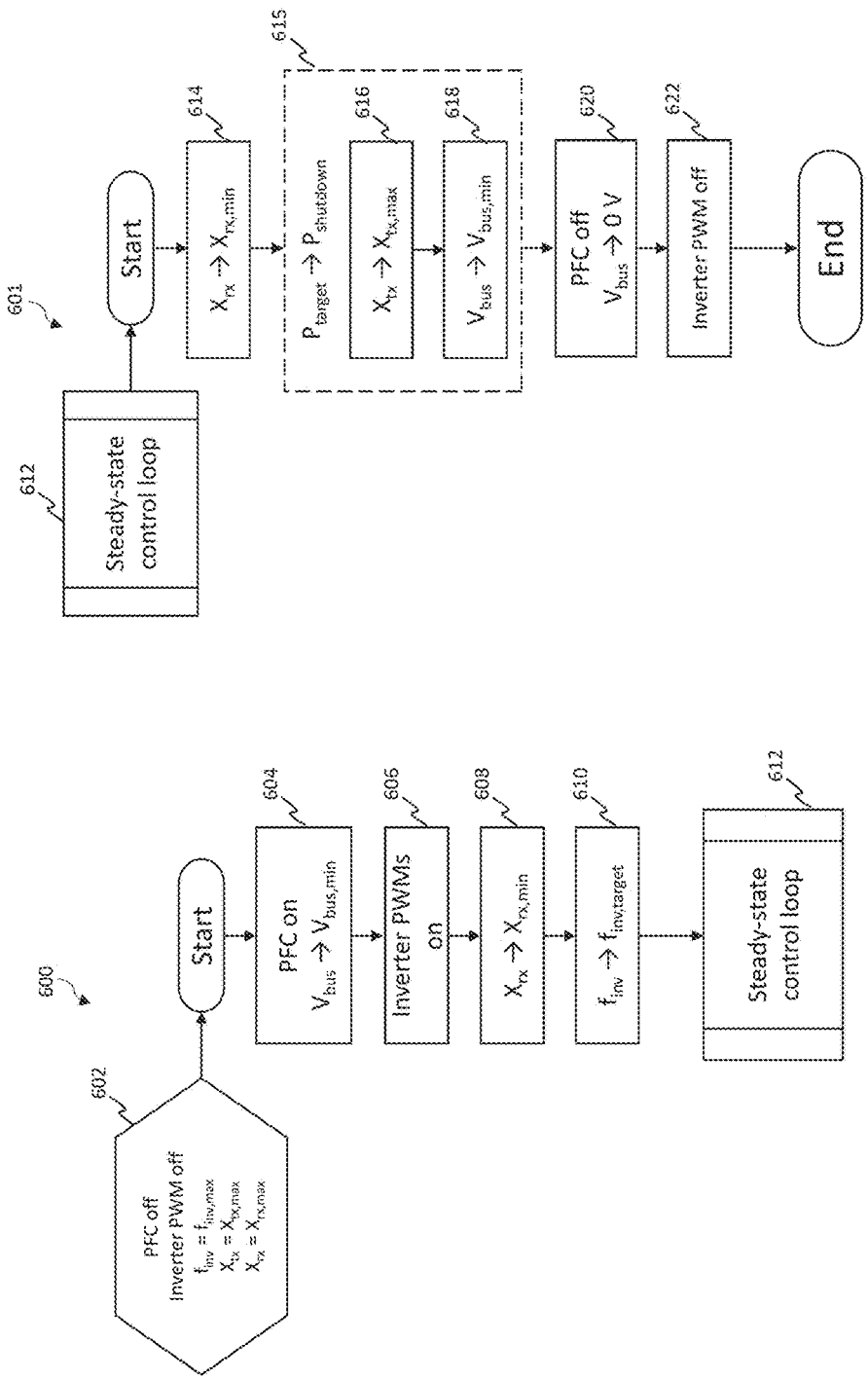
FIG. 6A depicts a flowchart of an exemplary startup process for a wireless power transmission control system.
FIG. 6B depicts a flowchart of an exemplary shutdown process for a wireless power transmission control system.

FIG. 6A depicts a flowchart of an exemplary startup process 600 for a wireless power transmission control system. In some examples, the process 600 can be provided as computer-executable instructions executed using one or more processing devices (e.g., processors or microcontrollers) or computing devices. In some examples, the process 600 may be executed by hardwired electrical circuitry, for example, as an ASIC or an FPGA controller. Some portions of process 600 can be be performed by a wireless power transmitter 102 (e.g., transmitter controller 125) and some portions of process 600 can be performed by a wireless power receiver 104 (e.g., receiver controller 129).

Block 602 lists the inputs and initial conditions for the system startup process 600 which include a power factor correction (PFC) stage of a transmitter set to OFF; an inverter pulse width modulation (PWM) set to OFF; an inverter frequency $f_{inv}$ set to a maximum frequency $f_{inv,max}$; a variable transmitter reactance $X_{tx}$ (e.g., X3 of transmitter IMN 124) set to a maximum reactance value $X_{tx,max}$; and a variable receiver reactance $X_{rx}$ (e.g., X3 of receiver IMN 126) set to a maximum reactance value $X_{rx}$,max. The startup process 600 begins at step 604, the PFC is turned ON and bus voltage $V_{bus}$ is brought to minimum bus voltage $V_{bus,min}$. At step 606, the inverter PWMs are turned ON. At step 608, variable receiver reactance $X_{rx}$ is adjusted to minimum receiver reactance $X_{rx,min}$. At step 610, inverter frequency $f_{inv}$ is adjusted to target inverter frequency $f_{inv,target}$. At step 612, the system begins steady state operations, e.g., according to one of processes 300, 400, 500a, 500b, or 500c.

FIG. 6A depicts a flowchart of an exemplary shutdown process 601 for a wireless power transmission control system m. In some examples, the process 601 can be provided as computer-executable instructions executed using one or more processing devices (e.g., processors or microcontrollers) or computing devices. In some examples, the process 601 may be executed by hardwired electrical circuitry, for example, as an ASIC or an FPGA controller. Some portions of process 601 can be performed by a wireless power transmitter 102 (e.g., transmitter controller 125) and some portions of process 601 can be performed by a wireless power receiver 104 (e.g., receiver controller 129).

Shutdown process 601 begins, at step 612, with the system in steady state operation, e.g., according to one of processes 300, 400, 500a, 500b, or 500c. At step 614, variable receiver reactance $X_{rx}$ is brought to minimum receiver reactance $X_{rx,min}$. At step 616, variable transmitter reactance $X_{tx}$ is brought to maximum transmitter reactance $X_{tx,max}$, and at step 618, bus voltage $V_{bus}$ is brought to minimum bus voltage $V_{bus,min}$. In some implementations, steps 616 and 618 can be performed directly by a transmitter. In some implementations, steps 616 and 618 can be performed indirectly. For example, steps 616 and 618 will be performed automatically as part of the steady state operations of processes 500a, 500b, and 500c (steps 524, 532, 526, and 530) simply be adjusting the target power $P_{target}$ to a shutdown value $P_{shutdown}$ at step 615. For example, $P_{shutdown}$ can be zero or near zero. As $P_{target}$ is decreased, the variable transmitter reactance $X_{tx}$ is brought to maximum transmitter reactance $X_{tx,max}$ and bus voltage $V_{bus}$ is brought to minimum bus voltage $V_{bus,min}$ by the steady state transmitter operations process. At step 620, the PFC is turned OFF and $V_{bus}$ is brought to 0 V. At step 622, the inverter PWMs are turned off. In some implementations, the wireless communication between the receiver and transmitter may be remain on or be turned off after power transmission is secured.

While the disclosed techniques have been described in connection with certain preferred embodiments, other embodiments will be understood by one of ordinary skill in the art and are intended to fall within the scope of this disclosure. For example, designs, methods, configurations of components, etc. related to transmitting wireless power have been described above along with various specific applications and examples thereof. Those skilled in the art will appreciate where the designs, components, configurations or components described herein can be used in combination, or interchangeably, and that the above description does not limit such interchangeability or combination of components to only that which is described herein.

For illustrative purposes, the foregoing description focuses on the use of devices, components, and methods in high power wireless power transfer applications, e.g., power transfer for charging electric vehicles.

More generally, however, it should be understood that devices that can receive power using the devices, components, and methods disclosed herein can include a wide range of electrical devices, and are not limited to those devices described for illustrative purposes herein. In general, any portable electronic device, such as a cell phone, keyboard, mouse, radio, camera, mobile handset, headset, watch, headphones, dongles, multifunction cards, food and drink accessories, and the like, and any workspace electronic devices such as printers, clocks, lamps, headphones, external drives, projectors, digital photo frames, additional displays, and the like, can receive power wirelessly using the devices, components, and methods disclosed herein. Furthermore, any electrical device, such as electric or hybrid vehicles, motorized wheel chairs, scooters, power tools, and the like, can receive power wirelessly using the devices, components, and methods disclosed herein. In addition, the devices, components, and methods disclosed herein may be used for applications outside of wireless power transfer.

In this disclosure, certain circuit or system components such as capacitors, inductors, resistors, are referred to as circuit "components" or "elements." The disclosure also refers to series and parallel combinations of these components or elements as elements, networks, topologies, circuits, and the like. More generally, however, where a single component or a specific network of components is described herein, it should be understood that alternative embodiments may include networks for elements, alternative networks, and/or the like.

As used herein, the equalities and inequalities when referring to comparisons between transmitter or receiver operating parameters is not intended to require exact equivalence of values, but instead refers to an equivalence of values that are within a threshold or a tolerance of one another. For example, measured values such as powers, voltages, currents, and phases can be represented and stored as floating point numbers. As such, exact equivalence may be unlikely deepening on the precision of the measurements. Therefore, equivalence between such numbers and target values refers to equivalence within a threshold range, for example, equivalence within a tolerance of ±1%, ±2%, ±5%, or ±10% of the target value. Similarly, inequalities may require a measured value to be greater or less than a target value by an additional ±1%, ±2%, ±5%, or ±10% of the target value.

As used herein, the term "coupled" when referring to circuit or system components is used to describe an appropriate, wired or wireless, direct or indirect, connection between one or more components through which information or signals can be passed from one component to another.

As used herein, the term "direct connection" or "directly connected," refers to a direct connection between two elements where the elements are connected with no intervening active elements between them. The term "electrically connected" or "electrical connection," refers to an electrical connection between two elements where the elements are connected such that the elements have a common potential. In addition, a connection between a first component and a terminal of a second component means that there is a path between the first component and the terminal that does not pass through the second component.

Implementations of the subject matter and the operations described in this specification can be realized in digital electronic circuitry, or in computer software, firmware, or hardware, including the structures disclosed in this specification and their structural equivalents, or in combinations of one or more of them. Implementations of the subject matter described in this specification can be realized using one or more computer programs, i.e., one or more modules of computer program instructions, encoded on computer storage medium for execution by, or to control the operation of, data processing apparatus. Alternatively or in addition, the program instructions can be encoded on an artificially generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal; a computer storage medium can be a source or destination of computer program instructions encoded in an artificially generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer can include a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a wireless power transmitter or receiver or a wirelessly charged or powered device such as a vehicle, a mobile telephone, a personal digital assistant (PDA), a mobile audio or video player, a game console, or a Global Positioning System (GPS) receiver, to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

While this specification contains many specific implementation details, these should not be construed as limitations on the scope of any implementation of the present disclosure or of what may be claimed, but rather as descriptions of features specific to example implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

What is claimed is:

1. A wireless energy transfer system comprising:
an energy transmitter comprising a transmitter-impedance matching network (IMN), the transmitter configured to perform operations comprising:
performing a first comparison between a characteristic of a power of the transmitter and a target power; and
adjusting, based on the first comparison, a reactance of the transmitter-IMN to adjust the power of the transmitter; and
an energy receiver comprising a receiver-IMN, the receiver configured to perform operations comprising; determining an efficiency of the wireless energy transfer system at a second time based on power data from the transmitter;
performing a second comparison between the efficiency at the second time and an efficiency of the wireless energy transfer system at a first time, the first time being prior to the second time; and
adjusting, based on the second comparison, a reactance of the receiver-IMN.

2. The system of claim 1, wherein adjusting the reactance of the receiver-IMN comprises adjusting the reactance of the receiver-IMN by a variable reactance adjustment value.

3. The system of claim 1, wherein the first comparison and adjustment to the reactance of the transmitter-IMN occur iteratively until the characteristic of the power is within a threshold value of the target power.

4. The system of claim 1, wherein adjusting the reactance of the receiver-IMN comprises in response to the efficiency at the second time being less than the efficiency at the first time, negating a reactance adjustment value, and wherein adjusting the reactance of the receiver-IMN comprises adjusting the reactance of the receiver-IMN by the negated reactance adjustment value.

5. The system of claim 1, wherein adjusting the reactance of the transmitter-IMN comprises in response to the power being less than the target power, adjusting the reactance of the transmitter-IMN by a first reactance adjustment value and in response to the power being greater than the target power, adjusting the reactance of the transmitter-IMN by a second, different reactance adjustment value.

6. The system of claim 1, wherein the transmitter is an electric vehicle charger and wherein the receiver is a coupled to a power system of an electric vehicle.

7. The system of claim 1, wherein the first comparison is between a power factor of the power of the transmitter and a target power factor, and wherein the operations of the transmitter further comprise:
a third comparison between a magnitude of the power and a target power magnitude, wherein the third comparison follows the first comparison; and
adjusting, based on the third comparison, a bus voltage of the transmitter to adjust the power of the transmitter.

8. The system of claim 7, wherein the power factor is represented by a phase relationship between a transmitter voltage and a transmitter current.

9. The system of claim 7, wherein the first comparison and adjustment of the reactance of the transmitter-IMN based on the first comparison occur iteratively until the power factor of the power is within a threshold value of the target power factor.

10. The system of claim 7, wherein the steps of performing the first comparison and adjusting the reactance of the transmitter-IMN are iterated at a faster rate than the steps of performing the third comparison and adjusting the bus voltage.

11. The system of claim 1, wherein the operations of the transmitter further comprise shutting down the wireless energy transfer system by reducing the target power to zero.

12. The system of claim 1, wherein the operations of the transmitter further comprise starting up the transmitter by adjusting the reactance of the transmitter-IMN to a maximum value.

13. The system of claim 1, wherein the operations of the transmitter further comprise starting up the transmitter by adjusting a frequency of an inverter to a target frequency.

14. The system of claim 1, wherein the operations of the receiver further comprise starting up the receiver by adjusting the reactance of the receiver-IMN to a minimum value.

15. The system of claim 1, wherein the transmitter-IMN comprises a tunable reactive element electrically connected between an inverter and at least one fixed reactive element, and wherein adjusting the reactance of the transmitter-IMN comprises adjusting the tunable reactive element.

16. The system of claim 1, wherein the receiver-IMN comprises a tunable reactive element electrically connected between a rectifier and at least one fixed reactive element, and wherein adjusting the reactance of the receiver-IMN comprises adjusting the tunable reactive element.

17. The system of claim 1, wherein the steps of performing the first comparison and adjusting the reactance of the transmitter-IMN are iterated at a faster rate than the steps of performing the second comparison and adjusting the reactance of the receiver-IMN.

18. The system of claim 1, wherein determining the efficiency of the wireless energy transfer system comprises:
- receiving power data from the transmitter;
- determining an output power of the receiver; and
- calculating the efficiency of the wireless energy transfer system based on the power data from the transmitter and the output power of the receiver.

\* \* \* \* \*